US011867721B1

(12) United States Patent
Wu et al.

(10) Patent No.: US 11,867,721 B1
(45) Date of Patent: Jan. 9, 2024

(54) PROBES WITH MULTIPLE SPRINGS, METHODS FOR MAKING, AND METHODS FOR USING

(71) Applicant: Microfabrica Inc., Van Nuys, CA (US)

(72) Inventors: Ming Ting Wu, San Jose, CA (US); Garret R. Smalley, Newhall, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 140 days.

(21) Appl. No.: 17/139,936

(22) Filed: Dec. 31, 2020

Related U.S. Application Data

(60) Provisional application No. 62/961,678, filed on Jan. 15, 2020, provisional application No. 62/961,675, filed on Jan. 15, 2020, provisional application No. 62/961,672, filed on Jan. 15, 2020, provisional application No. 62/956,122, filed on Dec. 31, 2019, provisional application No. 62/956,016, filed on Dec. 31, 2019, provisional application No. 62/956,124, filed on Dec. 31, 2019.

(51) Int. Cl.
 G01R 1/067 (2006.01)
(52) U.S. Cl.
 CPC .............................. G01R 1/06722 (2013.01)
(58) Field of Classification Search
 CPC .................................................. G01R 1/06722
 See application file for complete search history.

(56) References Cited

U.S. PATENT DOCUMENTS

| 4,027,935 A | 6/1977 | Byrnes et al. |
| 4,116,523 A | 9/1978 | Coberly et al. |
| 4,737,114 A | 4/1988 | Yaegashi |
| 4,773,877 A | 9/1988 | Kruger et al. |
| (Continued) | | |

FOREIGN PATENT DOCUMENTS

JP        2001337110 A     12/2001

OTHER PUBLICATIONS

EP 0 897 655 B1 by Hugo et al. (Year: 2007).*
(Continued)

*Primary Examiner* — Paresh Patel
(74) *Attorney, Agent, or Firm* — Holland & Hart LLP

(57) ABSTRACT

Embodiments are directed to probe structures, arrays, methods of using probes and arrays, and/or methods for making probes and/or arrays. In the various embodiments, probes include at least two springs separated by a movable stop while in other embodiments, three or more springs may be included with two or more movable stops. Movable stops interact with fixed stops that are either part of the probes themselves or part of separate elements that engage with the probes (such as array frame structures) that provide for the retention, longitudinal and/or lateral positioning of probes and possibly for orientation of the probes about a longitudinal axis. Fixed stops provide for controlled limits for movement of the movable stops which in turn allow for enhanced compliant or elastic performance of the probes upon increased probe compression in either one direction, in the order of tip compressions, or in both directions or tip compression orders (e.g. to provide one or more decreases in spring constant upon reaching one or more compression levels (or biasing force levels) with a given tip compression direction and/or order).

17 Claims, 54 Drawing Sheets

(56) References Cited

U.S. PATENT DOCUMENTS

| | | | |
|---|---|---|---|
| 4,821,411 A | 4/1989 | Yaegashi | |
| 4,952,272 A | 8/1990 | Okino et al. | |
| 5,177,438 A | 1/1993 | Littlebury et al. | |
| 5,190,637 A | 3/1993 | Guckel | |
| 5,286,208 A | 2/1994 | Matsuoka | |
| 5,321,685 A | 6/1994 | Nose et al. | |
| 5,476,211 A | 12/1995 | Khandros | |
| 5,513,430 A | 5/1996 | Yanof et al. | |
| 5,599,194 A | 2/1997 | Ozawa et al. | |
| 5,605,614 A | 2/1997 | Bornand | |
| 5,811,982 A | 9/1998 | Beaman et al. | |
| 5,865,641 A | 2/1999 | Swart et al. | |
| 5,892,223 A | 4/1999 | Karpov et al. | |
| 5,917,707 A | 6/1999 | Khandros et al. | |
| 5,952,843 A | 9/1999 | Vinh | |
| 5,967,856 A * | 10/1999 | Meller | H01R 13/6485 439/700 |
| 5,994,152 A | 11/1999 | Khandros et al. | |
| 6,027,630 A | 2/2000 | Cohen | |
| 6,043,563 A | 3/2000 | Eldridge et al. | |
| 6,184,053 B1 | 2/2001 | Eldridge et al. | |
| 6,190,181 B1 * | 2/2001 | Affolter | H01R 13/2421 439/70 |
| 6,208,155 B1 | 3/2001 | Barabi et al. | |
| 6,218,203 B1 | 4/2001 | Khoury et al. | |
| 6,250,933 B1 | 6/2001 | Khoury et al. | |
| 6,255,126 B1 | 7/2001 | Mathieu et al. | |
| 6,264,477 B1 | 7/2001 | Smith et al. | |
| 6,268,015 B1 | 7/2001 | Mathieu et al. | |
| 6,299,458 B1 | 10/2001 | Yamagami et al. | |
| 6,329,827 B1 | 12/2001 | Beaman et al. | |
| 6,336,269 B1 | 1/2002 | Eldridge et al. | |
| 6,358,097 B1 | 3/2002 | Peters | |
| 6,414,501 B2 | 7/2002 | Kim et al. | |
| 6,426,638 B1 | 7/2002 | Di Stefano | |
| 6,471,524 B1 * | 10/2002 | Nakano | H01R 13/2428 439/70 |
| 6,482,013 B2 | 11/2002 | Eldridge et al. | |
| 6,491,968 B1 | 12/2002 | Mathieu et al. | |
| 6,507,207 B2 | 1/2003 | Nguyen | |
| 6,520,778 B1 | 2/2003 | Eldridge et al. | |
| 6,560,861 B2 | 5/2003 | Fork et al. | |
| 6,573,738 B1 | 6/2003 | Matsuo et al. | |
| 6,624,645 B2 | 9/2003 | Haseyama et al. | |
| 6,626,708 B2 | 9/2003 | Phillips | |
| 6,651,325 B2 | 11/2003 | Lee et al. | |
| 6,672,876 B1 | 1/2004 | Takekoshi | |
| 6,677,772 B1 * | 1/2004 | Faull | G01R 1/06722 324/755.05 |
| 6,690,185 B1 | 2/2004 | Khandros et al. | |
| 6,720,781 B2 | 4/2004 | Ott et al. | |
| 6,758,682 B1 | 7/2004 | Kosmala | |
| 6,771,084 B2 | 8/2004 | Di Stefano | |
| 6,777,319 B2 | 8/2004 | Grube et al. | |
| 6,783,405 B1 | 8/2004 | Yen | |
| 6,784,378 B2 | 8/2004 | Zhu et al. | |
| 6,787,456 B1 | 9/2004 | Kripesh et al. | |
| 6,807,734 B2 | 10/2004 | Eldridge et al. | |
| 6,811,406 B2 | 11/2004 | Grube | |
| 6,844,748 B2 | 1/2005 | Sato et al. | |
| 6,855,010 B1 | 2/2005 | Yen | |
| D507,198 S | 7/2005 | Kister | |
| 6,935,901 B2 | 8/2005 | Simpson et al. | |
| 6,967,492 B2 | 11/2005 | Tsui et al. | |
| 6,998,857 B2 | 2/2006 | Terada et al. | |
| 7,047,638 B2 | 5/2006 | Eldridge et al. | |
| 7,063,541 B2 | 6/2006 | Grube et al. | |
| 7,091,729 B2 | 8/2006 | Kister | |
| 7,098,540 B1 | 8/2006 | Mohan et al. | |
| 7,109,118 B2 | 9/2006 | Cohen et al. | |
| 7,126,220 B2 | 10/2006 | Lahiri et al. | |
| 7,131,848 B2 | 11/2006 | Lindsey et al. | |
| 7,148,709 B2 | 12/2006 | Kister | |
| 7,172,431 B2 | 2/2007 | Beaman et al. | |
| 7,198,704 B2 | 4/2007 | Cohen et al. | |
| 7,220,134 B2 | 5/2007 | Goodman et al. | |
| 7,229,542 B2 | 6/2007 | Bang | |
| 7,235,166 B2 | 6/2007 | Cohen et al. | |
| 7,239,219 B2 | 7/2007 | Brown et al. | |
| 7,252,861 B2 | 8/2007 | Smalley | |
| 7,256,593 B2 | 8/2007 | Treibergs | |
| 7,273,812 B2 | 9/2007 | Kim et al. | |
| 7,279,917 B2 | 10/2007 | Williams et al. | |
| 7,288,178 B2 | 10/2007 | Cohen et al. | |
| 7,291,254 B2 | 11/2007 | Cohen et al. | |
| 7,326,327 B2 | 2/2008 | Armstrong et al. | |
| 7,368,044 B2 | 5/2008 | Cohen et al. | |
| 7,412,767 B2 | 8/2008 | Kim et al. | |
| 7,435,102 B2 | 10/2008 | Goodman | |
| 7,436,192 B2 | 10/2008 | Kister | |
| 7,437,813 B2 | 10/2008 | Tunaboylu et al. | |
| 7,446,548 B2 | 11/2008 | Chen | |
| 7,449,910 B2 | 11/2008 | Kirby et al. | |
| 7,456,642 B2 | 11/2008 | Saulnier et al. | |
| 7,462,800 B2 | 12/2008 | Tunaboylu et al. | |
| 7,498,714 B2 | 3/2009 | Lockard et al. | |
| 7,501,328 B2 | 3/2009 | Lockard et al. | |
| 7,504,839 B2 | 3/2009 | Feigenbaum et al. | |
| 7,504,840 B2 | 3/2009 | Arat et al. | |
| 7,517,462 B2 | 4/2009 | Cohen et al. | |
| 7,527,721 B2 | 5/2009 | Lembrikov et al. | |
| 7,531,077 B2 | 5/2009 | Cohen et al. | |
| 7,533,462 B2 | 5/2009 | Gleason et al. | |
| 7,557,595 B2 | 7/2009 | Chen et al. | |
| 7,579,856 B2 | 8/2009 | Khandros et al. | |
| 7,583,098 B2 | 9/2009 | Tunaboylu et al. | |
| 7,628,620 B2 | 12/2009 | Gritters | |
| 7,629,807 B2 | 12/2009 | Hirakawa et al. | |
| 7,637,007 B2 | 12/2009 | Tunaboylu et al. | |
| 7,638,028 B2 | 12/2009 | Tunaboylu et al. | |
| 7,640,651 B2 | 1/2010 | Cohen et al. | |
| 7,674,112 B2 | 3/2010 | Gritters et al. | |
| 7,690,925 B2 | 4/2010 | Goodman | |
| 7,721,430 B2 | 5/2010 | Chartarifsky et al. | |
| 7,731,546 B2 | 6/2010 | Grube et al. | |
| 7,733,101 B2 | 6/2010 | Kister | |
| 7,798,822 B2 | 9/2010 | Eldridge et al. | |
| 7,808,261 B2 | 10/2010 | Kimoto | |
| 7,841,863 B2 | 11/2010 | Mathieu et al. | |
| 7,850,460 B2 | 12/2010 | Weiland et al. | |
| 7,851,794 B2 | 12/2010 | Hobbs | |
| 7,888,958 B2 | 2/2011 | Souma et al. | |
| 7,922,544 B2 | 4/2011 | Chung | |
| 7,928,751 B2 | 4/2011 | Hsu | |
| 7,956,288 B2 | 6/2011 | Kazama et al. | |
| 8,012,331 B2 | 9/2011 | Lee et al. | |
| 8,070,931 B1 | 12/2011 | Cohen et al. | |
| 8,111,080 B2 | 2/2012 | Kister | |
| 8,299,394 B2 | 10/2012 | Theppakuttai et al. | |
| 8,415,963 B2 | 4/2013 | Kister | |
| 8,427,186 B2 | 4/2013 | McFarland | |
| 8,451,017 B2 | 5/2013 | Gleason et al. | |
| 8,613,846 B2 | 12/2013 | Wu et al. | |
| 8,717,054 B2 | 5/2014 | Chen et al. | |
| 8,717,055 B2 | 5/2014 | Chen et al. | |
| 8,723,543 B2 | 5/2014 | Chen et al. | |
| 8,729,916 B2 | 5/2014 | Chen et al. | |
| 8,742,272 B2 | 6/2014 | English et al. | |
| 8,926,379 B2 | 1/2015 | Vinther | |
| 9,030,222 B2 | 5/2015 | Eldridge et al. | |
| 9,052,342 B2 | 6/2015 | Fan et al. | |
| 9,097,740 B2 | 8/2015 | Kister | |
| 9,121,868 B2 | 9/2015 | Kister | |
| 9,244,101 B2 | 1/2016 | Cohen et al. | |
| 9,316,670 B2 | 4/2016 | Kister | |
| 9,476,911 B2 | 10/2016 | Kister | |
| RE46,221 E | 11/2016 | Kister | |
| 9,540,233 B2 | 1/2017 | Kumar et al. | |
| 9,671,429 B2 | 6/2017 | Wu et al. | |
| 9,702,904 B2 | 7/2017 | Breinlinger et al. | |
| 9,878,401 B1 | 1/2018 | Veeramani et al. | |
| 9,972,933 B2 | 5/2018 | Kimura et al. | |
| 10,215,775 B2 | 2/2019 | Wu et al. | |
| 10,416,192 B2 | 9/2019 | Chen et al. | |

(56) References Cited

U.S. PATENT DOCUMENTS

| | | | |
|---|---|---|---|
| 10,641,792 | B2 | 5/2020 | Wu et al. |
| 10,788,512 | B2 | 9/2020 | Chen et al. |
| 10,877,067 | B2 | 12/2020 | Chen et al. |
| 11,131,690 | B2 | 9/2021 | Crippa |
| 11,262,383 | B1 | 3/2022 | Smalley |
| 2002/0196038 | A1 | 12/2002 | Okuno et al. |
| 2003/0001606 | A1 | 1/2003 | Bende et al. |
| 2003/0022168 | A1 | 1/2003 | Kasahara et al. |
| 2004/0000489 | A1 | 1/2004 | Zhang et al. |
| 2004/0004001 | A1 | 1/2004 | Cohen et al. |
| 2004/0051541 | A1 | 3/2004 | Zhou et al. |
| 2004/0065550 | A1 | 4/2004 | Zhang |
| 2004/0065555 | A1 | 4/2004 | Zhang |
| 2004/0134772 | A1 | 7/2004 | Cohen et al. |
| 2004/0146650 | A1 | 7/2004 | Lockard et al. |
| 2005/0029109 | A1 | 2/2005 | Zhang et al. |
| 2005/0032375 | A1 | 2/2005 | Lockard et al. |
| 2005/0067292 | A1 | 3/2005 | Thompson et al. |
| 2005/0070170 | A1 | 3/2005 | Zhang et al. |
| 2005/0072681 | A1 | 4/2005 | Cohen et al. |
| 2005/0104609 | A1 | 5/2005 | Arat et al. |
| 2005/0176285 | A1 | 8/2005 | Chen et al. |
| 2005/0179458 | A1 | 8/2005 | Chen et al. |
| 2005/0184748 | A1 | 8/2005 | Chen et al. |
| 2005/0189958 | A1 | 9/2005 | Chen et al. |
| 2005/0202667 | A1 | 9/2005 | Cohen et al. |
| 2005/0230261 | A1 | 10/2005 | Cohen et al. |
| 2005/0253606 | A1 | 11/2005 | Kim et al. |
| 2006/0006888 | A1 | 1/2006 | Kruglick et al. |
| 2006/0051948 | A1 | 3/2006 | Kim et al. |
| 2006/0053625 | A1 | 3/2006 | Kim et al. |
| 2006/0108678 | A1 | 5/2006 | Kumar et al. |
| 2006/0170440 | A1 | 8/2006 | Sudin |
| 2006/0226015 | A1 | 10/2006 | Smalley et al. |
| 2006/0238209 | A1 | 10/2006 | Chen et al. |
| 2007/0144841 | A1 | 6/2007 | Chong et al. |
| 2007/0200576 | A1 | 8/2007 | Laurent et al. |
| 2008/0108221 | A1 | 5/2008 | Kim et al. |
| 2008/0111573 | A1 | 5/2008 | Chen et al. |
| 2008/0174332 | A1 | 7/2008 | Arat et al. |
| 2009/0066351 | A1 | 3/2009 | Arat et al. |
| 2009/0079455 | A1 | 3/2009 | Gritters |
| 2009/0256583 | A1* | 10/2009 | Chen .............. G01R 1/06761 324/755.05 |
| 2010/0088888 | A1 | 4/2010 | Mathieu et al. |
| 2010/0134131 | A1 | 6/2010 | Chen et al. |
| 2010/0155253 | A1 | 6/2010 | Kim et al. |
| 2010/0176834 | A1 | 7/2010 | Chen et al. |
| 2011/0050263 | A1* | 3/2011 | Sato .............. G01R 1/06722 324/755.05 |
| 2011/0147223 | A1 | 6/2011 | Kumar et al. |
| 2011/0187397 | A1 | 8/2011 | Chen et al. |
| 2011/0187398 | A1 | 8/2011 | Chen et al. |
| 2011/0252657 | A1* | 10/2011 | Sato .................. G01R 3/00 33/561 |
| 2012/0176122 | A1 | 7/2012 | Hirata et al. |
| 2012/0299612 | A1* | 11/2012 | Lee .............. G01R 1/06772 324/755.07 |
| 2014/0231264 | A1 | 8/2014 | Chen et al. |
| 2017/0219623 | A1* | 8/2017 | Choi .............. G01R 1/06722 |
| 2020/0241042 | A1 | 7/2020 | Jeong et al. |

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, p. 19/1-19/23.

Hill, Dr. Steve, "An E-FAB Way for Making the Micro World", Materials World is the journal of The Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

\* cited by examiner

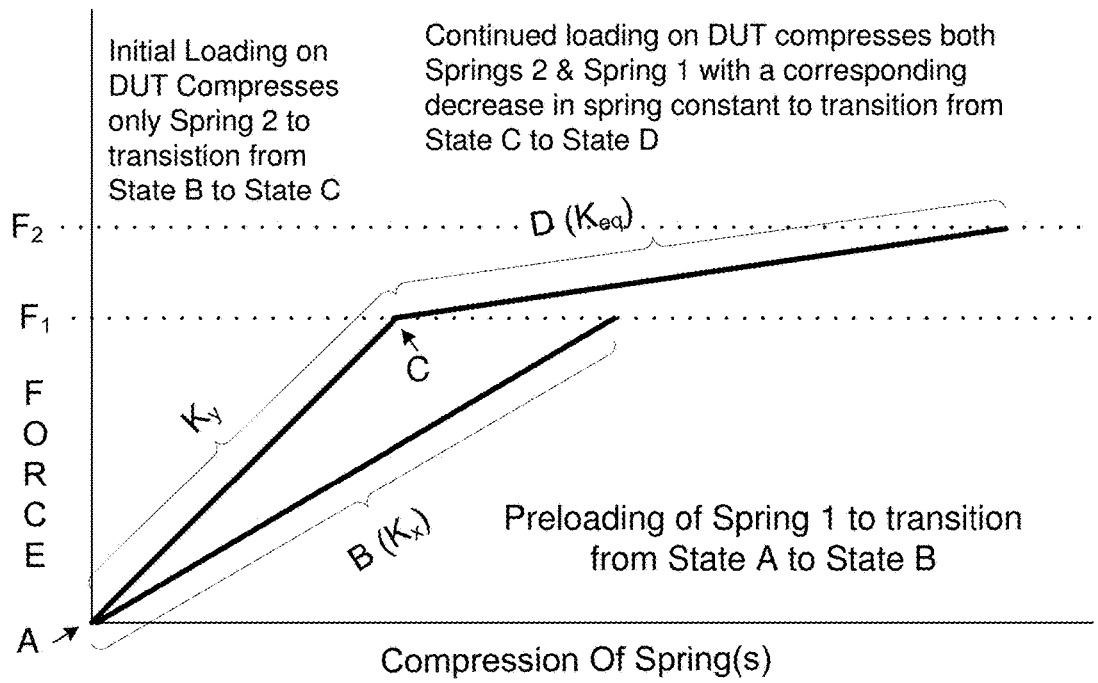
FIG. 2H-E
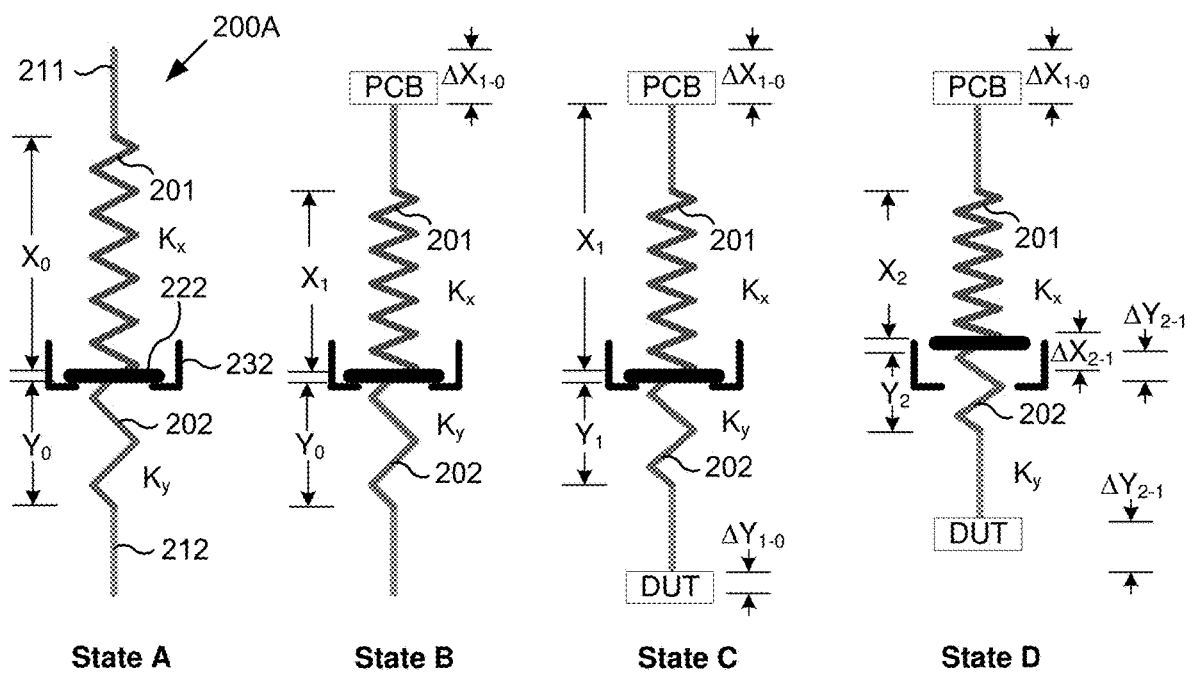
FIG. 2H-A  FIG. 2H-B  FIG. 2H-C  FIG. 2H-D

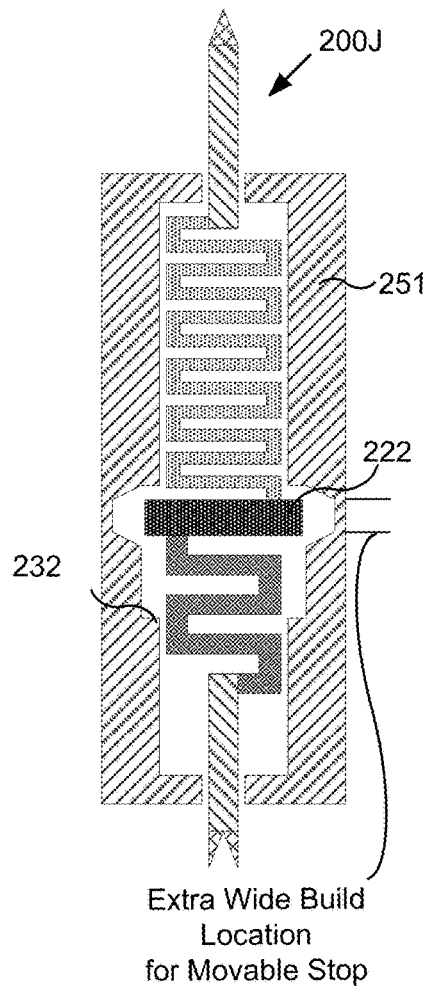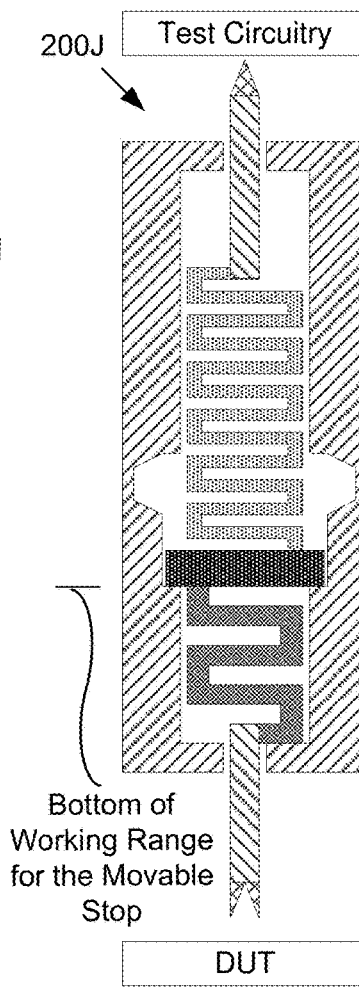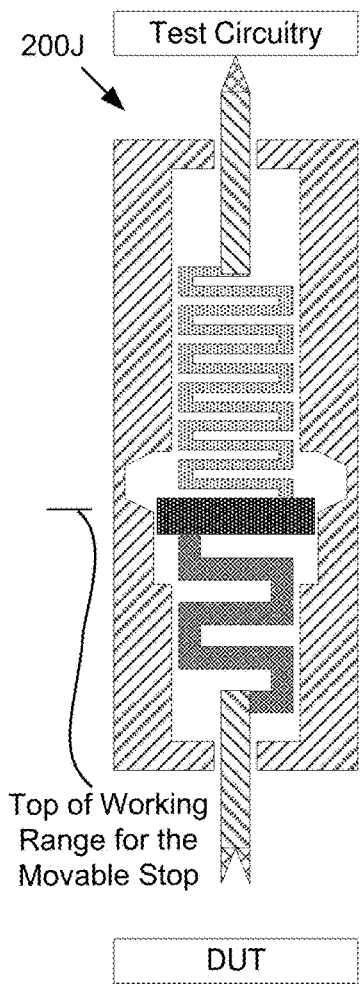
FIG. 2J-1   FIG. 2J-2   FIG. 2J-3

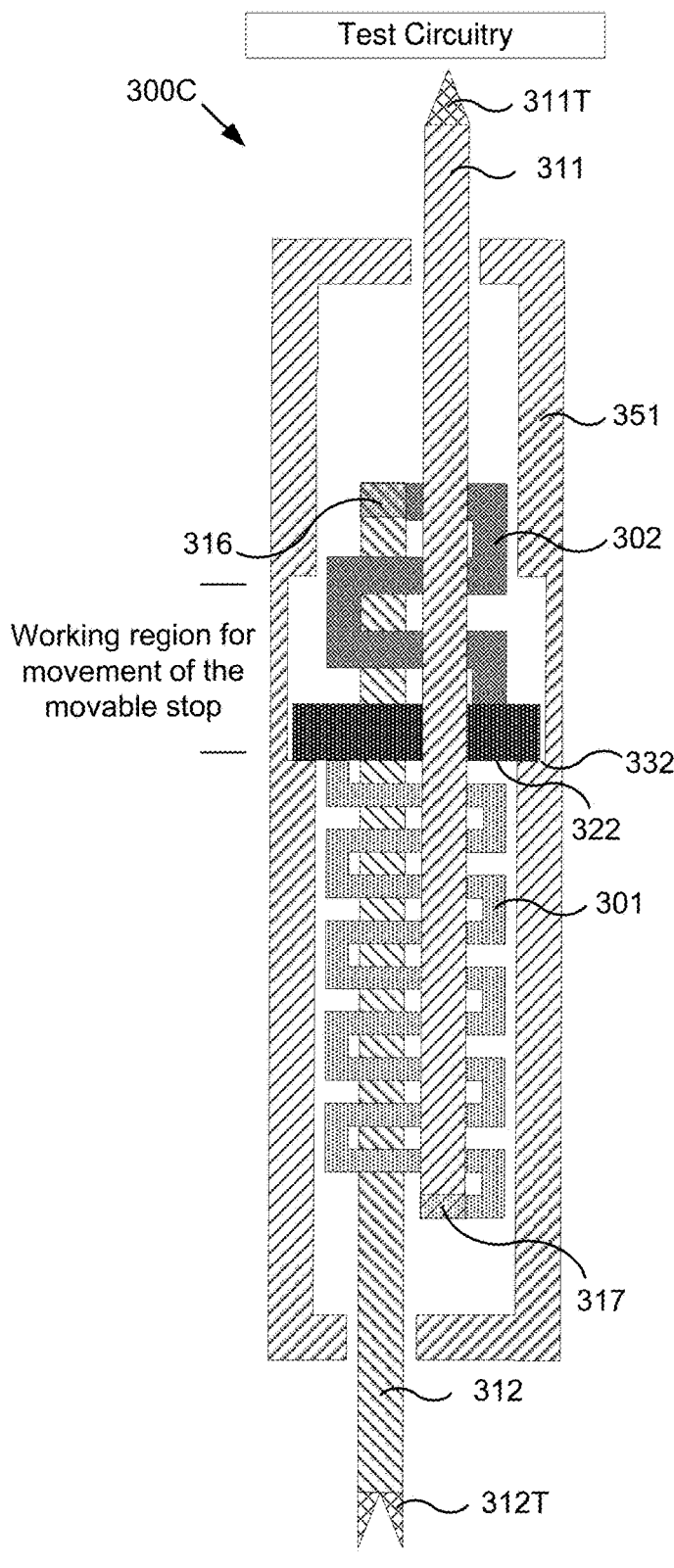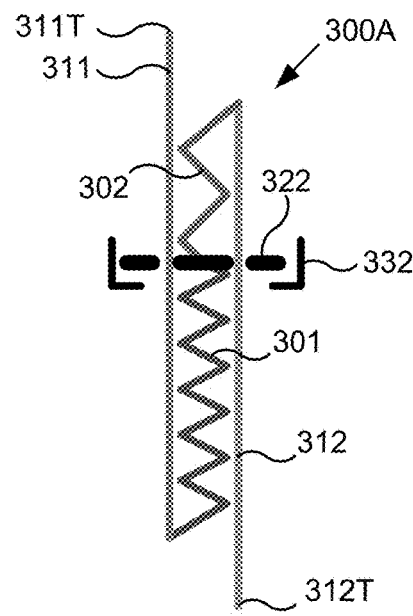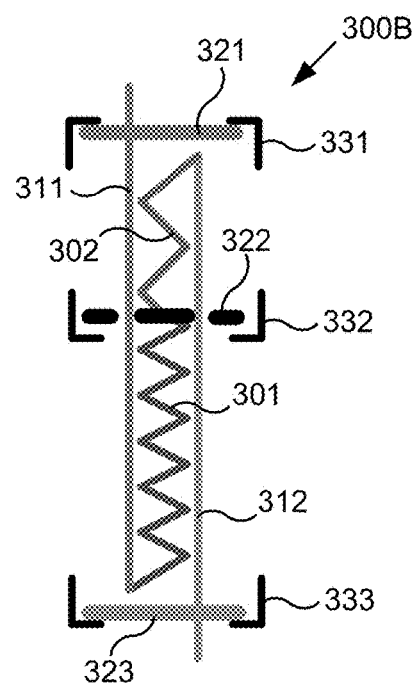
FIG. 3A
FIG. 3B
FIG. 3C-1

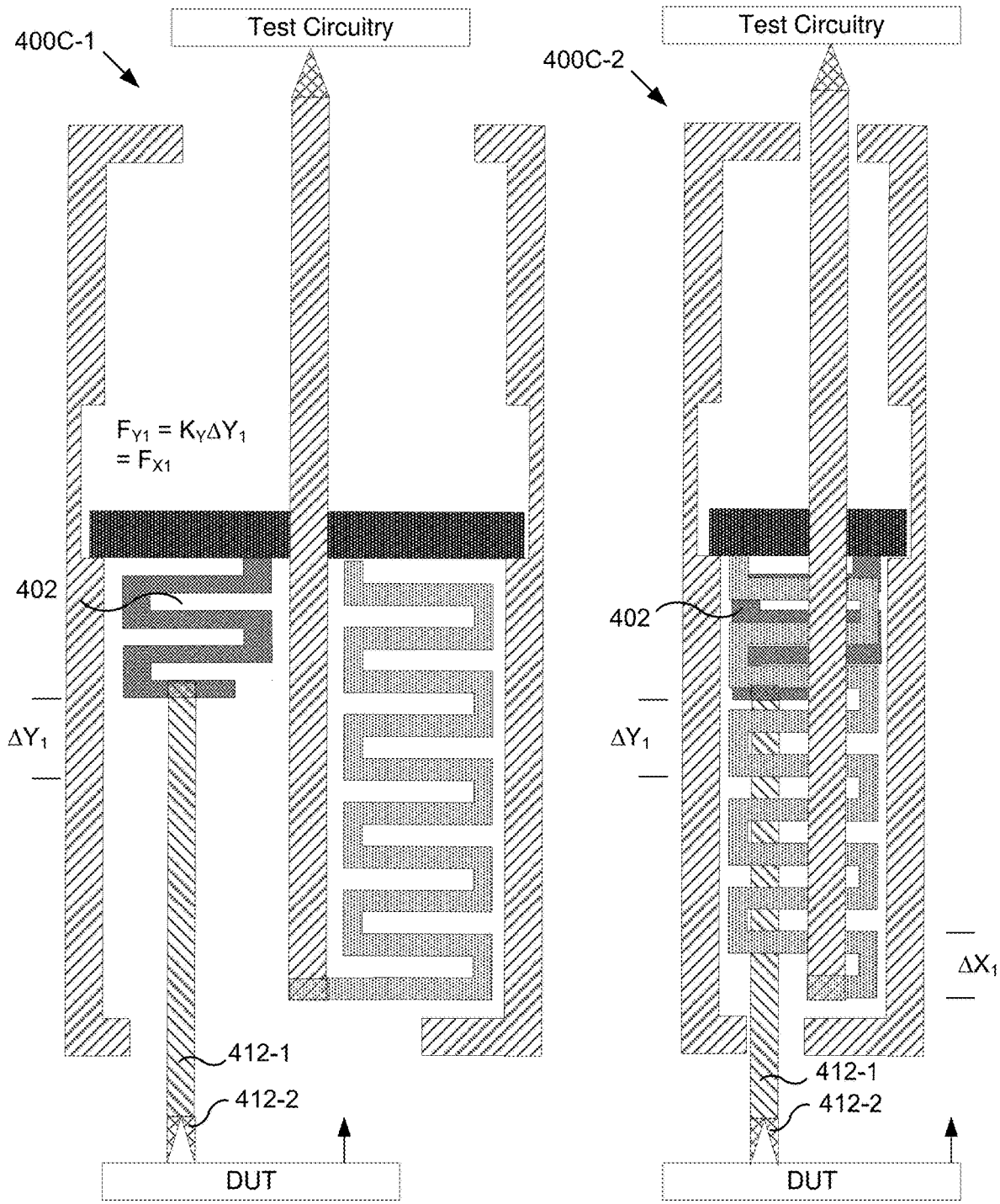
FIG. 4C-3A   FIG. 4C-3B

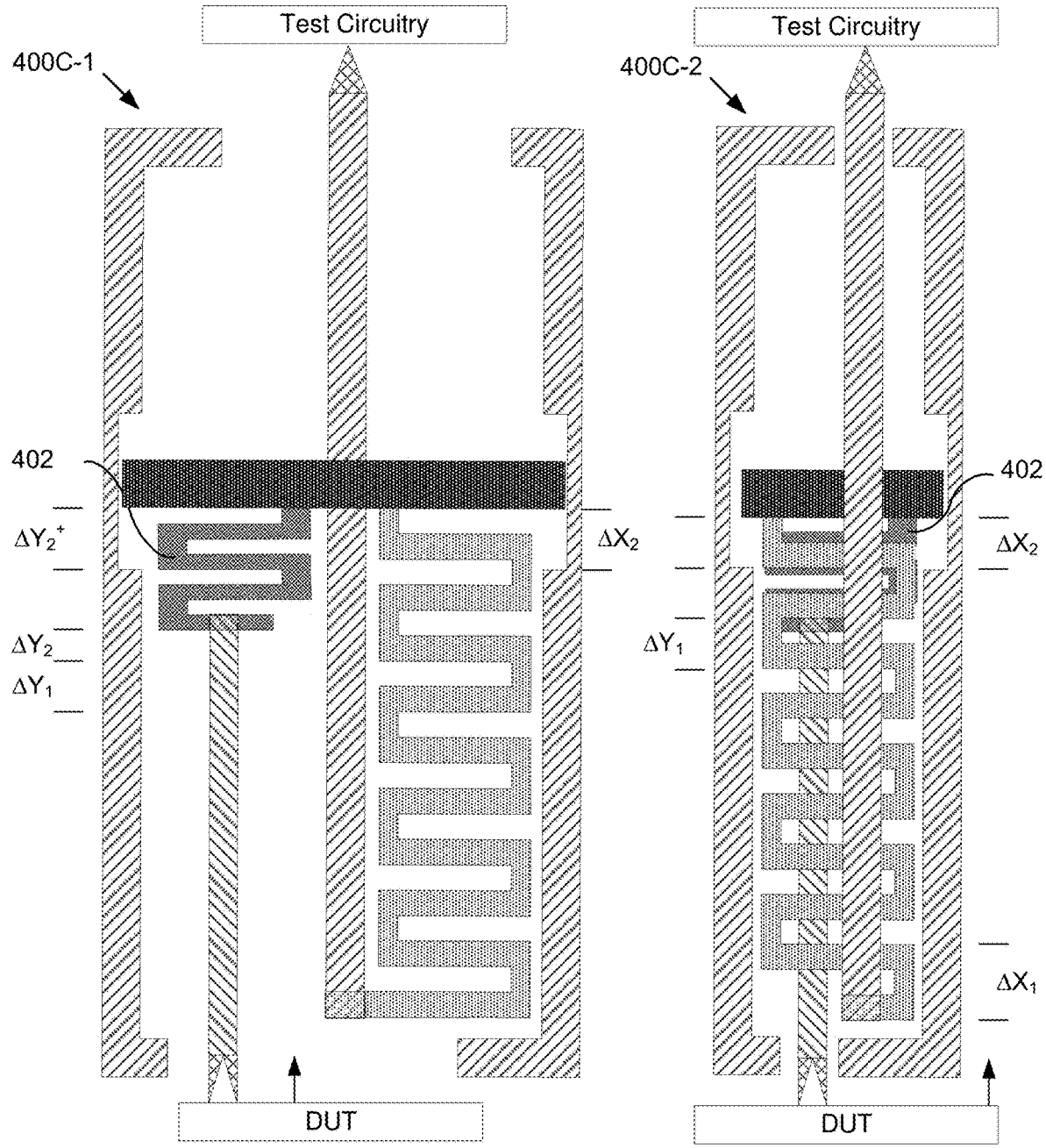
$$F_{Y2} = K_Y \Delta Y_1 + K_{EQ}(\Delta Y_2^+ - \Delta Y_2^-) = F_{X2} = K_X \Delta X_1 + K_{EQ}\Delta X_2$$
= Force exerted by both tips
FIG. 4C-4A  FIG. 4C-4B

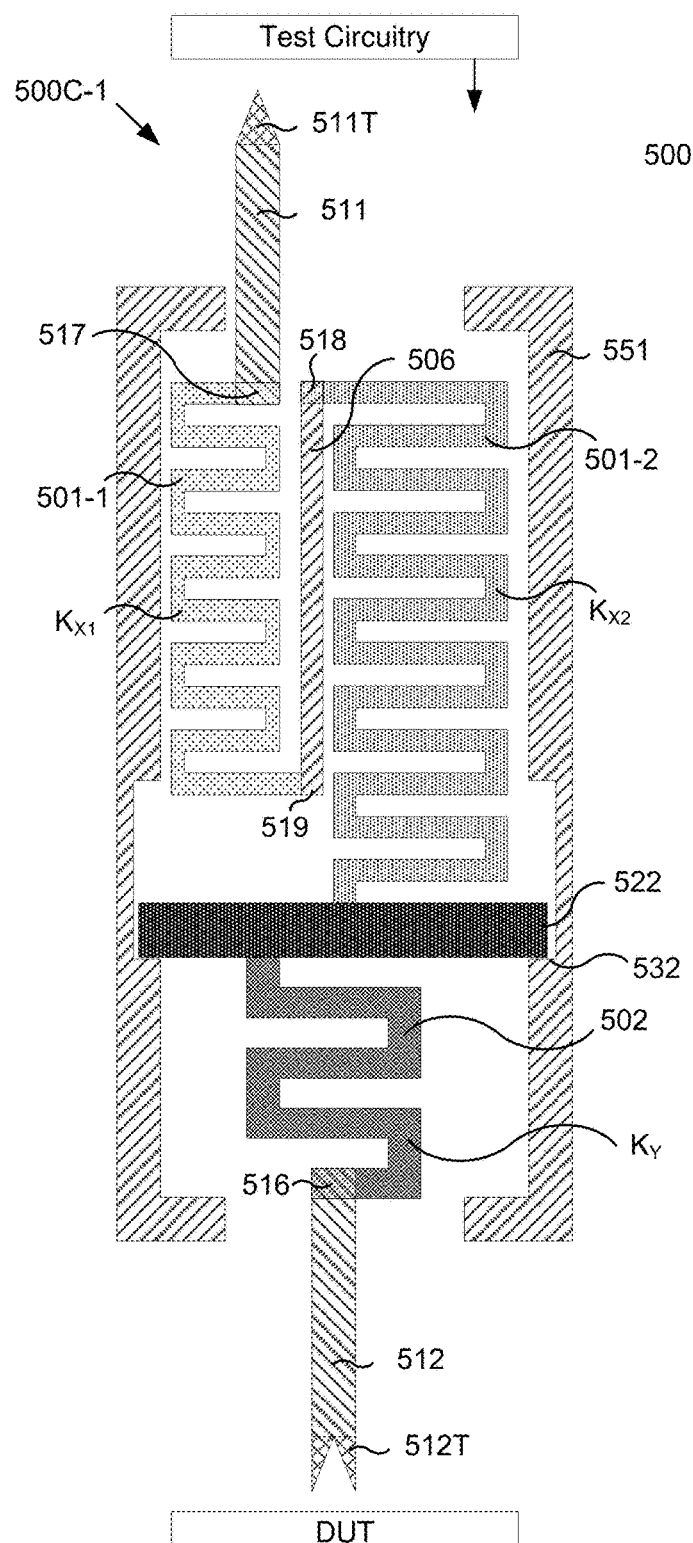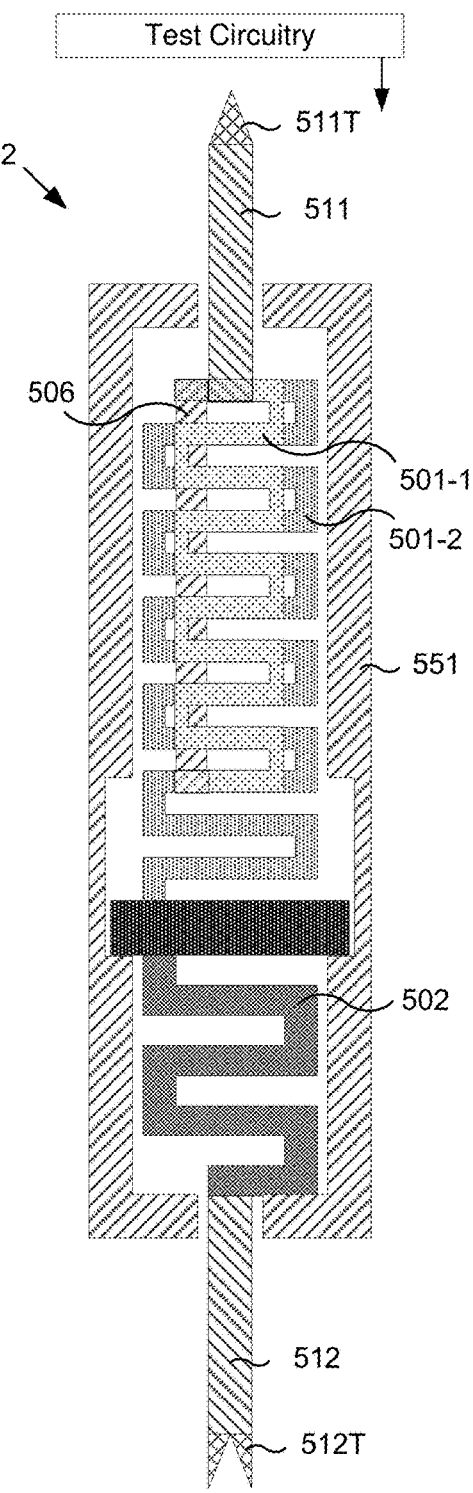
FIG. 5C-1A    FIG. 5C-1B

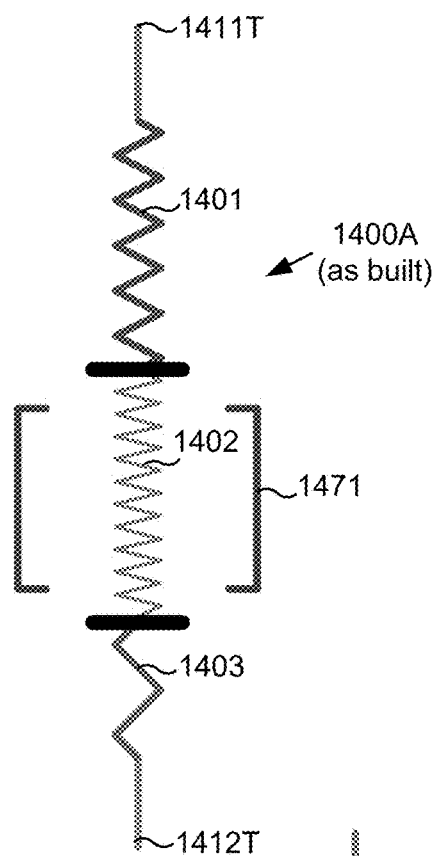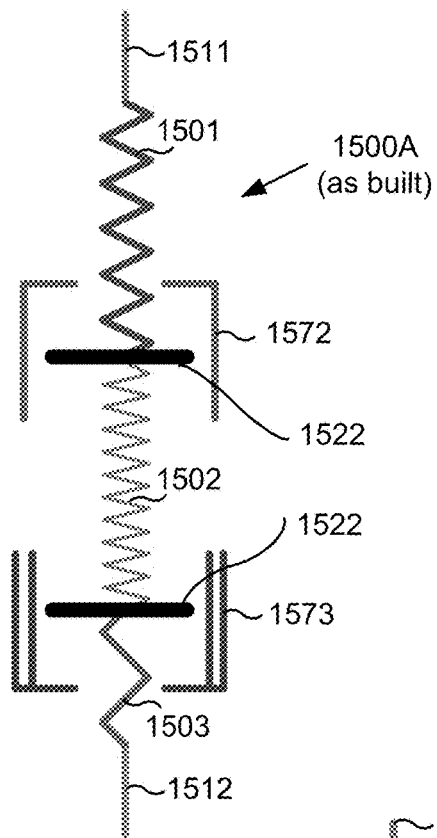
FIG. 14A  FIG. 15A
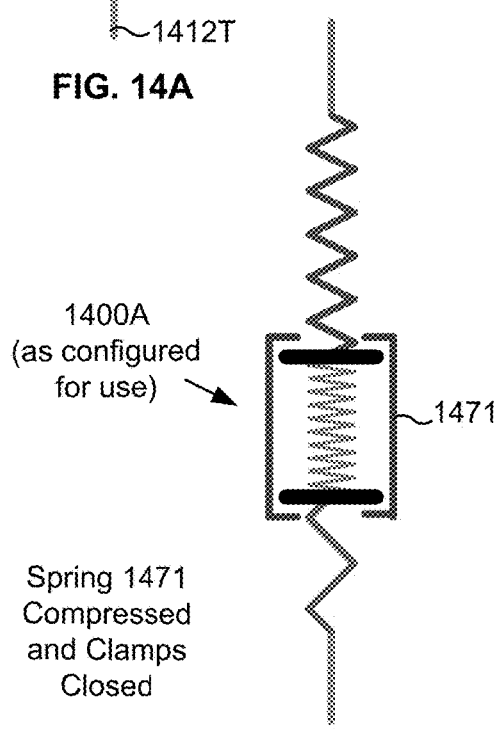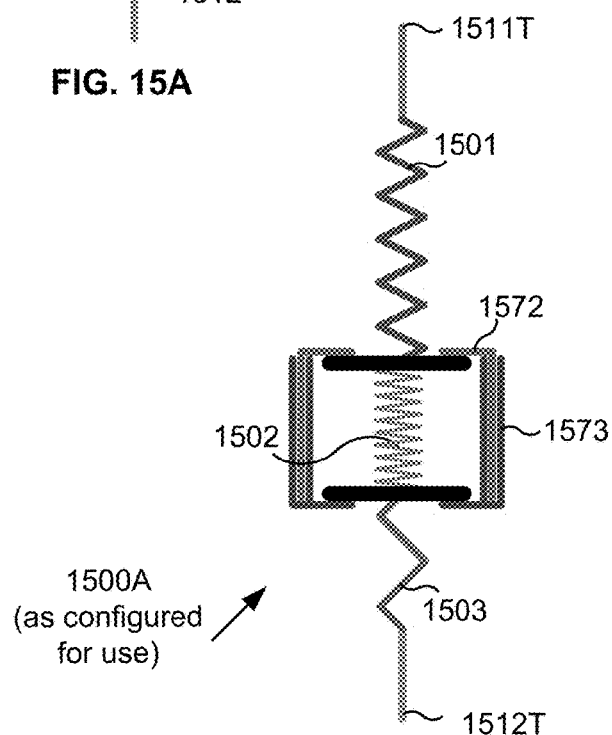
FIG. 14B  FIG. 15B

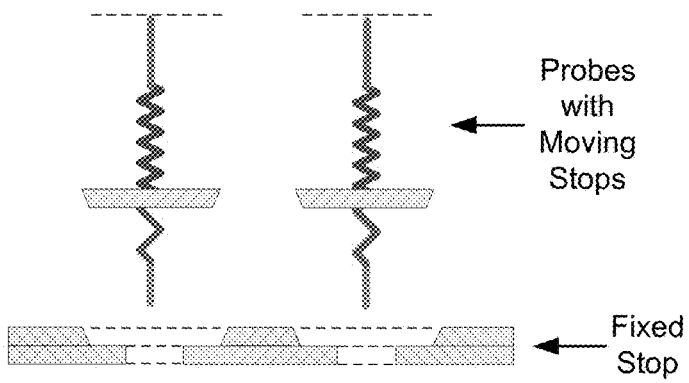
FIG. 17A
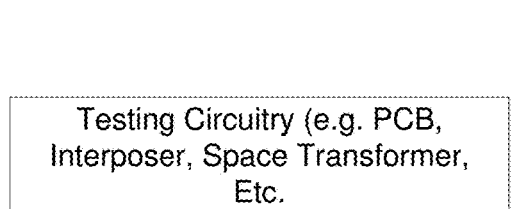
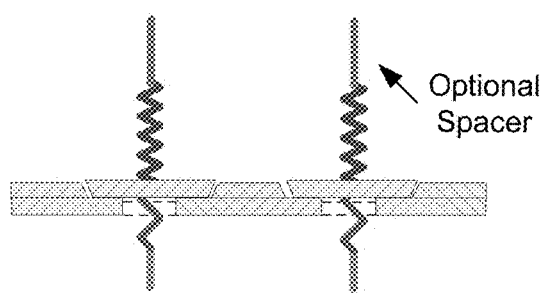
FIG. 17B – Option 1
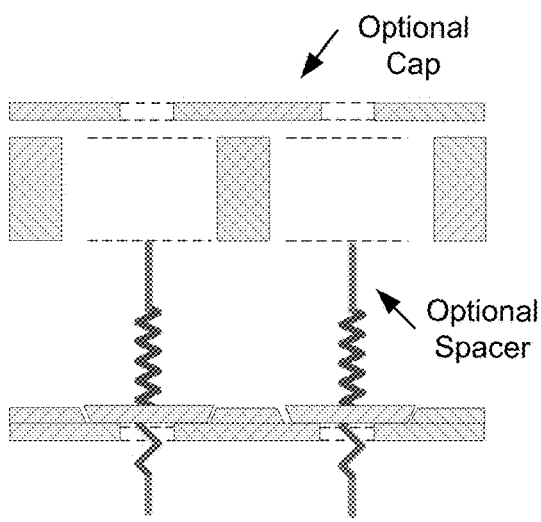
FIG. 17B – Option 2
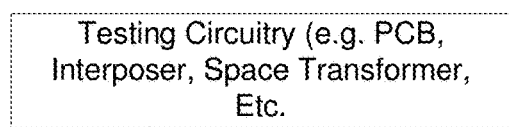
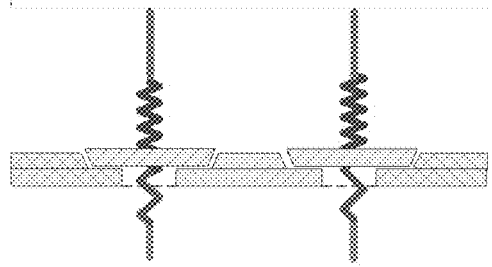
FIG. 17C – Option 1
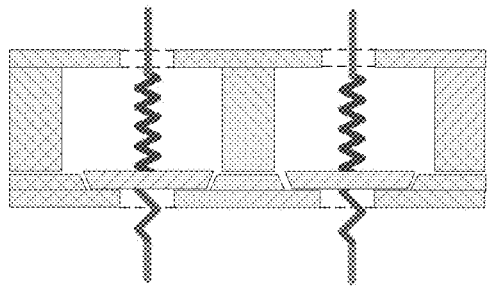
FIG. 17C – Option 2

Press Biasing Plate & Base together, stretching the Upper Spring.

Shift Upper Plates.

Remove Biasing Plates.

Remove Base.

(Top view of the Upper Multi-Probe Compression Bar)

Upper Compression Bar

Compression Bar Alignment Insert

Probe

Lower Compression Bar (Top view of Lower Multi-Probe Compression Bar

Loading Spring Array into Tester & Biasing Springs
(Tester Side First, Then DUT Side)

Loading Spring Array into Tester & Biasing Springs
(DUT Side First, Then Tester Side)

2 K's
(Top 1st
Bottom 2nd)

2 Tips
1 Side

2 K's
(Top 1st
Bottom 2nd)

2 K's
(Top 1st
Bottom 2nd)

2 K's
(Bottom 1st
Top 2nd)

2 Tips
1 Side

2 K's
(Bottom 1st
Top 2nd)

2 K's
(Bottom 1st
Top 2nd)

Up to 3 K's
(Top 1st
Bottom 2nd)

2 Tips
1 Side

Up to 3 K's
(Top 1st
Bottom 2nd)

2 Tips
1 Side

2 Tips
1 Side

Up to 3 K's
(Top 1st
Bottom 2nd)

2 Tips
1 Side

Up to 3 K's
(Top 1st
Bottom 2nd)

K change
(if geometry allows 1-
stop functionality)

2 Tips
1 Side

K change
(if geometry allows
1-stop functionality)

2 Tips
1 Side

2 Tips
1 Side

Pre-Bias M
(Up to 1 K change
per end)

2 Tips
1 Side

Pre-Bias M
(Up to 1 K change
per end)

Pre-Bias M
(Up to 1 K change per end)

2 Tips
1 Side

Pre-Bias M
(Up to 1 K change per end)

2 Tips
1 Side

2 Tips
1 Side

K change
(if geometry allows 1-stop functionality)

2 Tips
1 Side

K change
(if geometry allows 1-stop functionality)

Up to 3 K's
(Bottom 1st
Top 2nd)

2 Tips
1 Side

Up to 3 K's
(Bottom 1st
Top 2nd)

2 Tips
1 Side

2 Tips
1 Side

Up to 3 K's
(Bottom 1st
Top 2nd)

2 Tips
1 Side

Up to 3 K's
(Bottom 1st
Top 2nd)

Lower End Tip, Pre-Biased Top Spring

One Lower End Tip with Other Spring Pre-Biased

Lower End Tip, Pre-Biased Top Spring (Via Top Connector)

Lower End Tip, Pre-Biased Lower Spring

Upper End Tip, Pre-Biased Lower Spring

One Lower End Tip with other Spring Pre-Biased

Upper End Tip, Pre-Biased Upper Spring (Via Lower Connector

Upper End Tip, Pre-Biased Upper Spring

PROBES WITH MULTIPLE SPRINGS, METHODS FOR MAKING, AND METHODS FOR USING

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Issued on | Dkt No. Fragment |
|---|---|---|---|---|---|---|
| This application | claims benefit of | 62/961,675 | 2020 Jan. 15 | pending | — | 382-B |
| This application | claims benefit of | 62/956,124 | 2019 Dec. 31 | pending | — | 382-A |
| This application | claims benefit of | 62/956,016 | 2019 Dec. 31 | pending | — | 381-A |
| This application | claims benefit of | 62/961,672 | 2020 Jan. 15 | pending | — | 381-B |
| This application | claims benefit of | 62/956,122 | 2019 Dec. 31 | pending | — | 383-A |
| This application | claims benefit of | 62/961,678 | 2020 Jan. 15 | pending | — | 383-B |

FIELD OF THE INVENTION

Embodiments of the present invention relate to electrical test probes (e.g., for wafer level testing of semiconductors, socket testing of integrated circuits, burn in testing, or testing of other electronic components and assemblies), more particularly embodiments are directed to probes using multiple springs in series with one or more intermediate movable stops that engage fixed stops that may or may not be part of the probes (e.g., they may be part of array structures). In some embodiments the multiple springs are provided as flat springs laid side-by-side with distinct guide paths, in some embodiments the probes are provided with only compression springs, only extension springs, or a combination of compression and extension springs. In some embodiments the springs are configured in relation to one another to provide a decrease in rate of longitudinal biasing (e.g., a decrease in effective spring constant) after an initial compression of the probe at a higher rate of longitudinal biasing. Other embodiments are directed to methods of using such probes alone or as part of multi-probe arrays while still other methods are directed to methods of making such probes and/or arrays of probes.

BACKGROUND OF THE INVENTION

Probes:

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein as are any teachings set forth in each of their prior priority applications.

| U.S. patent application Ser. No., Filing Date U.S. App Pub No., Pub Date U.S. Pat. No., Pub Date | First Named Inventor, "Title" | Dkt. No. Fragment |
|---|---|---|
| 10/772,943 - Feb. 4, 2004<br>2005-0104609 - May 19, 2005<br>— | Arat, et al., "Electrochemically Fabricated Microprobes" | 097-A |
| 10/949,738 - Sep. 24, 2019<br>2006-0006888 - Jan. 12, 2006<br>— | Kruglick, et al., "Electrochemically Fabricated Microprobes" | 119-A |
| 11/028,945 - Jan. 3, 2005<br>2005-0223543 - Oct. 13, 2005<br>7,640,651 - Jan. 5, 2010 | Cohen, et al., "A Fabrication Process for Co-Fabricating a Multilayer Probe Array and a Space Transformer" | 134-A |
| 11/028,960 - Jan 3, 2005<br>2005-0179458 - Aug. 18, 2005<br>7,265,565 - Sep. 4, 2007 | Chen, et al. "Cantilever Microprobes for Contacting Electronic Components and Methods for Making Such Probes" | 140-A |
| 11/029,180 - Jan. 3, 2005<br>2005-0184748 - Aug. 25, 2005<br>— | Chen, et al. "Pin-Type Probes for Contacting Electronic Circuits and Methods for Making Such Probes" | 139-A |
| 11/029,217 - Jan. 3, 2005<br>2005-0221644 - Oct. 6, 2005<br>7,412,767 - Aug. 19, 2008 | Kim, et al., "Microprobe Tips and Methods for Making" | 122-A |
| 11/173,241 - Jun. 30, 2005<br>2006-0108678 - May 25, 2006 | Kumar, et al., Probe Arrays and Method for Making | 137-A |
| 11/178,145 - Jul. 7, 2005<br>2006-0112550 - Jun. 1, 2006<br>7,273,812 - Sep. 25, 2007 | Kim, et al., "Microprobe Tips and Methods for Making" | 136-B |

-continued

| U.S. patent application Ser. No., Filing Date U.S. App Pub No., Pub Date U.S. Pat. No., Pub Date | First Named Inventor, "Title" | Dkt. No. Fragment |
|---|---|---|
| 11/325,404 - Jan. 3, 2006 2006-0238209 - Oct. 26, 2006 | Chen, et al., "Electrochemically Fabricated Microprobes" | 153-A |
| 14/986,500 - Dec. 31, 2015 2016-0231356 - Aug. 11, 2016 10,215,775 - Feb. 26, 2019 | Wu, et al. "Multi-Layer, Multi-Material Micro-Scale and Millimeter-Scale Devices with Enhanced Electrical and/or Mechanical Properties" | 296-D |
| 16/172,354 - Oct. 18, 2018 2019-0204354 - Jul. 4, 2019 — | Chen, et al. "Pin-Type Probes for Contacting Electronic Circuits and Methods for Making Such Probes" | 366-A |
| 16/584,818 - Sep. 26, 2019 — — | Smalley, "Probes Having Improved Mechanical and/or Electrical Properties for Making Contact between Electronic Circuit Elements and Methods for Making" | 376-A |
| 16/584,863 - Sep. 26, 2019 — — | Frodis, "Probes Having Improved Mechanical and/or Electrical Properties for Making Contact between Electronic Circuit Elements and Methods for Making" | 377-A |
| 62/805,589 - Feb. 14, 2019 | Frodis, "Multi-Beam Vertical Probes with Independent Arms Formed of a High Conductivity Metal for Enhancing Current Carrying Capacity and Methods for Making Such Probes" | 370-A |
| 62/955,781 - Dec. 31, 2019 | Veeramani, "Probes with Planar Unbiased Spring Elements for Electronic Component Contact and Methods for Making Such Probes" | 379-A |
| 62/985,859 - Mar. 5, 2020 | Veeramani, "Probes with Planar Unbiased Spring Elements for Electronic Component Contact and Methods for Making Such Probes" | 379-B |
| 17/139,925 - Dec. 31, 2020 | Veeramani, "Probes with Planar Unbiased Spring Elements for Electronic Component Contact and Methods for Making Such Probes" | 398-A |
| 17/139,936 - Dec. 31, 2020 | Wu, et al., "Probes with Multiple Springs, Methods for Making, and Methods for Using" | 400-A |
| 17/139,940 - Dec. 31, 2020 | Wu, "Compliant Pin Probes with Flat Extension Springs, Methods for Making, and Methods for Using | 401-A |

Electrochemical Fabrication:

Electrochemical fabrication techniques for forming three-dimensional structures from a plurality of adhered layers have been, and are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000 to Adam Cohen.

A related method for forming microstructures using electrochemical fabrication techniques is taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this capability, and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, improved operational capabilities, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved probes allowing at least one increase in compliance (e.g., decrease in spring constant) as compression of the probe occurs across one or more force thresholds.

It is an object of some embodiments of the invention to provide improved probes allowing at least two stages of compliance wherein an increase in compliance (e.g., reduced spring constant) occurs as compression reaches a particular level.

It is an object of some embodiments of the invention to provide improved longitudinally compressible probes having at least two stages of different compliance wherein increased compliance (e.g., reduced spring constant) occurs in association with an increased compression of the probe when compressing the probe from at least one side.

It is an object of some embodiments of the invention to provide improved longitudinally compressible probes having at least three stages of different compliance wherein increased compliance (e.g., reduced spring constant) occurs in association with more compression of the probe when compressing the probe from at least one side.

It is an object of some embodiments of the invention to provide improved probes allowing at least one preloading stop, that is functionally operational between at least two spring elements that are connected in series, such that upon loading of one end of the probe against a contact surface of a DUT (or other electrical component) an increase in compliance occurs after an initial compression at a lower compliance (e.g. a decrease in effective spring constant occurs at at least one point of increasing compression of the probe from at least one side).

It is an object of some embodiments of the invention to provide improved probes with at least one flat spring that provides a force resisting compression of the probe while the at least one spring operates in tension.

It is an object of some embodiments of the invention to provide improved probes with at least two flat springs that provide a force resisting compression of the probe while at least one spring operates in tension and at least one spring operates in compression.

It is an object of some embodiments of the invention to provide improved probes that include a preloading stop that is functionally located between two springs that are connected in series where (1) the functional stop is physically located between the two springs, or (2) where the two springs are physically located on the same side of the functional stop.

It is an object of some embodiments to the invention to provide improved probes with springs that have no preloading (i.e., upon contact of probe tips to DUTS or to other electronic circuit elements, such that no initial biasing force exists) while in other embodiments preloading of one or more springs may be provided (such that one or more springs already has a biasing force prior to contacting probe tips to DUTS or to other electronic circuit elements).

It is an object of some embodiments to the invention to provide improved probes with springs that provide more than one compliance change during compression of probe elements (tips) against DUT contact pads or bumps (e.g., using a probe with three springs and two intermediate stops that allow for two changes in compliance), four springs with three intermediate stops that allow for three changes in compliance, or N springs with N-1 intermediate stops that allow for N-1 changes in compliance.

It is an object of some embodiments of the invention to provide improved methods of fabricating probes. Some such methods may include use of only (i.e., be limited to) multi-layer, multi-material electrochemical fabrication methods that fabricate the entire probes in a fully assembled state. Other methods may use only electrochemical fabrication methods to fabricate entire probes in assembled but not fully configured states wherein additional post-layer formation steps (e.g., post sacrificial material removal steps) are used to locate one or more probe tips, or probe retention structures, within or relative to probe bodies. Other methods may include post layer steps or operations that provide for conformable coating of specialized materials over entire probes or selected portions of probes (e.g., dielectrics for isolation of probes from one another, dielectrics for electrical isolation of a portion of one probe from another portion of the same probe, e.g., for coaxial configurations, contact materials, bonding materials, adhesion enhancement materials, barrier materials, and the like). Other methods may include formation of intentionally extended single layer contact surfaces that allow uninhibited movement of slidable probe components even in the presence of unintended layer features (e.g., layer-to-layer offsets or non-perpendicular intra-layer wall configurations). Still other methods may include setting probe orientation relative to layer planes and layer stacking directions to allow optimal creation of probe features, to minimize layer count required to form probes, to minimize probe foot print to maximum probe count that can be formed in a batch fabrication process on a build surface of specified area; and/or formation of features of opposed slidable, or otherwise movable, probe elements in build locations that allow minimum feature size gaps to exist which are larger than gaps desired when the probes are in operational configurations along with formation of spring loaded stops, snap-together features, or other structures that allow enforcement of working locations or working regions that are distinct from build locations.

It is an object of some embodiments of the invention to provide improved methods of fabricating probe arrays.

It is an object of some embodiments of the invention to provide improved methods of using probes and/or probe arrays or putting probes or probe arrays to use while minimizing risk of damaging DUTS during testing. In some such methods contact between probes and non-DUT electronic components (e.g. tester PCBs and the like) and contact between probes and DUTs are temporally separated to allow initial loading of selected spring elements (e.g. those that control contact with non-DUT circuitry) such that the preloading allows intermediate movable and fixed stop structures to contact one another to create transition configurations that allow compliance enhancements when other probe features contact DUTs such that compliance initially has a first value (e.g. a first spring constant) but after some compression of the probe the compliance changes to a second value that is larger than the first value (e.g. changes from a higher spring constant to a lower spring constant).

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, may address none of these objects but other objects ascertained from the teachings herein. It is not intended that all objects be addressed by any single aspect or embodiment of the invention.

In a first aspect of the invention, a probe for making electrical connections, including: (a) a first tip having a distal end and a proximal end, wherein the proximal end is for making an electrical connection to a first circuit element, wherein the electrical connection is selected from the group consisting of: (1) a spring-loaded temporary contact connection, (2) an adhered connection, (3) a bonded connection, and (4) an attached connection; (b) a first spring having a proximal end and a distal end with the proximal end connected directly or indirectly to the distal end of the first tip; (c) a first movable stop connected directly or indirectly at the distal end of the first spring; (d) a second spring element having a proximal end and a distal end with the proximal end connected directly or indirectly to the first movable stop, (e) a second tip having a proximal end and a distal end, wherein the distal end is for making an electrical connection to a second circuit element, wherein the electrical connection is selected from the group consisting of: (1) a spring-loaded temporary contact connection, (2) an adhered connection, (3) a bonded connection, and (4) an attached connection, and wherein the proximal end of the second tip is connected directly or indirectly to the distal end of the second spring element, wherein the first movable stop is capable of movement based on an interaction selected from the group consisting of: (A1) loading applied directly by the first spring to the first movable stop, (A2) loading applied indirectly by the first spring to the first movable stop, (A3)

loading applied directly by the second spring to the first movable stop, (A4) loading applied indirectly by the second spring to the first movable stop, (A5) engagement of the first movable stop with a first fixed stop that is part of the probe, (A6) engagement of the first movable stop with a first fixed stop where the first fixed stop is not part of the probe but is part of an assembly into which the probe is mounted, (A7) at least two of interactions (A1)-(A6), (A8) at least three of interactions (A1)-(A6), (A8) at least four of interactions (A1)-(A6), and (A9) at least five of interactions (A1)-(A6).

Numerous variations of the first aspect of the invention are possible and include, for example: (1) the first fixed stop inhibiting motion of the first movable stop in a direction selected the group consisting of: (a) from the first tip to the second tip and (b) from the second tip to the first tip; (2) the probe being configured to operate under a condition selected from the group consisting of: (a) the first spring and the second spring operate under compression, (b) the first spring operates under compression and the second spring operates under tension, (c) the first spring operates under tension and the second spring operating under compression, and (d) the first spring and the second spring operate under tension; (3) the first spring including a plurality of springs, with the plurality of springs connected in a manner selected from the group consisting of: (a) in series, (b) in parallel, and (c) in a combination of series and parallel connections; (4) the second spring including a plurality of springs with the plurality of springs connected in a manner selected from the group consisting of: (a) in series, (b) in parallel, and (c) in a combination of series and parallel connections; (5) the force exerted by a selected spring segment being selected from the group consisting of: (a) a linear change in length in response to force loading, (b) a substantially linear change in length in response to changes in force loading (i.e. within 10% of linear over a working range), (c) a largely linear change in length in response to changes in force loading (i.e. within 25% of linear over a working range), and (d) a non-linear change in length in response to changes in force loading (i.e. more than 25% variation from linear over at least part of a working range); (6) a ratio of spring force to change in length between two springs being selected from the group consisting of: (a) $Fx/\Delta x = Fy/\Delta y$; (b) $Fx/\Delta x \neq Fy/\Delta y$; (c) $Fx/\Delta x = \text{constant} = Fy/\Delta y$; (d) $\text{constant1} = Fx/\Delta x \neq Fy/\Delta y = \text{constant2}$; and (e) $\text{constant} \neq Fx/\Delta x$ and $Fy/\Delta y \neq \text{constant}$; (7) at least one spring having a shape selected from the group consisting of: (a) flat with a plurality of straight arms connected by non–90° angular contacts, (b) flat with a plurality of straight arms connected by substantially 90° angular contacts prior to deflection, (c) flat with a plurality of connected S shaped arms, (d) flat with a plurality of C-shaped arms joined to one another by linear arms that extend perpendicular to a longitudinal axis of the probe prior to deflection, (e) a plurality of curved arms connected to one to another; (f) flat with a substantially uniform thickness (within 10%) and width (within 10%); (g) a plurality of arms connected serially to one another; (h) a flat spring segment with a plurality of arms connected serially together connected at one end to a second flat spring segment with a plurality of arms connected serially together; (i) a circular cylindrical configuration, (j) a circular cylindrical configuration with an inward spiral, (k) a rectangular cylindrical configuration with an inward spiral on at least one end; (l) a rectangular cylindrical configuration with an inward spiral on at least one end; (m) a flat spring with a plurality of sinusoidal oscillations; (n) a plurality of straight beams connected in a saw tooth pattern; (o) a plurality of straight beams connected in a pattern by acute angles; and (o) a plurality of straight beams connected in a pattern by obtuse angles; (8) the probe having at least one compression spring segment including a flat spring including a plurality of undulations extending serially along at least a portion of its longitudinal axis and undulating back and forth along a single lateral axis where the undulations take a form selected from the group consisting of: (a) a rectangular wave, (b) a rectangular wave with curved corners, (c) a triangular wave, (d) a sine wave, (e) a plurality of S-shaped curves, (f) a plurality of C-shaped curves, (g) some other angled repetitive form, (h) some other curved repetitive form, (i) a form that has at least one decrease or increase in lateral amplitude, and (j) one of the above forms with the form offset from a central line of the probe, and wherein the probe further includes a stabilizing structure or structures selected from the group consisting of: (i) a plurality of tabs on the spring segment extending in a lateral direction perpendicular to the direction of undulation that engage at least an edge of a guide, (ii) a guide inhibiting excessive movement of the spring segment in a direction parallel to a normal of a plane of undulation, (iii) a guide inhibiting excessive movement of the spring segment in a direction perpendicular to both a normal of a plane of undulation and perpendicular to a longitudinal axis of the probe, and (iv) at least one slot, in which the spring segment compresses, that bounds the sides and at least the upper and lower edges of the undulations; (9) the probe additionally including at least one additional spring in series with the first and second springs and at least one additional movable stop functionally connected wherein the first movable stop being intermediate to two of the first, second and the at least one additional spring and the second movable stop between intermediate to a different two of the first, second, and the at least one additional spring; (10) the ninth variation with the first spring, the second spring, the at least one additional spring, the first movable stop, and the at least one additional stop being configured to preload a middle spring such that bidirectional compression of the first tip and the second tip can lead to decreases in spring constant upon sufficient compression of the first tip and the second tip; (11) the ninth variation with the first spring, the second spring, the at least one additional spring, the first movable stop, and the at least one additional stop being configured for preloading such that movement in one direction of one of the first tip and the second tip involves a first decrease in effective spring constant upon a first compression force or compression distance being reached and a second decrease in spring constant upon a second, larger, compression force or compression distance being reached; (12) at least one of the first or second electrical connections being a spring-loaded temporary contact connection; (13) at least one of the first or second electrical connections being an adhered connection; (14) at least one of the first or second electrical connections being a bonded connection; (15) at least one of the first or second electrical connections being an attached connection; (16) both of the first and second electrical connections being spring-loaded temporary contact connections; (17) both of the first and second electrical connections being spring-loaded temporary contact connections; (18) both of the first and second electrical connections being adhered connections; (19) both of the first and second electrical connections being bonded connections; and (20) both of the first and second electrical connections being attached connections.

In a second aspect of the invention, a probe for making electrical connections, including: (a) a first tip having a distal end and a proximal end, wherein the proximal end is for making an electrical connection to a first circuit element, wherein the electrical connection is selected from the group consisting of: (1) a spring-loaded temporary contact connection, (2) an adhered connection, (3) a bonded connection, and (4) an attached connection; (b) a first spring having a proximal end and a distal end with the proximal end connected directly or indirectly to the distal end of the first tip; (c) a first movable stop connected directly or indirectly at the distal end of the first spring; (d) a second spring element having a proximal end and a distal end with the proximal end connected directly or indirectly to the first movable stop; (e) a second movable stop connected directly or indirectly at the distal end of the second spring; (f) a third spring element having a proximal end and a distal end with the proximal end connected directly or indirectly to the second movable stop; (g) a second tip having a proximal end and a distal end, wherein the distal end is for making an electrical connection to a second circuit element, wherein the electrical connection is selected from the group consisting of: (1) a spring-loaded temporary contact connection, (2) an adhered connection, (3) a bonded connection, and (4) an attached connection, and wherein the proximal end of the second tip is connected directly or indirectly to the distal end of the third spring element, wherein the first movable stop is capable of movement based on an interaction selected from the group consisting of: (A1) loading applied directly by the first spring to the first movable stop, (A2) loading applied indirectly by the first spring to the first movable stop, (A3) loading applied directly by the second spring to the first movable stop, (A4) loading applied indirectly by the second spring to the first movable stop, (A5) engagement of the first movable stop with a first fixed stop that is part of the probe, (A6) engagement of the first movable stop with a first fixed stop where the first fixed stop is not part of the probe but is part of an assembly into which the probe is mounted, (A7) at least two of interactions (A1)-(A6), (A8) at least three of interactions (A1)-(A6), (A8) at least four of interactions (A1)-(A6), and (A9) at least five of interactions (A1)-(A6), wherein the second movable stop is capable of movement based on an interaction selected from the group consisting of: (B1) loading applied directly by the second spring to the second movable stop, (B2) loading applied indirectly by the second spring to the second movable stop, (B3) loading applied directly by the third spring to the second movable stop, (B4) loading applied indirectly by the third spring to the second movable stop, (B5) engagement of the second movable stop with a second fixed stop that is part of the probe, (B6) engagement of the second movable stop with a second fixed stop where the second fixed stop is not part of the probe but is part of an assembly into which the probe is mounted, (B7) at least two of interactions (B1)-(B6), (B8) at least three of interactions (B1)-(B6), (B8) at least four of interactions (B1)-(B6), and (B9) at least five of interactions (B1)-(B6).

Numerous variations of the second aspect of the invention are possible and include, for example: (1) a first fixed stop inhibiting motion of the first movable stop in a direction selected the group consisting of: (a) from the first tip to the second tip and (b) from the second tip to the first tip and wherein a second fixed stop inhibits motion of the second movable stop in a direction selected the group consisting of: (a) from the first tip to the second tip and (b) from the second tip to the first tip; (2) the probe being configured to operate under a condition selected from the group consisting of: (a) each of the springs operates under compression, (b) each spring operates under tension, (c) at least one of the springs operates under compression and at least one of the springs operates under tension, (d) at least two of the springs operate under tension and at least one spring operates under compression, (e) at least two of the springs operate under compression and at least one spring operates under tension; (3) the at least one of the springs including a plurality of springs, with the plurality of springs connected in a manner selected from the group consisting of: (a) in series, (b) in parallel, (c) in a combination of series and parallel connections; (4) at least two of the springs including a plurality of springs, with the plurality of springs connected in a manner selected from the group consisting of: (a) in series, (b) in parallel, (c) in a combination of series and parallel connections; (5) each of the first-third springs including a plurality of springs, with the plurality of springs connected in a manner selected from the group consisting of: (a) in series, (b) in parallel, (c) in a combination of series and parallel connections; (6) the force exerted by a selected spring segment being selected from the group consisting of: (a) a linear change in length in response to force loading, (b) a substantially linear change in length in response to changes in force loading (i.e. within 10% of linear over a working range), (c) a largely linear change in length in response to changes in force loading (i.e. within 25% of linear over a working range), (d) a non-linear change in length in response to changes in force loading (i.e. more than 25% variation from linear over at least part of a working range); (7) the sixth variation with the selected spring including at least two springs; (8) the seventh variation with the selected spring including each of the first, second, and third springs; (9) a ratio of spring force to change in length between two selected springs being selected from the group consisting of: (a) $Fx/\Delta x=Fy/\Delta y$, (b) $Fx/\Delta x \neq Fy/\Delta y$, (c) $Fx/\Delta x=$constant$=Fy/\Delta y$, (d) constant1$=Fx/\Delta x \neq Fy/\Delta y=$constant2, and (e) constant$\neq Fx/\Delta x$ and $Fy/\Delta y$ t constant; (10) a ratio of spring force to change in length between the first, second, and third springs being selected from the group consisting of: (a) $Fx/\Delta x=Fy/\Delta y=Fz/\Delta z$, (b) $Fx/\Delta x \neq Fy/\Delta y=Fz/\Delta z$, (c) $Fx/\Delta x \neq Fy/\Delta y$ #$Fz/\Delta z$, (d) $Fx/\Delta x=Fy/\Delta y=Fz/\Delta z=$constant, (e) constant1$=Fx/\Delta x$, $Fy/\Delta y=$constant2, $Fz/\Delta z=$constant3, and (f) constant$\neq Fx/\Delta x$, $Fy/\Delta y$ t constant, and $Fz/\Delta z \neq$constant; (11) at least one spring having a shape selected from the group consisting of: (a) flat with a plurality of straight arms connected by non–90° angular contacts, (b) flat with a plurality of straight arms connected by substantially 90° angular contacts prior to deflection, (c) flat with a plurality of connected S shaped arms, (d) flat with a plurality of C-shaped arms joined to one another by linear arms that extend perpendicular to a longitudinal axis of the probe prior to deflection, (e) a plurality of curved arms connected to one to another; (f) flat with a substantially uniform thickness (within 10%) and width (within 10%); (g) a plurality of arms connected serially to one another; (h) a flat spring segment with a plurality of arms connected serially together connected at one end to a second flat spring segment with a plurality of arms connected serially together; (i) a circular cylindrical configuration, (j) a circular cylindrical configuration with an inward spiral, (k) a rectangular cylindrical configuration with an inward spiral on at least one end; (l) a rectangular cylindrical configuration with an inward spiral on at least one end; (m) a flat spring with a plurality of sinusoidal oscillations; (n) a plurality of straight beams connected in a saw tooth pattern; (o) a plurality of straight beams connected in a pattern by acute angles; and (p) a plurality of straight beams connected in a pattern by obtuse angles; (12) the eleventh variation with each of the springs having a shape selected from the group; (13) the twelfth variation with each of the spring having a shape selected from the same member of the group; (14) the probe having at least one compression spring segment including a flat spring including a plurality of undulations extending serially along at least a portion of its longitudinal axis and undulating back and forth along a single lateral axis where the undulations take a form selected from the group consisting of (a) a rectangular wave, (b) a rectangular wave with curved corners, (c) a triangular wave, (d) a sine wave, (e) a plurality of S-shaped curves, (f) a plurality of C-shaped curves, (g) some other angled repetitive form, (h) some other curved repetitive form, (i) a form that has at least one decrease or increase in lateral amplitude, and (j) one of the above forms with the form offset from a central line of the probe, and wherein the probe further includes a stabilizing structure or structures selected from the group consisting of (i) a plurality of tabs on the spring segment extending in a lateral direction perpendicular to the direction of undulation that engage at least an edge of a guide, (ii) a guide inhibiting excessive movement of the spring segment in a direction parallel to a normal of a plane of undulation, (iii) a guide inhibiting excessive movement of the spring segment in a direction perpendicular to both a normal of a plane of undulation and perpendicular a longitudinal axis of the probe, and (iv) at least one slot, in which the spring segment compresses, that bounds the sides and at least the upper and lower edges of the undulations; (15) the probe additionally including at least one additional spring in series with the first, second, and third springs and at least one additional movable stop functionally connected, wherein the first movable stop is intermediate to two of the first, second, third, and the at least one additional spring, the second movable stop is intermediate to a different two of the first, second, third and at least one additional spring, and the at least one additional movable stop is located intermediate to a different two of the first, second, third and at least one additional spring; (16) the fifteenth variation with the first spring, the second spring, the third spring, the at least one additional spring, the first movable stop, the second movable stop, and the at least one additional stop being configured to preload at least one intermediate spring such that bidirectional compression of the first tip and the second tip can lead to decreases in spring constant upon sufficient compression of the first tip and the second tip; (17) the fifteenth variation with the first spring, the second spring, the third spring, the at least one additional spring, the first movable stop, the second movable stop and the at least one additional stop being configured for preloading such that movement in one direction of one of the first tip and the second tip involves a first decrease in effective spring constant upon a first compression force or compression distance being reached and a second decrease in spring constant upon a second, larger, compression force or compression distance being reached and such that movement in the other direction of one of the first tip and the second tip involves a first decrease in effective spring constant upon a first compression force or compression distance being reached and a second decrease in spring constant upon a second, larger, compression force or compression distance being reached; (18) at least one of the first or second electrical connections being a spring-loaded temporary contact connection; (19) at least one of the first or second electrical connections being an adhered connection; (20) at least one of the first or second electrical connections being a bonded connection; (21) at least one of the first or second electrical connections being an attached connection; (22) both of the first and second electrical connections being spring-loaded temporary contact connections; (23) both of the first and second electrical connections being adhered connections; (24) both of the first and second electrical connections being bonded connections; (25) both of the first and second electrical connections being attached connections.

In a third aspect of the invention, a probe array for making electrical connections, including: (a) at least one first array frame structure; (b) at least one second array structure functioning in combination with the first array structure forming an assembly for holding the probes; (c) a plurality of probes with each inserted into an opening in the first array frame structure, wherein each of the plurality of probes includes a probe selected from the group consisting of: (1) the probe of aspect 1, and (2) the probe of aspect 2, wherein the first array structure, the at least one second array structure and the probes are configured to provide the probes in a lateral distribution pattern for making electrical connections to the first and second circuit elements.

In a fourth aspect of the invention, a probe array for making electrical connections, including: (a) at least one first array frame structure; (b) a plurality of probes with each inserted into an opening in the first array frame structure, wherein each of the plurality of probes includes a probe selected from the group consisting of: (1) the probe of aspect 1, and (2) the probe of aspect 2, wherein the first array structure and the probes are configured to provide the probes in a lateral distribution pattern for making electrical connections to the first and second circuit elements.

In a fifth aspect of the invention, a probe array making electrical connections, including: (a) at least one first array frame structure; (b) a plurality of first probes and second probes with each probe of the plurality of first probes connected directly or indirectly to a single side of the first array frame structure and the plurality of the second probes connected directly or indirectly to a second side of the first array frame, where the first and second sides are different, and wherein each of the probes includes a probe selected from the group consisting of: (1) the probe of aspect 1, and (2) the probe of aspect 2, wherein the first array structure and the probes are configured to provide the probes in a lateral distribution pattern for making electrical connections to the first and second circuit elements.

In a sixth aspect of the invention, a method for using a probe, including: (a) providing a probe selected from the group consisting of: (1) the probe of aspect 1, and (2) the probe of aspect 2; (b) pressing the first tip against the contact location on the first circuit element and relatively moving the first probe tip to a location in closer proximity to the second tip so as to locate the movable stop against a fixed stop and biasing the first spring with a first force; (c) pressing the second tip against the contact location on the second circuit element, which is different from the first circuit element, and relatively moving the second probe tip to a location in closer proximity to the first tip so as to bias the second spring under a biasing force that exceeds the first force such that prior to the biasing force exceeding the first force the rate of change of biasing force with distance in moving the second tip has a first value and after exceeding the first force the rate of change of biasing force with distance in moving the second tip has a second value that is less than the first value; (d) providing at least one electrical quantity between the first and second circuit elements via the probe wherein the at least one quantity is selected from the group consisting of: (1) electrical power, (2) an incoming digital electrical signal, (3) an outgoing digital electrical signal, (4) an incoming analog electrical signal, (5) an outgoing analog electrical signal, (6) an electrical current, and (7) an electrical potential.

In a seventh aspect of the invention, a method for using a probe, including: (a) providing a probe selected from the group consisting of: (1) the probe of aspect 1, and (2) the probe of aspect 2; (b) preloading the second spring between a first fixed stop and a second stop with a first biasing force; (c) pressing the first tip against the contact location on the first circuit element and relatively moving the first probe tip to a location in closer proximity to the second fixed stop so as to bias the second spring under a biasing force that exceeds the first force such that prior to the biasing force exceeding the first force, the rate of change of biasing force with distance in moving the first tip has a first value and after exceeding the first force, the rate of change of biasing force with distance in moving the first tip has a second value that is less than the first value; and (d) providing at least one electrical quantity between the first circuit element and a second circuit element via the probe wherein the at least one quantity is selected from the group consisting of: (1) electrical power, (2) an incoming digital electrical signal, (3) an outgoing digital electrical signal, (4) an incoming analog electrical signal, (5) an outgoing analog electrical signal, (6) an electrical current, and (7) an electrical potential.

In an eighth aspect of the invention, a method of using a probe, including: (a) providing a probe of aspect 2; (b) compressing the first and second probe tips toward one another according to a configuration and set of steps selected from the group consisting of: (i) Set 1—Configuration Steps (e.g., both fixed stops face up): (1) a first fixed stop is positioned in a region between the first movable stop and the second tip and provides a limit to the longitudinal movement of the first movable stop toward the second fixed stop, (2) a second fixed stop is positioned in a region between the second movable stop and the second tip and limits motion of the second movable stop away from the first fixed stop, (3) pressing the first tip against a contact location on the first circuit element and relatively moving the first probe tip to a location in closer proximity to the second tip so as to locate the second movable stop against the second fixed stop at a first biasing force (e.g. compressive or tensive) and then upon continued movement of the first tip bringing the first movable stop against the first fixed stop at a second biasing force (e.g. compressive or tensive) and then upon further first tip movement increasing the biasing force (e.g. compressive or tensive) on the first spring to a third biasing force; (4) pressing the second tip against a contact location on the second circuit element, which is different from the first circuit element and relatively moving the second probe tip to a location in closer proximity to the first tip so as to initially cause biasing (e.g. compressive or tensive) of the third spring but not further biasing of the second spring until a force (e.g. compressive or tensive) equal to the second biasing force is obtained and then continuing to move the second tip closer to the first tip under a reduced rate of change of force (e.g. spring constant due to the movement of the third spring and the second springs) until a force (e.g. compressive or tensive) equal to the third biasing force is obtained and then continuing to move the second tip closer to the first tip under a further reduced rate of change (e.g. further reduced effective spring constant due to continued movement of the third, second, and first springs); (ii) Set 2—Configuration and Steps (e.g., both fixed stops face inward): (1) a first fixed stop is positioned in a region between the first movable stop and the first tip and provides a limit to the longitudinal movement of the first movable stop away from the second fixed stop, (2) a second fixed stop is positioned in a region between the second movable stop and the second tip and limits motion of the second movable stop away from the first fixed stop, (3) the first and second stops are further positioned as necessary and the second spring is provided with a preloaded biasing force (e.g. a compressive or tensive biasing force created prior to contacting the first and second tips to the first and second circuit elements) equal to a first force which presses the first movable stop against the first fixed stop and presses the second movable stop against the second fixed stop; (4) pressing the first tip against a contact location on the first circuit element, and relatively moving the first probe tip to a location in closer proximity to the second tip so as to initially cause biasing (e.g. compressive or tensive) of the first spring but not further biasing of the second spring until a force (e.g. compressive or tensive) equal to the first biasing force is obtained and then continuing to move the first tip closer to the second tip under a reduced rate of change of force (e.g. effective spring constant due to the movement of the first spring and the second spring) until a second biasing force (e.g. compressive or tensive) is obtained; (5) pressing the second tip against a contact location on the second circuit element, which is different from the first circuit element and relatively moving the second probe tip to a location in closer proximity to the first tip so as to initially cause biasing (e.g. compressive or tensive) of the third spring but not further biasing of the second spring until a force (e.g. compressive or tensive) equal to the second biasing force is obtained and then continuing to move the second tip closer to the first tip under a reduced rate of change of force (e.g. effective spring constant due to the movement of the third spring and the second springs) until a force (e.g. compressive or tensive) equal to a third biasing force is obtained; (iii) Set 3: Configuration and Steps (both stops face outward): (1) a first fixed stop is positioned in a region between the first movable stop and the second movable stop and provides a limit to the longitudinal movement of the first movable stop toward the second fixed stop, (2) a second fixed stop is positioned in a region between the second movable stop and the first fixed stop and limits motion of the second movable stop toward the first fixed stop, (3) the first and second stops are further positioned as necessary relative to one another and the second spring is provided with a preloaded biasing force (e.g., a compressive or tensive biasing force created prior to contacting the first and second tips to the first and second circuit elements) equal to a first force which presses the first movable stop against the first fixed stop and presses the second movable stop against the second fixed stop; (4) pressing the first tip against a contact location on the first circuit element, and relatively moving the first probe tip to a location in closer proximity to the second tip so as to initially cause biasing (e.g. compressive or tensive) of the first spring but not further biasing of the second spring until a force (e.g. compressive or tensive) equal to the first biasing force is obtained and then continuing to move the first tip closer to the second tip under a reduced rate of change of force (e.g. effective spring constant due to the movement of the first spring and the second spring) until a second biasing force (e.g. compressive or tensive) is obtained; (5) pressing the second tip against a contact location on the second circuit element, which is different from the first circuit element and relatively moving the second probe tip to a location in closer proximity to the first tip so as to initially cause biasing (e.g. compressive or tensive) of the third spring but not further biasing of the second spring until a force (e.g. compressive or tensive) equal to the second biasing force is obtained and then continuing to move the second tip closer to the first tip under a reduced rate of change of force (e.g. effective spring constant due to the movement of the third spring and the second springs) until a force (e.g. compressive or tensive) equal to a third biasing force is obtained.

In a ninth aspect of the invention, a method for using a probe array for making electrical connections, including: (a) providing a probe array, selected from the group consisting of: (1) the array of aspect 3; and (2) the array of aspect 4; (b) pressing the first tips of the plurality of probes against respective contact locations on the first circuit element and relatively moving the first probe tips to a location in closer proximity to their respective second tips so as to locate their respective movable stops against respective fixed stops and biasing the first springs with respective first forces; (c) pressing the second tips against respective contact locations on the second circuit element, which is different from the first circuit element, and relatively moving the second probe tips to locations in closer proximity to the first tips so as to bias the second springs under biasing forces that exceed the first respective forces such that prior to the biasing forces exceeding the first forces, the rate of change of biasing forces with distance in moving the second tips have first values and after exceeding the first forces, the rate of change of biasing forces with distance in moving the second tips have second values that are less than the first values; (d) providing at least one electrical quantity between the first and second circuit elements via the plurality of probes wherein the at least one quantity is selected from the group consisting of: (1) electrical power, (2) an incoming digital electrical signal, (3) an outgoing digital electrical signal, (4) an incoming analog electrical signal, (5) an outgoing analog electrical signal, (6) an electrical current, and (7) an electrical potential.

In a tenth aspect of the invention, a method of using a probe array, including: (a) providing a probe array, including the features of Aspect 5; (b) compressing the first and second probe tips toward one another according to a configuration and set of steps selected from the group consisting of: (i) Set 1 (both fixed stops face up): (1) first fixed stops are positioned in regions between the first movable stops and the second tips and provide limits to the longitudinal movements of the first movable stops toward the second fixed stops, (2) second fixed stops are positioned in region between the second movable stops and the second tips and limit motions of the second movable stops away from the first fixed stops, (3) pressing the first tips against contact locations on the first circuit elements and relatively moving the first probe tips to locations in closer proximity to the second tips so as to locate the second movable stops against the second fixed stops at first biasing forces (e.g. compressive or tensive) and then upon continued movement of the first tips, bringing the first movable stops against the first fixed stops at second biasing forces (e.g. compressive or tensive) and then upon further first tip movements, increasing the biasing forces (e.g. compressive or tensive) on the first springs to third biasing forces; (4) pressing the second tips against contact locations on the second circuit elements, which are different from the first circuit elements and relatively moving the second probe tips to locations in closer proximity to the first tips so as to initially cause biasing (e.g. compressive or tensive) of the third springs but not further biasing of the second springs until forces (compressive or tensive) equal to the second biasing forces have been obtained and then continuing to move the second tips closer to the first tips under reduced rates of change of force (e.g. spring constant due to the movement of the third springs and the second springs) until forces (e.g. compressive or tensive) equal to the third biasing forces are obtained and then continuing to move the second tips closer to the first tips under further reduced rates of change (e.g. further reduced effective spring constants due to continued movements of the third, second, and first springs); (ii) Set 2 (both fixed stops face inward): (1) the first fixed stops are positioned in regions between the first movable stops and the first tips and provide limits to the longitudinal movement of the first movable stops away from the second fixed stops, (2) the second fixed stops are positioned in regions between the second movable stops and the second tips and limit motions of the second movable stops away from the first fixed stops, (3) the first and second stops are further positioned as necessary and the second springs are provided with preloaded biasing forces (e.g. compressive or tensive biasing forces created prior to contacting the first and second tips to the first and second circuit elements) equal to first forces which press the first movable stops against the first fixed stops and press the second movable stops against the second fixed stops; (4) pressing the first tips against contact locations on the first circuit elements, and relatively moving the first probe tips to locations in closer proximity to the second tips so as to initially cause biasing (e.g. compressive or tensive) of the first springs but not further biasing of the second springs until forces (e.g. compressive or tensive) equal to the first biasing forces are obtained and then continuing to move the first tips closer to the second tips under reduced rates of change of force (e.g. reduced effective spring constants due to the movements of the first springs and the second springs) until second biasing forces (e.g. compressive or tensive) are obtained; (5) pressing the second tips against contact locations on the second circuit elements, which are different from the first circuit elements and relatively moving the second probe tips to locations in closer proximity to the first tips so as to initially cause biasing (e.g. compressive or tensive) of the third springs but not further biasing of the second springs until forces (e.g. compressive or tensive) equal to the second biasing forces are obtained and then continuing to move the second tips closer to the first tips under reduced rates of change of force (e.g. reduced effective spring constants due to the movements of the third springs and the second springs) until forces (e.g. compressive or tensive) equal to third biasing forces are obtained; (iii) Set 3 (both stops face outward): (1) the first fixed stops are positioned in regions between the first movable stops and the second movable stops and provide limits to the longitudinal movements of the first movable stops toward the second fixed stops, (2) the second fixed stops are positioned in regions between the second movable stops and the first fixed stops and limit motions of the second movable stops toward the first fixed stops, (3) the first and second stops are further positioned as necessary relative to one another and the second springs are provided with preloaded biasing forces (e.g. a compressive or tensive biasing forces created prior to contacting the first and second tips to the first and second circuit elements) equal to first forces which press the first movable stops against the first fixed stops and press the second movable stops against the second fixed stops; (4) pressing the first tips against contact locations on the first circuit elements, and relatively moving the first probe tips to locations in closer proximity to the second tips so as to initially cause biasing (e.g. compressive or tensive) of the first springs but not further biasing of the second springs until forces (e.g. compressive or tensive) equal to the first biasing forces are obtained and then continuing to move the first tips closer to the second tips under reduced rates of change of force (e.g. reduced effective spring constants due to the movement of the first springs and the second springs) until second biasing forces (e.g.

compressive or tensive) are obtained; (5) pressing the second tips against contact locations on the second circuit elements, which is different from the first circuit elements and relatively moving the second probe tips to locations in closer proximity to the first tips so as to initially cause biasing (e.g. compressive or tensive) of the third springs but not further biasing of the second springs until forces (e.g. compressive or tensive) equal to the second biasing forces are obtained and then continuing to move the second tips closer to the first tips under reduced rates of change of force (e.g. reduced effective spring constants due to the movement of the third springs and the second springs) until forces (e.g. compressive or tensive) equal to third biasing forces are obtained; and (c) providing at least one electrical quantity between the first and second circuit elements via the plurality of probes wherein the at least one quantity is selected from the group consisting of: (1) electrical power, (2) an incoming digital electrical signal, (3) an outgoing digital electrical signal, (4) an incoming analog electrical signal, (5) an outgoing analog electrical signal, (6) an electrical current, and (7) an electrical potential.

In an eleventh aspect of the invention, a batch method of forming a plurality of multi-layer three-dimensional structures, including: (A) forming a plurality of successive multi-material layers with each successive multi-material layer adhered to a previously formed multi-material layer and with each successive multi-material layer including at least two materials, at least one of which is at least one structural material and at least one other of which is at least one sacrificial material, and wherein each successive multi-material layer defines a successive cross-section of the plurality of three-dimensional structures, and wherein the forming of each of the plurality of successive multi-material layers includes: (i) depositing at least a first of the at least two materials; (ii) depositing a second of the at least two materials; (iii) planarizing at least two of the at least two deposited materials, including planarizing at least one structural material and at least one sacrificial material; and (B) after the forming of the plurality of successive multi-material layers, removing at least a portion of the at least one sacrificial material from the at least one structural material to reveal the plurality of three-dimensional structures formed from the at least one structural material; wherein the plurality of structures includes a plurality of probes selected from the group consisting of: (1) aspect 1 and (2) aspect 2.

Numerous variations of the eleventh aspect of the invention are possible and include, for example: (1) each probe having a longitudinal axis extending from the first tip to the second tip and first and second substantially perpendicular (e.g. within an angle selected from the group consisting of 2°, 4°, 6°, 8°, and 10°) lateral axes that are also substantially perpendicular (e.g. within an angle selected from the group consisting of 2°, 4°, 6°, 8°, and 10°) to the longitudinal axes, wherein at least a portion of at least one of the first and second springs of the plurality of probes have configurations selected from the group consisting of: (a) a flat configuration that extends perpendicular to a first lateral axis and has a plurality of undulations extending in a plane parallel to the second lateral axis and the longitudinal axis, wherein the longitudinal axis and the second lateral axis are perpendicular to an axis of layer stacking; (b) a flat configuration that extends perpendicular to a first lateral axis and has a plurality of undulations extending in a plane that is substantially parallel (e.g. within an angle selected from the group consisting of 2°, 4°, 6°, 8°, and 10°) to the second lateral axis and the longitudinal axis, wherein the longitudinal axis is substantially parallel to a layer stacking axis; (c) spiral configuration having an axis that is substantially parallel to the longitudinal axis that extends in a direction substantially parallel to an axis of layer stacking; (d) spiral configuration having an axis that is substantially parallel to the longitudinal axis that extends in a direction substantially perpendicular to an axis of layer stacking; (2) the probe further including at least one sheath that extends over at least a portion of at least one of the first and second springs, wherein prior to the removing, the probe has a configuration selected from the group consisting of: (a) at least one of the first and second tips extends from the sheath by an excessive amount compared to an operational tip-to sheath range wherein the at least one tip is moved to within the operational range in a post-removing step; (b) both of the first and second tips extend from the sheath by an excessive amount compared to an operational tip-to sheath range wherein both tips are moved to within the operational range in a post-removing step; (c) at least one of the first and second tips extends from the sheath by an amount within an operational tip-to sheath range; (d) both of the first and second tips extend from the sheath by an amount within an operational tip-to sheath range; (e) the movable stop is not located within a working range of a fixed stop and is moved to within the working range of the fixed stop in a post removal step; and (f) the movable stop is located within a working range of a fixed stop; and (3) the plurality of probes being of aspect 2, and the probe having a configuration selected from the group consisting of: (a) the second movable stop is not located within a working range of a second fixed stop and is moved to within the working range of the second fixed stop in a post removal step; and (b) the second movable stop is located within a working range of a second fixed stop.

In a twelfth aspect of the invention, a method of forming a probe array, including: (A) forming a plurality of multi-layer probes, including: (i) forming a plurality of successive multi-material layers with each successive multi-material layer adhered to a previously formed multi-material layer and with each successive multi-material layer including at least two materials, at least one of which is at least one structural material and at least one other of which is at least one sacrificial material, and wherein each successive multi-material layer defines a successive cross-section of the plurality of three-dimensional structures, and wherein the forming of each of the plurality of successive multi-material layers includes: (a) depositing at least a first of the at least two materials; (b) depositing a second of the at least two materials; (c) planarizing at least two of the at least two deposited materials, including planarizing at least one structural material and at least one sacrificial material; and (ii) after the forming of the plurality of successive multi-material layers, removing at least a portion of the at least one sacrificial material from the at least one structural material to reveal the plurality of three-dimensional structures formed from the at least one structural material; wherein the plurality of structures includes a plurality of probes, wherein each of the plurality of probes includes a probe selected from the group consisting of: (1) the probe of aspect 1, and (2) the probe of aspect 2; (B) providing at least one first array frame structure; (C) providing at least one second array structure; (D) inserting the probes into openings in a structure selected from the group consisting of: (1) the at least one first array structure and thereafter joining the combined first array structure and plurality of probes with the at least one second array structure, (2) the at least one second array structure and thereafter joining the combined second array structure and plurality of probes with the at least one first array structure; and (3) a combination of the at least one first array structure and the at least one second array structure; and (E) preloading the probes with first biasing forces; wherein the at least one first array structure, the at least one second array structure, and the plurality of probes are configured to provide the probes in a lateral distribution pattern for connecting first circuit elements to second circuit elements.

Numerous variations of the twelfth aspect of the invention are possible and include, for example: (1) each probe having a longitudinal axis extending from the first tip to the second tip and first and second substantially perpendicular (e.g., within an angle selected from the group consisting of 2°, 4°, 6°, 8°, and 10°) lateral axes that are also substantially perpendicular (e.g. within an angle selected from the group consisting of 2°, 4°, 6°, 8°, and 10°) to the longitudinal axes, wherein at least a portion of at least one of the first and second springs of the plurality of probes have configurations selected from the group consisting of: (a) a flat configuration that extends perpendicular to a first lateral axis and has a plurality of undulations extending in a plane parallel to the second lateral axis and the longitudinal axis, wherein the longitudinal axis and the second lateral axis are perpendicular to an axis of layer stacking; (b) a flat configuration that extends perpendicular to a first lateral axis and has a plurality of undulations extending in a plane that is substantially parallel (e.g. within an angle selected from the group consisting of 2°, 4°, 6°, 8°, and 10°) to the second lateral axis and the longitudinal axis, wherein the longitudinal axis is substantially parallel to a layer stacking axis; (c) spiral configuration having an axis that is substantially parallel to the longitudinal axis that extends in a direction substantially parallel to an axis of layer stacking; (d) spiral configuration having an axis that is substantially parallel to the longitudinal axis that extends in a direction substantially perpendicular to an axis of layer stacking; (2) the probes including probes of Aspect 1, and wherein the probes further include at least one sheath that extends over at least a portion of at least one of the first and second springs of each probe, wherein prior to the removing, the probe has a configuration selected from the group consisting of: (a) at least one of the first and second tips extends from the sheath by an excessive amount compared to an operational tip-to sheath range wherein the at least one tip is moved to within the operational range in a post-removing step; (b) both of the first and second tips extend from the sheath by an excessive amount compared to an operational tip-to-sheath range wherein both tips are moved to within the operational range in a post-removing step; (c) at least one of the first and second tips extends from the sheath by an amount within an operational tip-to sheath range; (d) both of the first and second tips extend from the sheath by an amount within an operational tip-to sheath range; (e) the movable stop is not located within a working range of a fixed stop and is moved to within the working range of the fixed stop in a post removal step; and (f) the movable stop is located within a working range of a fixed stop; (3) prior to assembly of the plurality of probes with the at least one first array structure and the at least one second array structure, transitioning the probes from a build configuration to at least one of an assembly configuration and a working configuration; (4) during assembly of the plurality of probes into the at least one first array structure and the at least one second array structure, transitioning the probes to a working configuration; and (5) probes of Aspect 2 wherein the probe further includes at least one sheath that extends over at least a portion of at least one of the first, second, and third springs, wherein prior to the removing, the probe has a configuration selected from the group consisting of: (a) at least one of the first and second tips extends from the sheath by an excessive amount compared to an operational tip-to sheath range wherein the at least one tip is moved to within the operational range in a post-removing step; (b) both of the first and second tips extend from the sheath by an excessive amount compared to an operational tip-to-sheath range wherein both tips are moved to within the operational range in a post-removing step; (c) at least one of the first and second tips extends from the sheath by an amount within an operational tip-to-sheath range; (d) both of the first and second tips extend from the sheath by an amount within an operational tip-to-sheath range; (e) the first movable stop is not located within a working range of a first fixed stop and is moved to within the working range of the first fixed stop in a post removal step; and (f) the first moving stop is located within a working range of a first fixed stop; (g) the second movable stop is not located within a working range of a second fixed stop and is moved to within the working range of the second fixed stop in a post removal step; and (h) the second movable stop is located within a working range of a second fixed stop.

In a thirteenth aspect of the invention, a method of forming a probe array, including: (A) forming a plurality of multi-layer probes, including: (i) forming a plurality of successive multi-material layers with each successive multi-material layer adhered to a previously formed multi-material layer and with each successive multi-material layer including at least two materials, at least one of which is at least one structural material and at least one other of which is at least one sacrificial material, and wherein each successive multi-material layer defines a successive cross-section of the plurality of three-dimensional structures, and wherein the forming of each of the plurality of successive multi-material layers includes: (a) depositing at least a first of the at least two materials; (b) depositing a second of the at least two materials; (c) planarizing at least two of the at least two deposited materials, including planarizing at least one structural material and at least one sacrificial material; and (ii) after the forming of the plurality of successive multi-material layers, removing at least a portion of the at least one sacrificial material from the at least one structural material to reveal the plurality of three-dimensional structures formed from the at least one structural material; wherein the plurality of structures includes a plurality of probes, wherein each of the plurality of probes includes a probe selected from the group consisting of: (1) the probe of aspect 1, and (2) the probe of aspect 2; (B) providing at least one first array frame structure; (C) combining the probes directly or indirectly to the at least one first array structure; (D) preloading the probes with first biasing forces; wherein the at least one first array structure and the plurality of probes are configured to provide the probes in a lateral distribution pattern for connecting first circuit elements to second circuit elements.

In a fourteenth aspect of the invention, a method of forming a probe array, including: (A) forming a plurality of multi-layer probes, including: (i) forming a plurality of successive multi-material layers with each successive multi-material layer adhered to a previously formed multi-material layer and with each successive multi-material layer including at least two materials, at least one of which is at least one structural material and at least one other of which is at least one sacrificial material, and wherein each successive multi-material layer defines a successive cross-section of the plurality of three-dimensional structures, and wherein the forming of each of the plurality of successive multi-material layers includes: (a) depositing at least a first of the at least two materials; (b) depositing a second of the at least two materials; (c) planarizing at least two of the at least two deposited materials, including planarizing at least one structural material and at least one sacrificial material; and (ii) after the forming of the plurality of successive multi-material layers, removing at least a portion of the at least one sacrificial material from the at least one structural material to reveal the plurality of three-dimensional structures formed from the at least one structural material; wherein the plurality of structures includes a plurality of probes, wherein each of the plurality of probes includes a probe selected from the group consisting of: (1) the probe of Aspect 1, and (2) the probe of Aspect 2; (B) providing at least one first array frame structure; (C) connecting a plurality of first probes directly or indirectly to a single side of the first array frame structure and then connecting a plurality of second probes directly or indirectly to a second side of the first array frame, where the first and second sides are different, wherein the at least one first array structure and the plurality of first and second probes are configured to provide the probes in a lateral distribution pattern for connecting first circuit elements to second circuit elements.

Numerous variations of the first to fourteenth aspects of the invention are possible some of which have been presented above with regard to selected aspects. Many of these previously presented variations may be applied to the other aspects presented above with appropriate changes made.

Other aspects of the invention will be understood by those of skill in the art upon review of the teachings herein. Other aspects of the invention may involve combinations or sub combinations of the above noted aspects of the invention. These other aspects of the invention may provide various combinations of the aspects presented above as well as provide other configurations, structures, functional relationships, and fabrication processes, methods of use, or the like that have not been specifically set forth above but are taught by other teachings set forth herein, combinations of teachings set forth herein or by the teachings set forth herein as a whole (including teachings incorporated herein by reference).

BRIEF DESCRIPTION OF THE DRAWINGS

FIGS. 2F-1 and 2F-2 provide schematic representations of a probe that includes first and second springs with collapsible upper and lower movable stops that allow the probe to be formed with springs in uncompressed states build state (FIG. 2F-1) and then to be transitioned to initial biased states within a working range (FIG. 2F-2).

FIGS. 2G-1 and 2G-2 provide schematic representations of a probe similar to that of FIGS. 2F-1 and 2F-2 with the exception that the upper and lower fixed stops have tapered configurations that potentially provide for enhanced retention and/or centering of the upper and lower movable stops after transitioning from the as-built probe configuration (FIG. 2G-1) to a working configuration (FIG. 2G-2).

FIGS. 2H-A to 2H-D provide schematic illustrations of the probe of FIG. 2A in four different operational states to show how the probe may be used in to achieve an increase in compliance (e.g., a decrease in spring constant) upon increased compression beyond a set point.

FIG. 2H-E provides a plot of force versus increasing compression associated with the transitions between the states illustrated in FIGS. 2H-A to 2H-D.

FIGS. 2I-1 to 2I-4 illustrate the longitudinal cross-sectional views of a probe at different stages of operation (similar to those of FIGS. 2H-A to 2H-D) where the probe includes a sheath with a building fixed stop.

FIGS. 2J-1 to 2J-3 provide side cut views of a probe with a movable stop located at three different positions: (1) at a building position (FIG. 2J-1), (2) at a lower end of a working range of motion (FIG. 2J-2, and (3) at an upper end of working range of motion (FIG. 2J-3).

FIGS. 3A-3B provide two different versions of probes according to a second group of embodiments where the probes include first and second extension springs with the second being stiffer than the first and with the springs being separated by a movable stop.

FIGS. 3C-1 to 3C-4 provide another version of a probe according the second group of embodiments where the probe is shown in four different operational states.

FIGS. 4C-1A to 4C-4B provide two more versions of probes according to the third group of embodiments where each probe is shown in four different operational states.

FIGS. 5C-1A to 5C-4B provide two more versions of probes according to the fourth group of embodiments where each probe is shown in four different operational states.

FIGS. 6D-1 to 6D-6 provide various views of a detailed version of a probe according to the fifth group of embodiments where detailed version provides a specific implementation of the schematic version of FIG. 6C.

FIGS. 7B-1 to 7B-4 provides various views of a detailed version of a probe according to the sixth group of embodiments where detailed version provides a specific implementation of the schematic version of FIG. 6A.

FIGS. 12E, 12F-1, and 12F-2 provide schematic representations of various ways methods for assembling the probes of FIGS. 12C and 12D into array structures.

FIGS. 14A-14B provide before and after images of a three-spring probe according to a fourth alternative of the tenth group of embodiments of the invention where the probe is initially formed in an unbiased state and then is biased using a laterally movable clamping structure.

FIGS. 15A-15B provide before and after images of a three-spring probe according to a fifth alternative of the tenth group of embodiments of the invention where the probe is initially formed in an unbiased state and then is biased using a longitudinally movable clamping structure.

FIGS. 17A, 17B-Option 1, 17B-Option 2, 17C-Option 1, and 17C-Option 2 provide two variations for incorporating probes with a single movable stop with an array structure according to a seventh alternative of the tenth group of embodiments of the invention.

FIGS. 28-1 to 28-8 provide schematic illustrations of eight potential two-spring, one-stop probe embodiments of the invention laid out according to various example combinations of two spring biasing methods (compression and tension) and two fixed stop configurations (up-facing and down-facing).

FIGS. 29-1 to 29-32 provide schematic illustrations of 32 potential three-spring, two-stop, two-tip probe embodiments of the invention laud out according to the various example combinations of three spring biasing methods (compression and tension) and two fixed stop configurations (up-facing and down-facing).

FIGS. 30-1 to 30-8 provide various schematic illustrations of one contact tip probes using two springs where the spring is sandwiched functionally by the movable stop and the fixed stop is pre-biased or preloaded so that when the contact tip is pressed against a pad or bump of a DUT or other electronic circuit element the compliance can undergo an increase once a contact force exceeds an initial loading force that presses the movable stop against its fixed stop.

DETAILED DESCRIPTION OF PREFERRED EMBODIMENTS

Electrochemical Fabrication in General

Figure 1A:
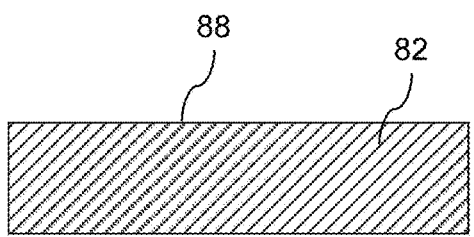
FIGS. 1A-1F schematically depict the formation of a first layer of a structure using adhered mask plating where the blanket deposition of a second material overlays both the openings between deposition locations of a first material and the first material itself.
Figure 1B:
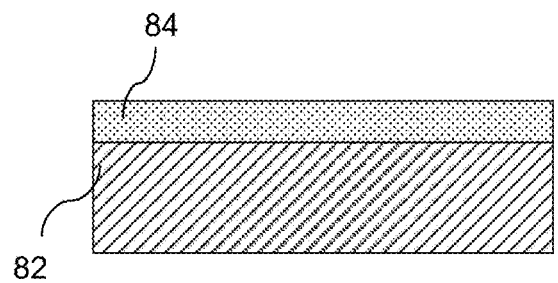
Figure 1C:
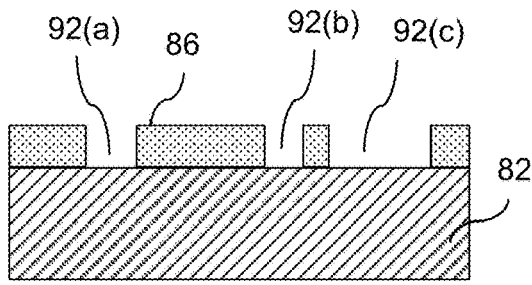
Figure 1D:
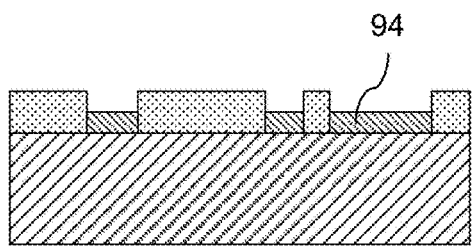
Figure 1E:
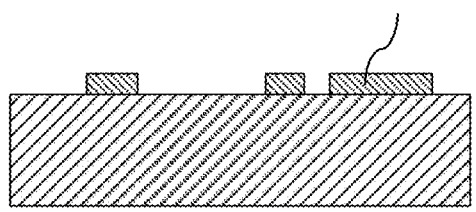
Figure 1F:
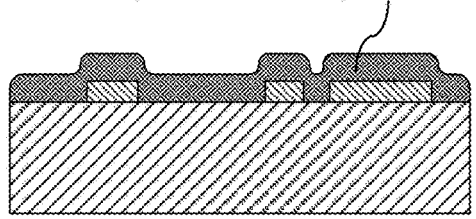
Figure 1G:
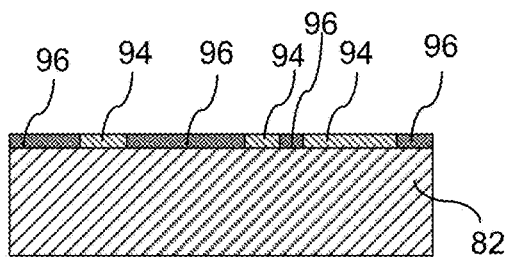
FIG. 1G depicts the completion of formation of the first layer resulting from planarizing the deposited materials to a desired level.
Figure 1H:
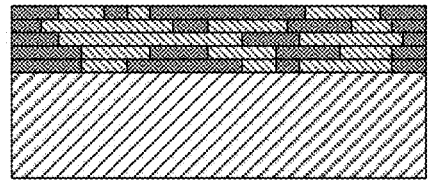
FIGS. 1H and 1I respectively depict the state of the process after formation of the multiple layers of the structure and after release of the structure from the sacrificial material.
Figure 1I:
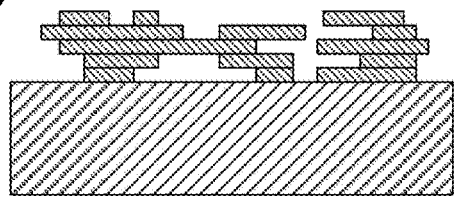
Figures 1, 29:
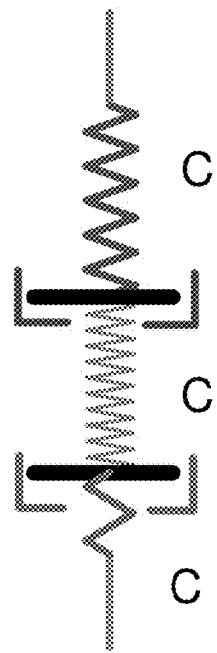
Figures 2, 29:
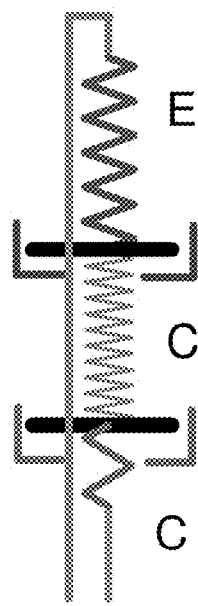
Figures 3, 29:
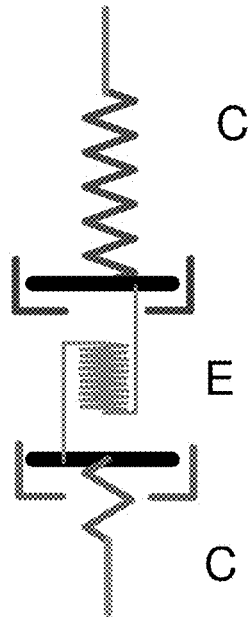
Figures 4, 29:
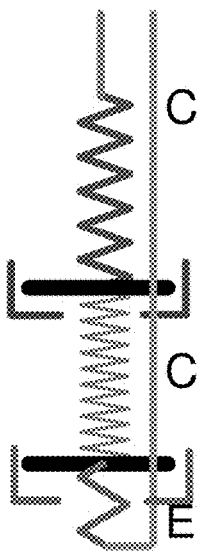
Figures 5, 29:
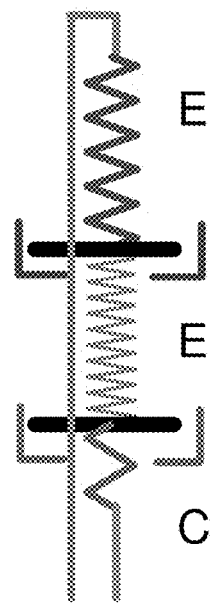
Figures 6, 29:
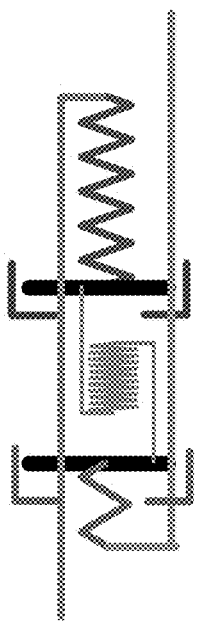
Figures 7, 29:
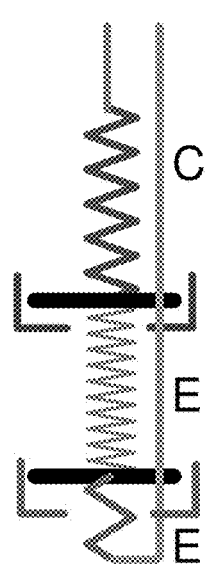
Figures 8, 29:
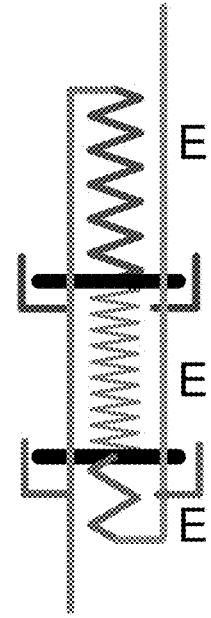
Figures 9, 29:
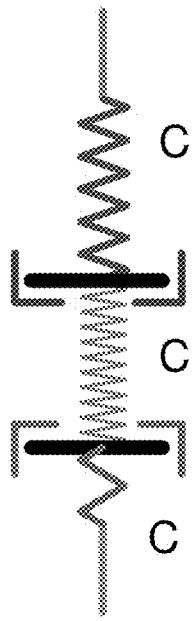
Figures 10, 29:
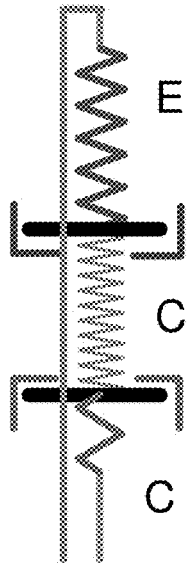
Figures 11, 29:
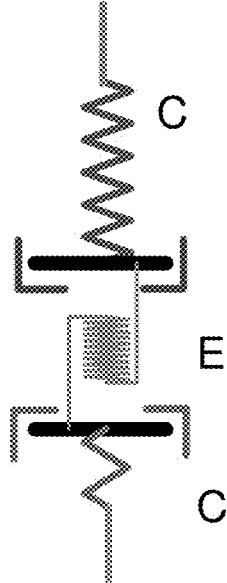
Figures 12, 29:
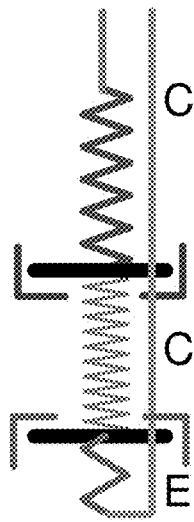
Figures 13, 29:
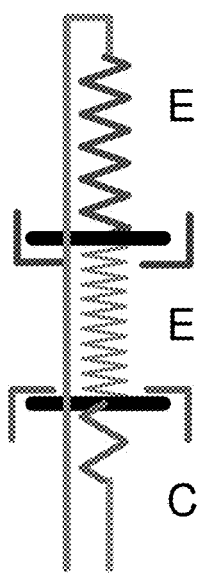

FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 82 having a surface 88 is shown, onto which patternable photoresist 84 is deposited, spread, or cast as shown in FIG. 1B. In FIG. 10, a pattern of resist is shown that results from the curing, exposing, and developing of the resist. The patterning of the photoresist 84 results in openings or apertures 92(*a*) -92(*c*) extending from a surface 86 of the photoresist through the thickness of the photoresist to surface 88 of the substrate 82. In FIG. 1D, a metal 94 (e.g., nickel) is shown as having been electroplated into the openings 92(*a*)-92(*c*). In FIG. 1E, the photoresist has been removed (i.e., chemically, or otherwise stripped) from the substrate to expose regions of the substrate 82 which are not covered with the first metal 94. In FIG. 1F, a second metal 96 (e.g., silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 98 (e.g., component or device) or multiple such structures.

In some variations, the structure may be separated from the substrate. For example, release of the structure (or multiple structures if formed in a batch process) from the substrate may occur when releasing the structure from the sacrificial material particularly when a layer of sacrificial material is positioned between the first layer of the structure and the substrate. Alternative methods may involve, for example, the use of a dissolvable substrate that may be separated before, during or after removal of the sacrificial material, machining off the substrate before or after removal of the sacrificial material, or use of a different intermediate material that can be dissolved, melted or otherwise used to separate the structure(s) from the substrate before, during, or after removal of the sacrificial material that surround the structure(s).

Various embodiments of various aspects of the invention are directed to formation of three-dimensional structures from materials, some, or all, of which may be electrodeposited or electroless deposited (as illustrated in FIGS. 1A-1I and as discussed in various patents and patent applications incorporated herein by reference). Some of these structures may be formed from a single build level (e.g. a planarized layer) that is formed from one or more deposited materials while others are formed from a plurality of build levels, each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used, while in still other embodiments, layer thickness may be varied during formation of different levels of the same structure. In some embodiments, microscale structures have lateral features positioned with 0.1-10 micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.1-50 millimeter range, or larger, and features positioned with a precision in the micron to 100 micron range and with minimum feature sizes on the order of several microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), adhered masks and masking operations (masks and operations that use masks that are adhered to a substrate onto which selective deposition or etching is to occur as opposed to only being contacted to it), and/or selective patterned deposition of materials (e.g. via extrusion, jetting, or controlled electrodeposition) as opposed to masked patterned deposition. Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial for the layer or may be used only as a masking material which is replaced by another material (e.g., dielectric or conductive material prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e. destroyed or damaged during separation of deposited materials to the extent they cannot be reused) or non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., by replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

Probe Embodiments

Probes of the various embodiments of the invention can take on a variety of forms. Each probe includes multiple spring elements with at least two springs configured to operate functionally in series with a movable intermediate stop located functionally between the at least two springs where the movable stop can directly or indirectly engage a fixed stop (which may or may not be part of an individual probe) to hinder further motion in a one direction while still allowing motion in the opposite direction under appropriate application of force to one or both of the springs. In usage the springs, the at least one movable stop, and at least one fixed stop can be used to change the compliance on at least one probe tip from a lower value to a higher value upon increased force and movement of the tip so that a given compression of the spring system causes a smaller increase in force per unit of movement of the tip relative to what occurred upon initial displacement of the probe tip. In some embodiments, probe deformation is limited to a compression along the axis of the probe (e.g., substantially longitudinal compression as the tips move to more proximal positions).

Numerous variations of the probe embodiments are possible, including for example: (1) use, or inclusion, of only compression springs or spring segments; (2) use, or inclusion, of only extension springs or spring segments; (3) use, or inclusion, of a combination of compression springs and extension springs; (4) use, or inclusion, of a single spring on either side of a movable stop; (5) use, or inclusion, of multi-segment springs as a single effective spring on either side of a movable stop; (6) use, or inclusion, of multi-segment springs including springs in series with interconnecting bars, plates, or the like as necessary; (7) use, or inclusion, of multi-segment springs including springs in parallel with interconnecting bars, plates, or the like as necessary; (8) use, or inclusion, of multi-segment springs grouped in a combination of parallel and series connections with interconnecting bars, plates, or the like as necessary; (9) use, or inclusion, of individual springs having substantially linear behavior (e.g. $F=K*\Delta x$) or having non-linear behaviors; (10) use, or inclusion, of individual springs having common or different spring constants; (11) use, or inclusion, of springs or spring segments that are flat; (12) use, or inclusion, of springs that lay in the same plane one beside the other; (13) use, or inclusion, of springs or spring segments that lay in different parallel but offset planes (e.g. each formed within a single layer or from a series of adjacent layers) with connection elements extending from one spring segment to another through one or more intermediate layers; (14) use, or inclusion, of individual probes that include a fixed stop, or more than one fixed stop, which interact with one or more movable stops; (15) use, or inclusion, of individual probes that are configured to interact with a fixed stop that is part of an array mounting structure or array assembly which can engage the movable stop or stops once probes are loaded or final assembly is completed; (16) use, or inclusion, of individual probes that include two fixed stops that are used to bias one spring of two or more springs such that the one spring is pre-biased by both movable stops being on the inside (spring side) of their respective fixed stops for a spring that is compressed or both being on the outside of their respective stops for a spring that is operated as an extension spring (i.e. biased in an extended state); (17) use, or inclusion, of individual probes that include three springs, or more, and two or more movable stops that contact fixed stops when their respective springs are made to compress or extend in the same direction such that a multi-stage increase in compliance occurs as each moveable stop moves away from its fixed stop; (18) use, or inclusion, of multiple springs or spring segments that are connected via flat, T-shaped, angled, or other bar or plate configurations that run between the springs or spring segments on a single layer or via one or more intermediate layers that separate at least one spring or spring segment from another spring or spring segment; (19) use, or inclusion, of guide elements (e.g. sheaths, rails, fixed or movable plates, or the like) that are provided to ensure that compression springs do not bulge laterally during compression in an excessive manner (e.g. where unintended contact or interference with an adjacent spring or spring segment or with a neighboring probe could occur); (20) use, or inclusion, of probe tips that have a form selected from the group consisting of: (1) flat surfaces, (2) knife edge or blade-like structures, (3) multi-contact crown-like configurations, (4) single point contacts, and (5) single or multiple curved contact structures; (21) use, or inclusion, of tips that include the same material as the springs; (22) use, or inclusion, of tips that include a different material from that forming part of a spring, (23) use, or inclusion, of current that flows form one probe tip to another probe tip via one or more spring elements; (24) use, or inclusion, of tips, tip extensions, springs, connection bars, sheaths, and/or the like that provide movable or non-movable (e.g., sliding) contacts between element of a single probe to shunt part, most, or all of the current around spring elements; (25) use, or inclusion, of probes that incorporate dielectric elements to provide individual probes with isolated conductive regions (e.g., for coaxial or other multi-path probe structures) or to ensure electrically isolation of some probes from other probes; (26) use, or inclusion, of probes that are selectively electrically or dielectrically connected to guide plates or electrically or dielectrically connected to other structures to provide desired lateral or longitudinally spacing, alternate current flow paths, and/or to provide electrical shielding; (27) use, or inclusion, of probe end regions or intermediate probe regions that include sliding components or surfaces through which probe shaft elements slide as shunting contact surfaces; (28) use, or inclusion, of probe end regions or intermediate regions that engage sliding components or surfaces of array or mounting structures against which probe shaft elements slide as shunting contact surfaces; (29) use, or inclusion, of probes that are formed using multi-layer, multi-material electrochemical fabrication methods in whole or in part; (30) use, or inclusion, of probes that are formed with separated components or as partly connected or aligned components that need at least some assembly after formation of components; (31) use, or inclusion, of probes that are formed in their entirety with all components formed together where their build configurations are similar to their working configurations with possible exceptions of additional biasing existing during use; (32) use, or inclusion, of probes that are formed with all components together but in build configurations that are different from working configurations such that assembly is not required but where movement of components from one configuration to another is required prior to use (e.g., relocation of components, compression or expansion of spring elements, snapping together of separated but aligned component features, sliding together or interlocking components, and the like); or (33) use, or inclusion, of probes that include stop features that do not engage movable stops upon probe formation but instead are made to engage movable stops upon compression or extension of their respective springs, or probes tips, by longitudinal sliding of engagement elements, lateral movement of engagement elements, rotational movement of engagement elements, or the like, where engagement may occur automatically upon initial spring movement, tip movement, or may be made to occur independently of spring or probe tip movement.

Numerous other variations are possible some of which are explicitly or implicitly set forth herein while others will be apparent to those of skill in the art after review of the teachings herein.

First Group of Embodiments: Probe with Two Compression Springs and at Least One Intermediate Stop In addition to having two compression spring and an intermediate movable stop, probes of the first embodiment may take on a variety of different forms and different functionalities. Such implementations, alternatives, or variations may include for example, one or more of: (1) the springs having different lengths, (2) the springs having different biasing rates (e.g. spring constants), (3) the springs having the same biasing rate, (4) the springs having reversed biasing rates such that of the top spring has a higher biasing rate than that of the bottom spring, (5) the springs having different compressible structures or patterns that allow a particular amount of compression without exceeding elastic distortion limits of the material and their structural configuration (e.g. rectangular wave shaped spring elements, rectangular spring elements connected by standoffs, sine wave shaped spring elements, S-shaped spring elements, C-shaped spring elements, planar spring elements, non-planar spring elements, helical shaped spring elements, helical spring elements with inward or outward spirals, and the like), (6) the fixed stop being part of the probe, (7) the fixed stop being part of an assembly structure the probe is fitted into, (8) probes tips having the same or different configurations such as those that might be useful for a flat pad, useful for engaging a solder bump, or useful for scratching through an oxide barrier covering a contact surface, (9) probe tips may be formed of different materials than that of the spring or elements, (10) probe tips may be formed of different materials than that of the stop elements, (11) probes may include regions that provide for shunting contact between tips, stops, or springs and framing, sheath, or assembly structures, (12) probe may include regions of contact dielectric materials for inhibiting electrical connections between probe elements or between a probe element and another structure, (13) probes may include bonding materials or bonding enhancement materials that aid in attaching probe elements to one another or enable attachment of probe elements to other structures, (14) individual springs may be made up of multiple spring segments that are connected by standoffs, spacers, bars, and the like to provide configurations that are serial, parallel, or a combination thereof, where the individual segments are spaced from one another but are located side-by-side, flat-surface-to-flat surface, or end-to-end, and (15) spring segments may operate in compression or extensions modes. In some variations, one of the probe tips may be replaced with a fixed stop feature or may be bonded to another structure so as to function as a permanent or semi-permanent connection. In still other variations, the springs may have longitudinal lengths (e.g. tip-to-tip) appropriate for a selected application, e.g. 1 mm or less to 10 mm or more, the probes may have perpendicular lateral dimensions that are approximately the same or of different sizes, e.g. from about 1-to-1 to about 10-to-1 or more, lateral dimensions of the probe may allow arrays to be formed with pitches (probe-to-probe center spacings) as small as 50 ums or smaller and as large as 1 mm or larger with probe lateral dimensions ranging from tens of microns or smaller to hundreds of microns or larger, flat springs may have segment thicknesses as small as 10 microns or smaller or as large as 100 microns or larger, segment widths as small as 30 microns or smaller and as large as 200 microns or larger, and segments lengths as short as 100 microns or smaller and as large as 2 mm or larger. Other variations may provide the probe with structural elements such as frames, guides, sheaths, and assembly engagement features that allow for spring protection, limit unintended spring movement or deflection, provide for controlled spring compression, provide for probe-to-probe spacing, retention of elements within working range or biasing range requirements. Other variations are possible and may include features associated with other embodiments or variations or those features explicitly discussed elsewhere herein, implicit from the teachings provided herein, or ascertainable by those of skill in the art after review of the teachings herein.

During probe use, a combination of structural configuration, probe materials, and operational parameters for a probe are generally selected to provide the probe with long elastic operational life. Thus, in general it is preferred that stress of probe element be maintained below yield strength limits of the materials and even substantially below those limits, e.g. at below 80% of yield strength, or even below 50%, or even below 30%.

First Group of Embodiments—Alternative 1: Probe with Two Different Springs

Figure 2A:
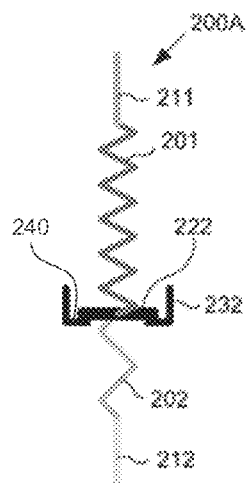
FIG. 2A provides a schematic representation of a probe according to a first group embodiments of the invention and more particularly to a first variation or alternative in that first group of embodiments where the probe includes first and second compression springs functionally separated by a movable stop and having different spring constants.

FIG. 2A provides a schematic representation of a probe 200A according to a first group embodiments of the invention and more particularly to a first variation or alternative in that first group of embodiments where the probe includes a first (upper) compression spring 201 and a second (lower) compression spring 202 that is substantially aligned with the first spring where the second spring is stiffer (e.g. has a larger spring constant and as such has a lower compliance) than that of the first spring, and where the springs are functionally separated by a movable stop 222 made to move longitudinally with the compression of the springs, wherein upon initial loading of the first spring tip 211 against a non-DUT electrical contact (not shown) the movable stop is made to contact a surface 240 of a fixed stop 232 with additional biasing of the first spring no longer moving the movable stop 222 but increasing compression force on the first spring to a first level, then upon the second spring tip being contacted to a DUT (not shown) and further movement causing the second spring to compress until a force reaches the first level after which both springs compress (moving the movable stop away from the fixed stop) with a corresponding decrease in biasing force change with movement (e.g. the effective spring constant reduces from that of the second spring alone to that resulting from a combination of the serial compression of both the first and second springs).

Figure 2B:
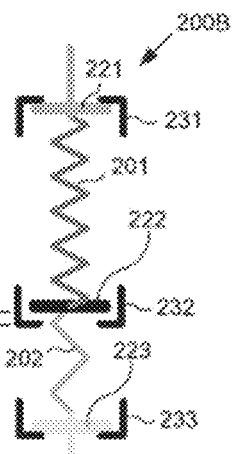
FIG. 2B provides a schematic representation of a probe similar to that of FIG. 2A with the exception that the probe additionally includes upper and lower movable stops.

First Group of Embodiments—Alternative 2: Probe with Two Compression Springs; Three Movable Stops with the Top and Bottom Stops Providing for an Initial Offset Biasing of an Intermediate Stop FIG. 2B provides a schematic representation of a probe 200B similar to that of FIG. 2A with the exception that the probe additionally includes an upper movable stop 221 that engages an upper fixed stop or stop seat 231 (that may or may not be part of the probe) and a lower movable stop 223 that engages a lower fixed stop seat 233 (that may or may not be part of the probe) that are respectively used to limit the outward motion of a first tip associated directly or indirectly with deflection of the first spring 201 and a second tip associated with the second spring 202, respectively, where these stops may provide for an initial biasing of one or both of the first and second springs (prior to tips contacting circuit elements) and wherein the biasing may result in the intermediate movable stop 222 being positioned away (as shown by 241) from the intermediate fixed stop 232 (that may or may not be part of the probe) prior to application of a force to the contact tip associated with the first spring.

Figure 2C:
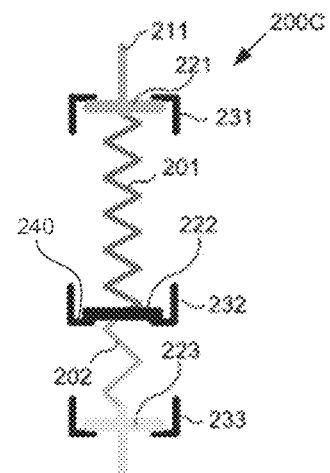
FIG. 2C provides a schematic representation of a probe similar to that of FIG. 2B with the exception that the biasing of the first springs results in the intermediate movable stop being initially positioned against an intermediate fixed stop.

First Group of Embodiments—Alternative 3: Probe with Two Different Compression Springs; Three Movable Stops, and a Biased but Non-Offset Intermediate Stop FIG. 2C provides a schematic representation of a probe 200C similar to that of FIG. 2B with the exception that the biasing of the first spring and possibly the biasing of the second spring results in the intermediate movable stop 222 being initially positioned against the intermediate stop seat 232 (e.g. prior to any external force being applied to the tip associated with the first or second spring).

Figure 2D:
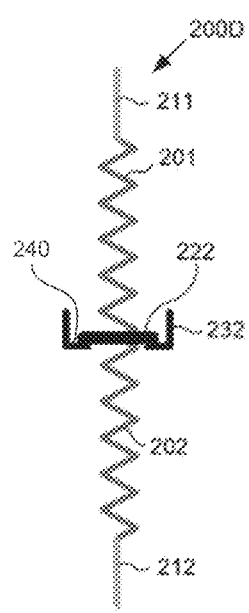
FIG. 2D provides a schematic representation of a probe similar to that of FIG. 2A with the exception that the first and second springs have the same spring constant.

First Group of Embodiments—Alternative 4: Probe with Two Similar Compression Springs and a Single Intermediate Stop FIG. 2D provides a schematic representation of a probe 200D similar to that of FIG. 2A with the exception that the first and second springs have the same spring constant and potentially the same unbiased (or uncompressed) length.

First Group of Embodiments—Alternative 5: Probe with Two Similar Compression Springs, Top and Bottom Stops, and a Biased but Non-Offset Intermediate Stop FIG. 2E-1 provides a schematic representation of a probe 200E similar to that of a combination of FIG. 2A and FIG. 2B where the first and second springs have the same spring constant and also where springs are constrained by upper and lower fixed and movable stops such that an initial biasing of one or both springs can occur prior to applying forces to the tips associated with either of the first or second springs and where the initial biasing caused by stops 221, 231, 223, and 233 hold the intermediate movable stop 222 against the intermediate fixed stop 232.

Figures 1, 2E:
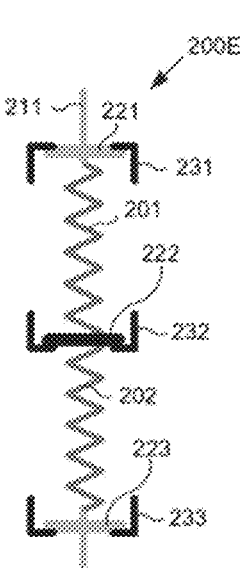
FIGS. 2E-1 and 2E-2 provide a schematic representation of a probe similar to a combination of the probes of FIGS. 2A and 2B where the first and second springs have the same spring constant and where springs are constrained by upper and lower fixed and movable stops with two different, non-zero, pre-biasing levels are shown.
Figures 2, 2E:
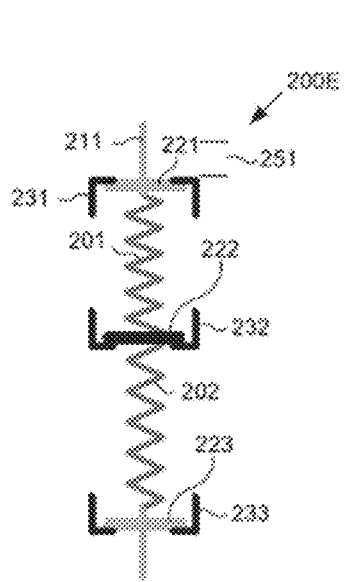

FIG. 2E-2 provides a schematic representation of probe 200E similar to that of FIG. 2E-1 with the exception that the first spring is compressed more than the second spring by further preliminary biasing, or compression, that establishes a first biasing force of movable stop 222 against fixed stop 232 that is created by compression of the upper spring by positioning of the upper fixed stop 231 and its movable stop 221.

Figures 1, 2F:
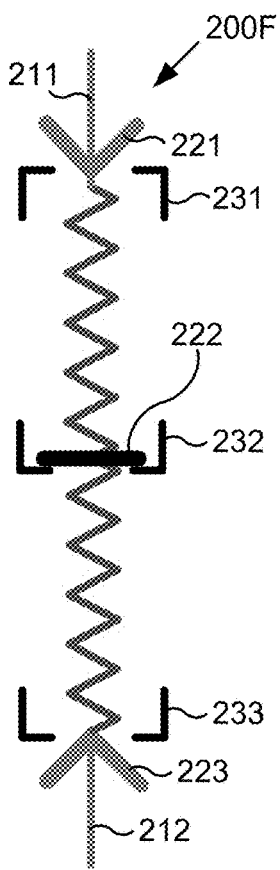
Figures 2, 2F:
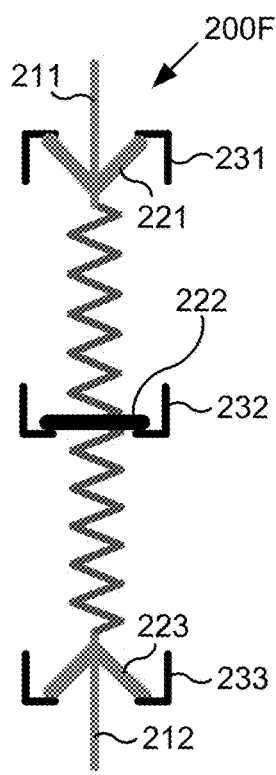

First Group of Embodiments—Alternative 6: Probe with Top and Bottom Compliant Movable Stops that May be Moved Past Fixed Stops in the Process of Setting an Initial Biasing Configuration for the Springs of the Probe that is Different from an as-Built Configuration FIGS. 2F-1 and 2F-2 provide schematic representations of a probe 200F which includes first and second springs with collapsible upper and lower movable stops 221 and 223, respectively, that allow the probe to be formed with springs in uncompressed states with the movable stops beyond their respective fixed stops 231 and 233 (FIG. 2F-1—Build State) and then to have the springs compressed to allow the movable stops to slide past the fixed stops so as to constrain the springs to initial biased states within a working range (FIG. 2F-2—Working State) where, as illustrated in this example, the biasing provides for the movable intermediate stop 222 to be initially located against the fixed intermediate stop (the intermediate movable stop may be in a different configuration relative to its fixed stop in other embodiments).

Figures 1, 2G:
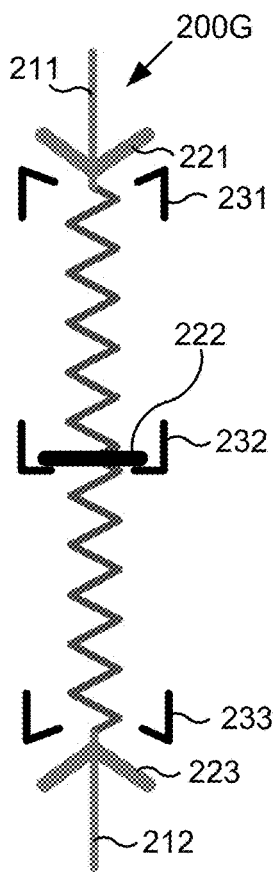
Figures 2, 2G:
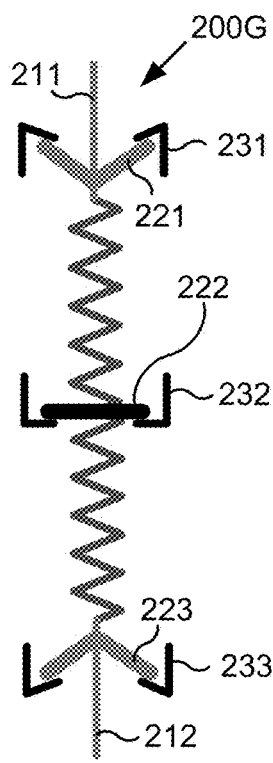

First Group of Embodiments—Alternative 7: Probe with Top and Bottom Compliant Movable Stops that May be Moved Past Fixed Stops with Enhanced Shapes that Allow for Enhanced Centering of Probe Tips in the Process of Setting an Initial Biased Probe Configuration FIGS. 2G-1 and 2G-2 provide schematic representations of a probe 200G similar to that of FIGS. 2F-1 and 2F-2 with the exception that the upper and lower fixed stops 231 and 233 have tapered configurations that potentially provide for enhanced retention and/or centering of the upper and lower movable stops 221 and 223 relative to their fixed stops after transitioning the as-built probe configuration (FIG. 2G-1) to a working configuration (FIG. 2G-2). In some alternative configurations the intermediate fixed stop 232 and the intermediate movable stop 222 may take on tapered, or aligning, configurations as well, while in other embodiments, only a portion of movable and fixed stops may take on such configurations or take on other shapes or configurations that aid in transitioning from one state to another or to aid in alignment after such transitions.

First Group of Embodiments—Operational Example 1 Illustrating Compliance Change FIGS. 2H-A to 2H-D provide schematic illustrations of the probe 200A of FIG. 2A in four different operational states to show how the probe may be used in practice (though typically used in an array of probes only one probe is shown for clarity) to achieve an increase in compliance (e.g. a decrease in spring constant) upon increased compression beyond a set point where the following states are illustrated:
  A. The movable spring stop separating Spring 1 from Spring 2 is located against the fixed spring stop with neither spring having an initial bias (FIG. 2H-A);
  B. Spring 1 (201) is compressed by an amount ΔX1 by pressing the tip of arm 211 against a PCB, probe card components, or tester components achieving a force of $F_1=K_x*\Delta X1$ (FIG. 2H-B);
  C. Spring 2 is compressed by an amount ΔY1 by pressing the tip of arm 212 against a DUT or other surface to be probed to achieve a force of $G1=K_y*\Delta Y1$ until G1=F1 (since $K_y>K_x$, $\Delta X_1>\Delta Y_1$ at G1=F1) and the movable intermediate spring stop is on the verge of moving away from the intermediate fixed stop but has not yet moved (FIG. 2H-C); and
  D. Spring tips contacting the PCB and DUT are moved closer together, compressing both springs 1 and 2 such that compression occurs under an effective spring constant Keq=Kx*Ky/(Kx+Ky) (FIG. 2H-D).

FIG. 2H-E provides a plot of force versus increasing compression of the probe of FIGS. 2H-A to 2H-D as it transitions between states beginning with the transition from the state of FIG. 2H-A to 2H-B (State A to State B) where movement of Tip 1 causes Spring 1 to undergo initial biasing or preloading to a force $F_1$, then from the state of FIG. 2H-B to the state of FIG. 2H-C(State B to State C) where movement of Tip 1 causes spring 2 to increase in compression from a zero load to a force equal to $F_1$ with a spring constant of $K_y$, and then from the state of FIG. 2H-C to that of FIG. 2H-D (State C to State D) where further movement of Tip 2 leads to compression of both Spring 1 and Spring 2 from a force $F_1$ to a final loading force of $F_2$ with an equivalent spring constant equal to that of the serial combination of $K_x$ and $K_y$.

First Group of Embodiments—Alternative 8 with an Operational Example

Figures 1, 2I:
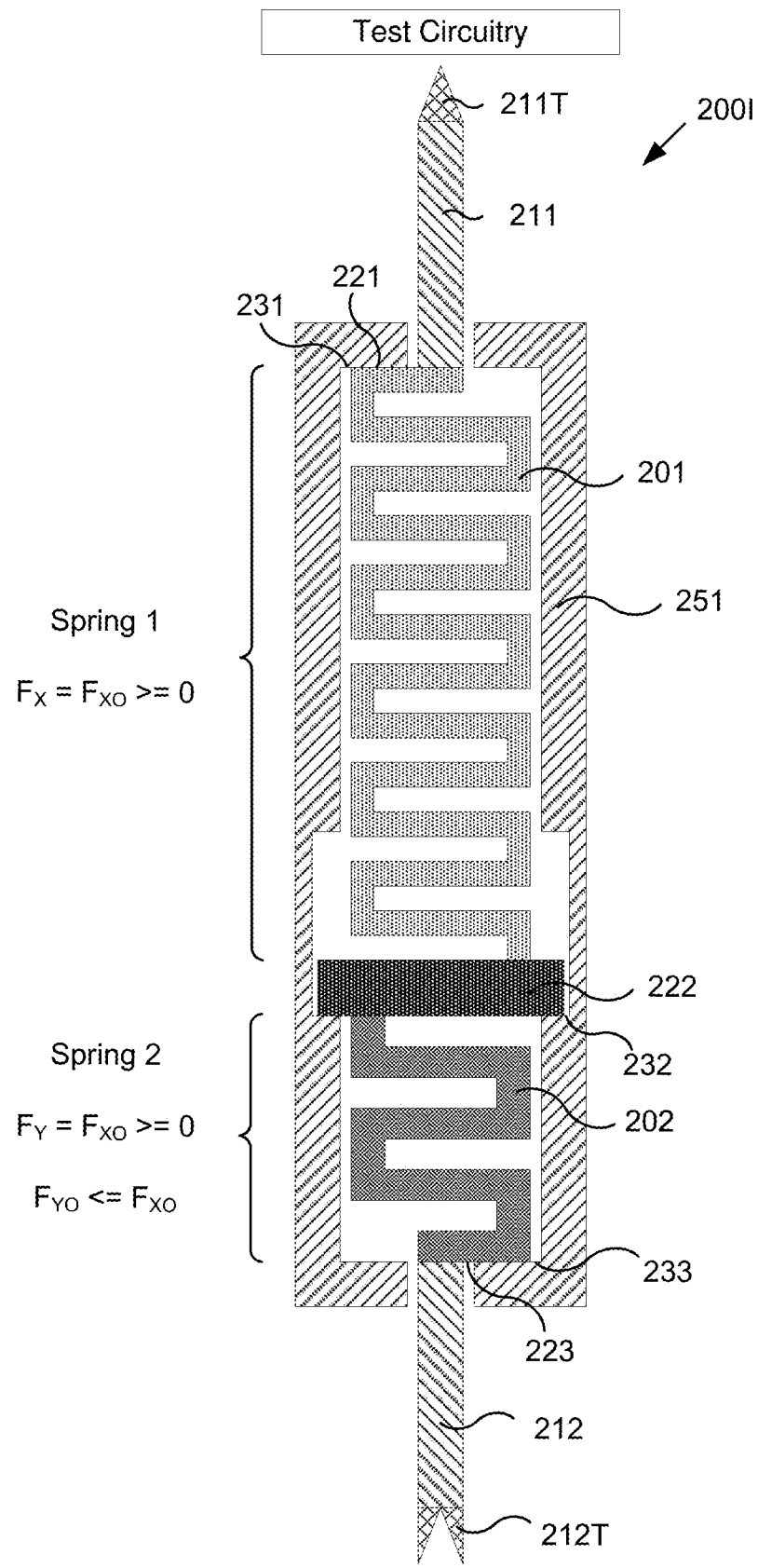
Figures 2, 2I:
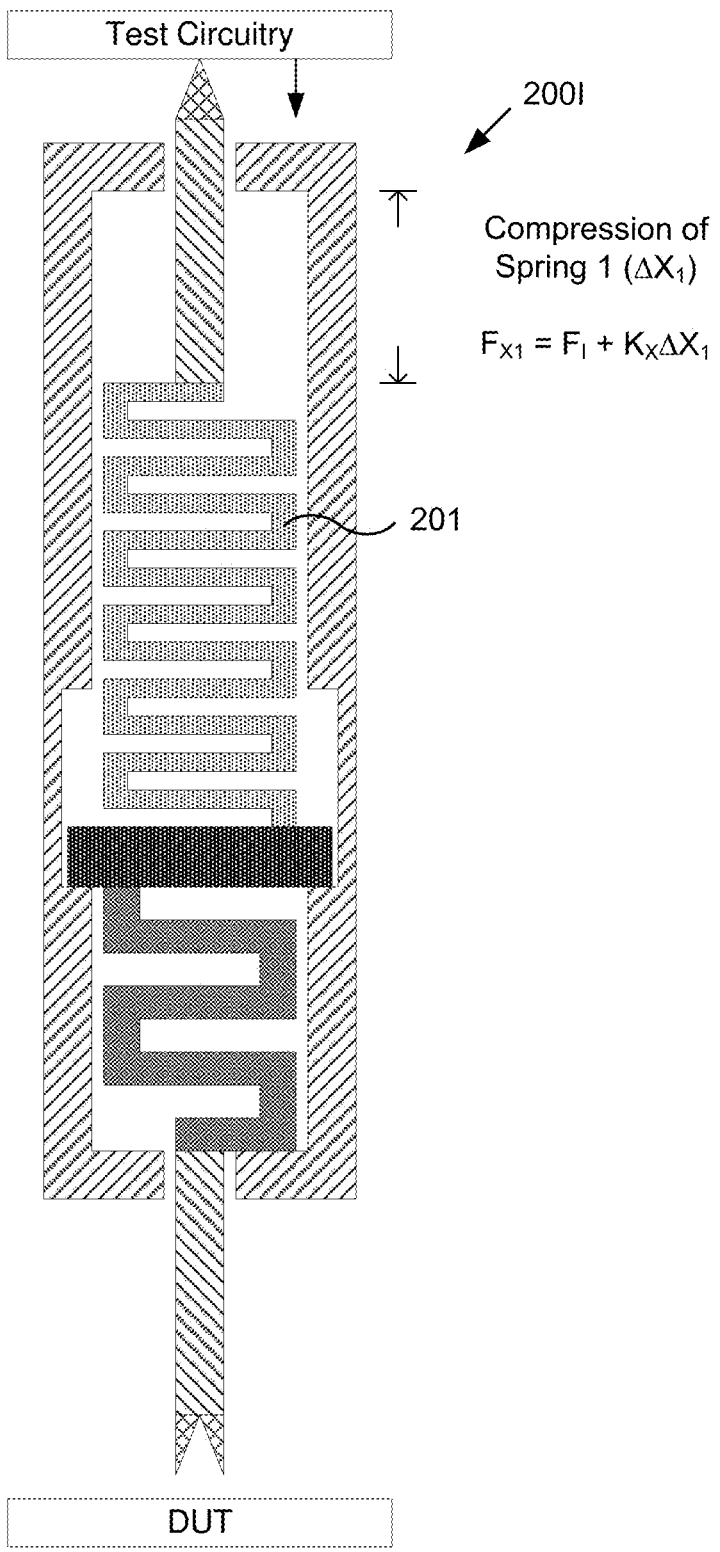

FIGS. 2I-1 to 2I-4 illustrate longitudinal cross-sectional views of a probe 200I at different stages of operation (similar to those of FIGS. 2H-A to 2H-D) where the probe includes a sheath 251, a first spring 201, a second spring 202, an upper fixed stop 231, an upper movable stop 221, an intermediate fixed stop 232, an intermediate movable stop 222, a widen region for movement of the intermediate movable stop, a lower fixed stop 233, a lower movable stop 223, guide/slide holes for tip arms 211 and 212 which are capped by probe tips 211T and 212T with different tip configurations and a different tip material. The illustrated stages include: (1) both probe tips 211T and 212T being uncompressed (FIG. 2I-1); (2) the upper tip 211T being compressed to provide an initial biasing of the upper spring to exert a force $F_{X1}$ between the movable intermediate stop 222 and the fixed intermediate stop 232 (FIG. 2I-2); (3) the lower tip being compressed upward to provide the second spring with a force $F_{Y1}$ that matches $F_{X1}$ but does not result in further compression of the first spring and as such does not result in movement of the movable intermediate stop (FIGS. 2I-3); and (4) additional compression of the second spring 202 upward such that both the second spring 202 and first spring 201 compress based on their relative spring constants where the effective spring constant of the serial combination is reduced to a value below the individual spring constants of both the first and second springs (FIG. 2I-4).

Figures 2, 2I, 3:
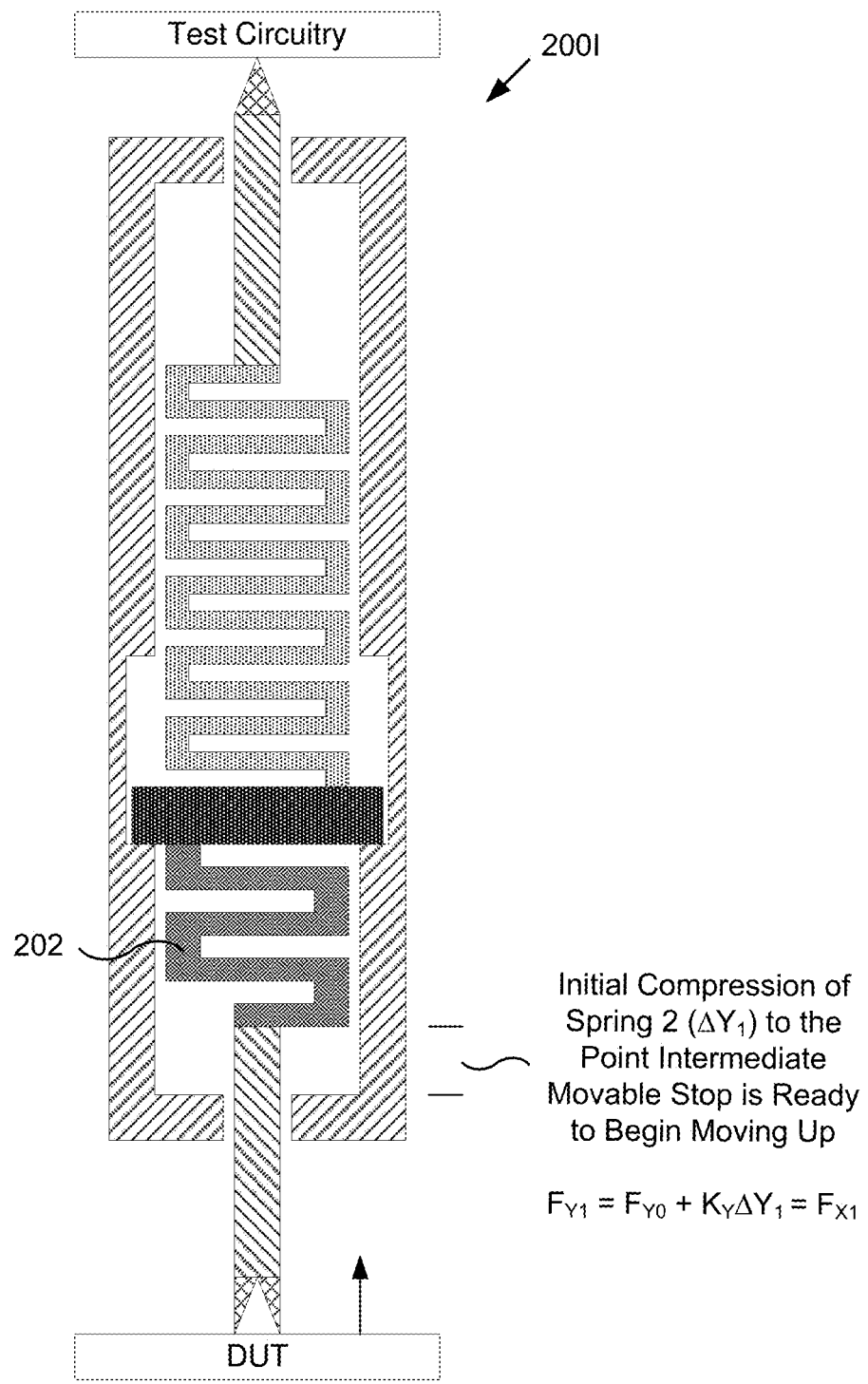

First Group of Embodiments—Alternative 9: Distinct Build Location and Working Range for a Select Portion of a Probe FIGS. 2J-1 to 2J-3 provide side cut views of a probe 200J with a movable stop located at three different positions wherein FIG. 2J-1 shows the movable stop 222 located in a build position relative to a fixed stop 232 within a sheath 251 wherein the spacing or gap between the movable stop and the walls of the sheath is greater than a minimum features size. FIG. 2J-2 shows the same probe with the movable stop 222 located at a lower end of a working range of movement defined by a fixed stop 232 that is a feature of the sheath 251 and with the movable stop separated from the side walls of the sheath in the working region by a gap that is less than the minimum feature size which allows for tighter control of lateral positioning as the movable stop moves up and down in the working range during normal operation. FIG. 2J-3 shows the movable stop toward an upper end of a working range which is somewhat below the build location wherein at least a portion of the movable stop is spaced from the walls of the sheath by a working gap that is smaller than a minimum feature size (MFS) similar to that shown in FIG. 2J-2. During formation, when the movable stop is located in the build location the gap between the movable stop and the sheath is larger than a minimum feature size (e.g. a size that allows formation of the features on a single layer to occur with a desired yield using a defined build process, e.g. 80, 90, 95, or even 99% feature yield for a given fabrication process) which may be, for example, as large as 5, 10, 20, 30 microns. After transition of the intermediate stop to the working range the gap between the intermediate stop and the shield is reduced to a value that is below a minimum features size, e.g. 10, 5, or even 2 microns or less. In other probe embodiments of the invention, such configuration size changes between interface regions for fabrication (i.e. build locations) and use (i.e. working locations, regions, or ranges of motion) may be designed into other probe regions to improve stability and probe operation (e.g. between sheath ends and tip arms, and the like).

Second Group of Embodiments: Probe with First and Second Extension Springs Separated by a Movable Stop that Interacts with a Fixed Stop Probes of the second group of embodiments have first and second springs that are extension, tensional, or tensive springs. The springs also support a movable stop that interacts with a fixed stop to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Second Group of Embodiments—Alternative 1: Probe with Different Springs

Figure 5A:
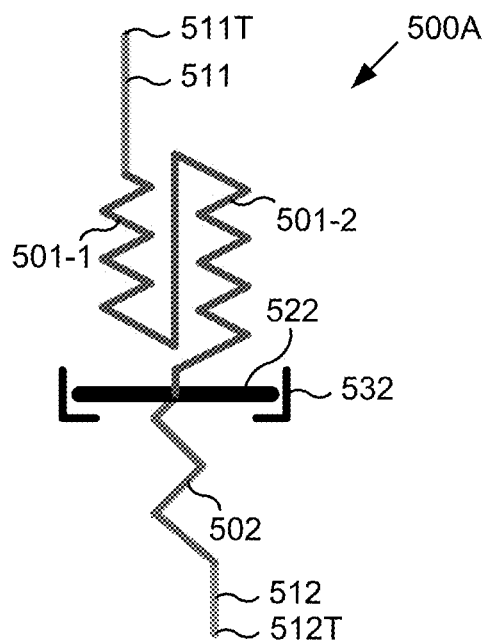
FIGS. 5A-5B provide two different versions of probes according to a fourth group of embodiments where the probes include first combination spring and second compressional spring separated by a movable stop with the first spring divided into a first compressional segment that is in series with a second compressional segment having a different spring constant.
Figure 5B:
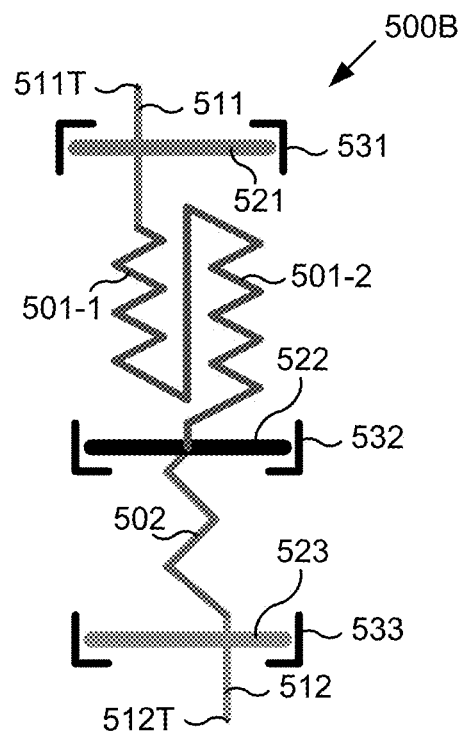
Figures 2A, 2B, 5C:
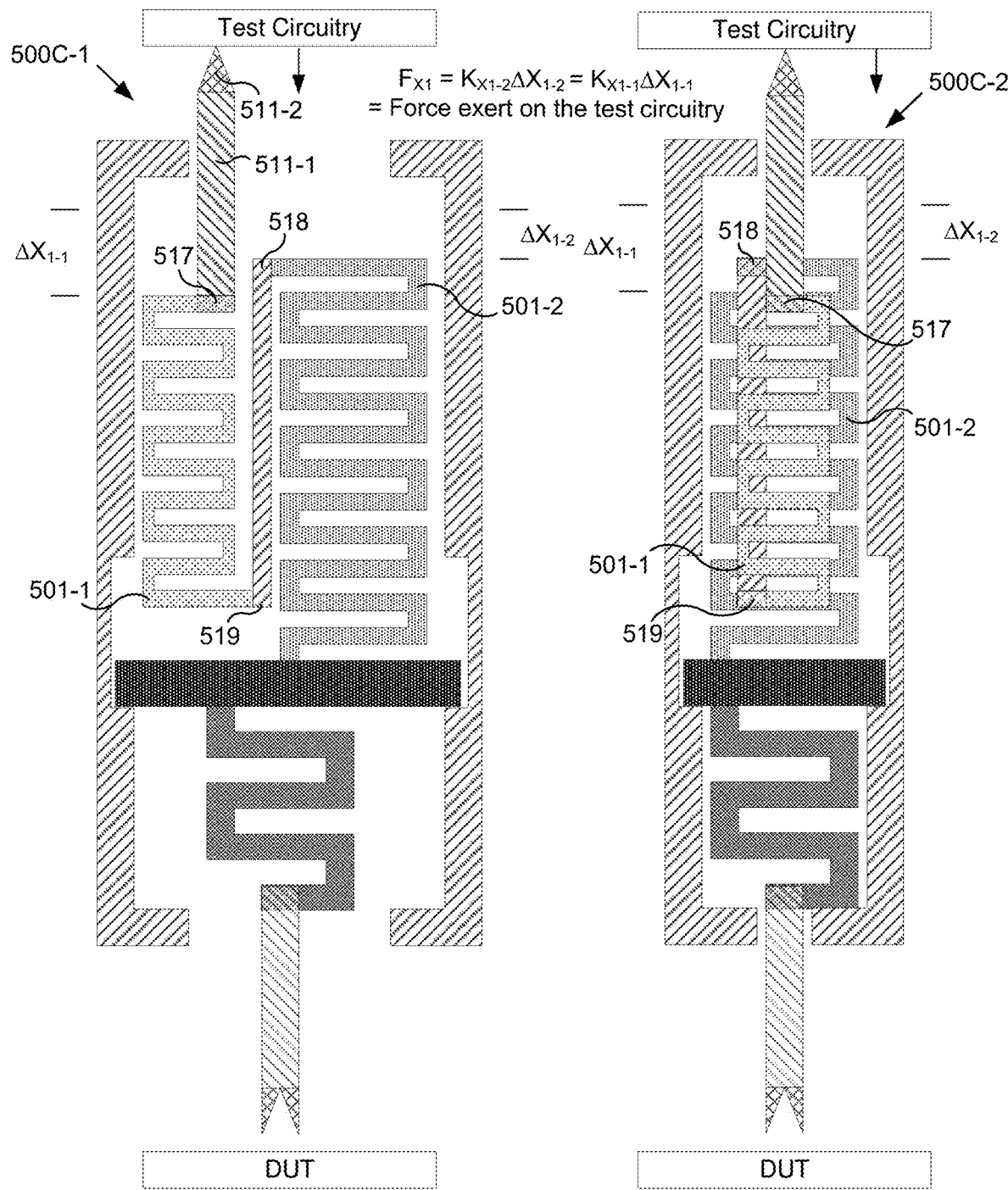
Figures 3A, 3B, 5C:
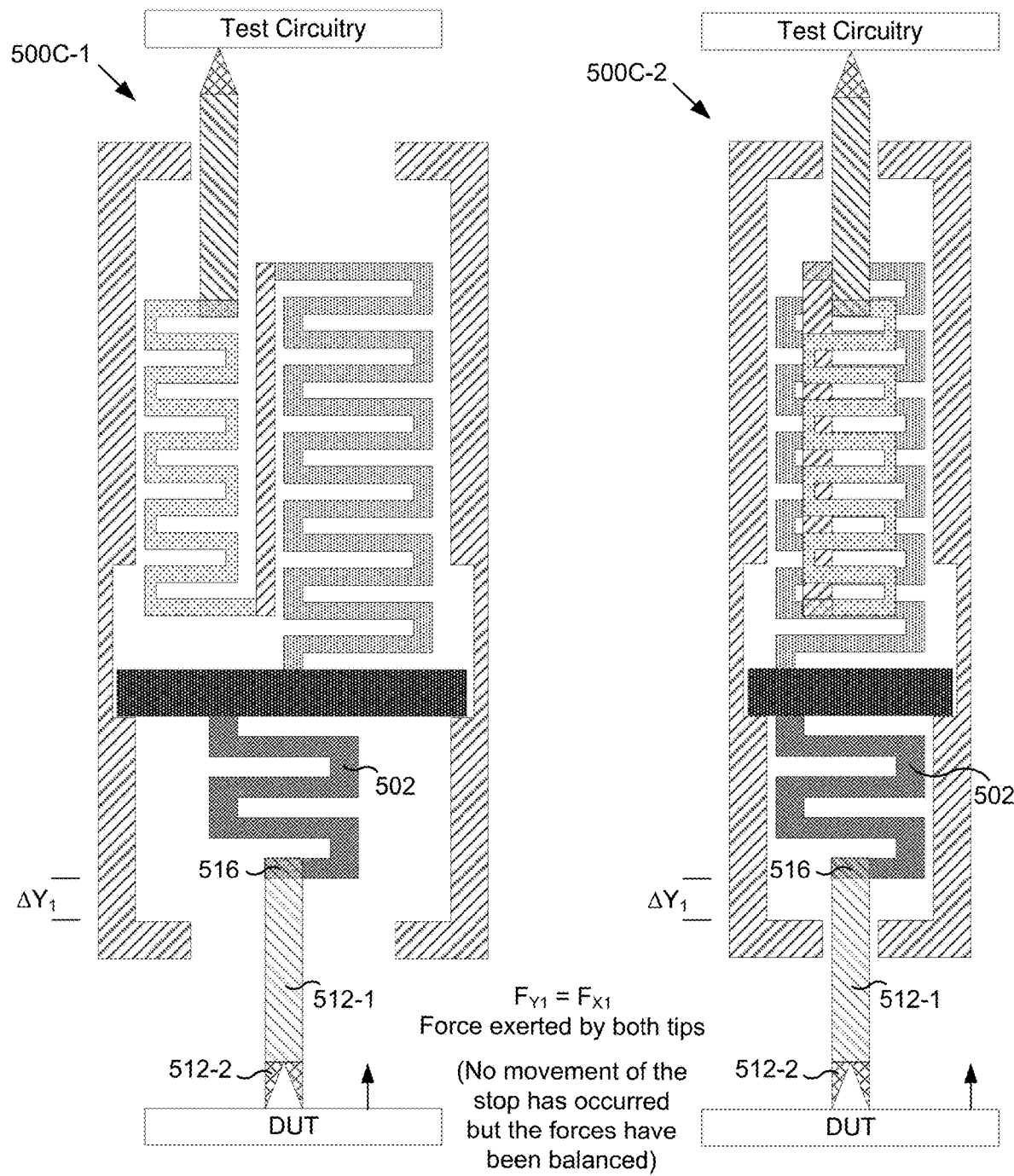
Figures 4A, 4B, 5C:
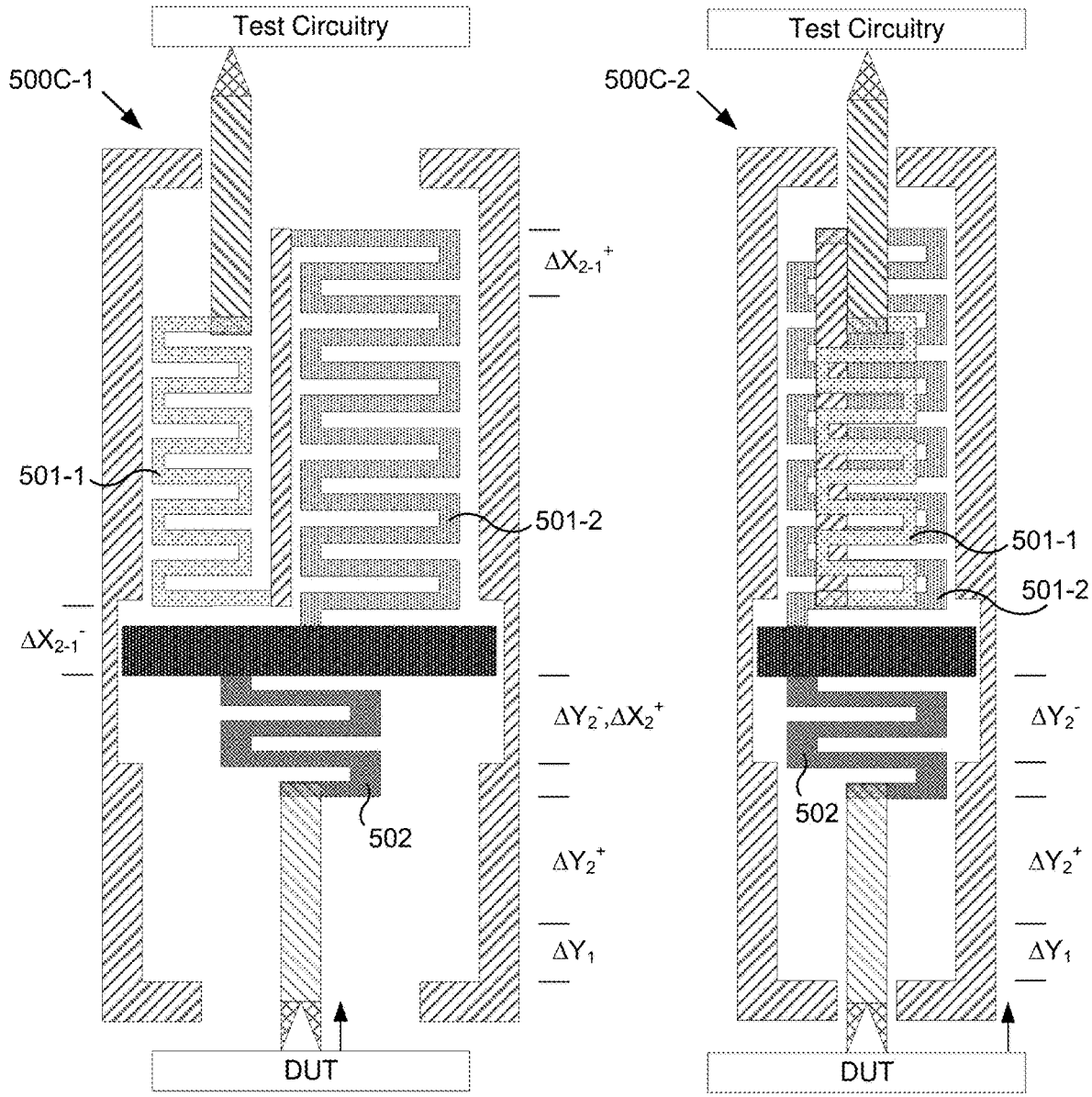

FIG. 3A provides a schematic representation of a probe 300A according to another embodiment of the invention where the probe includes first (upper) and second (lower) aligned extension springs 301 and 302, respectively, operated by tips 311T and 312T which, respectively, connect to tip arms 311 and 312, which in turn connect to the ends of the springs 301 and 302 that are opposite to their respective locations where the second (upper) spring 302 that has the downward extending tip 312T and is stiffer (e.g. has a larger spring constant and as such has a lower compliance) than that of the first (lower) spring 301 that has the upward extending tip 311T, and where the springs are functionally separated by a movable stop 322 made to move longitudinally with the tensioning of the springs and made to contact a fixed stop or stop seat 332 upon initial loading of the first spring by pressing its tip against a first circuit element, e.g. a non-DUT electrical contact (not shown), prior to the second spring being compressed by its tip being pressed against a pad of a second circuit element, e.g. a DUT contact (not shown), and wherein upon contacting the second spring to a DUT and tensioning the second spring from a zero force state to a tensioned force equal to that on the first spring the effective spring constant reduces from that of the second spring alone to that resulting from a combination of the serial tensioning of both the first and second springs. As shown in FIG. 3A the movable stop can have openings therethrough that allow passage of the tip arms in the same plane as the springs themselves, or in different planes, while in other variations the movable stop may be solid with the arms operating in a plane or multiple planes in front of or behind the movable stop.

Second Group of Embodiments—Alternative 2: Probe with Upper, Intermediate, and Lower Movable and Fixed Stops FIG. 3B provides a schematic representation of a probe 300B similar to the probe of FIG. 3A with the exception that the probe additionally includes an upper movable stop 321 and an upper fixed stop seat 331 and a lower movable stop 323 and a lower fixed stop seat 333 that are respectively used to limit the outward motion of the tip 311 associated with the first spring and the tip 312 associated with the second spring, respectively, where these stops may provide for an initial biasing of one or both springs (prior to tips contacting circuit elements) and wherein the biasing results in the intermediate movable stop 322 being positioned away from the intermediate fixed stop 332 prior to application of a force to the contact tip associated with the first spring. As shown in FIG. 3B the movable stop can have openings therethrough that allow passage of the tip arms in the same plane as the springs themselves, or in different planes, while in other variations the movable stop may be solid with the arms operating in a plane or multiple planes in front of or behind the movable stop.

Second Group of Embodiments—Alternative 3 Probe with a Shield in an Operational Example FIGS. 3C-1-3C-4 illustrate a probe 300C using cross-sectioned longitudinal views at four different stages of operation showing states similar to those shown in FIGS. 2J-1 to 2J-4 but based on the operation of two tensional springs instead of two compression springs. Probe 300C includes a sheath 351 with a build-in fixed intermediate stop 332. Two extension springs 301 and 302 operate in a longitudinal passage that extends through the sheath with extension arms 311 and 312 extending from the spring through openings at either end of the sheath with tips existing on the end of each arm 311T and 312T with the tips shown as having different tip configurations and a different tip material. The arms join the springs at location 317 (for spring 301 and arm 311) and at 316 (for spring 302 and arm 312). The spring on their opposite ends join together at intermediate movable stop 322 which has a width that can longitudinally move within a working region. Tip arm 312 is shown as being positioned and operating behind the level (e.g., layer) containing the springs and the movable stop while the upper tip arm 311 is positioned and operates in a front of the level containing the springs and the movable stop. In some variations the tip may continuously rub against the sides, front, or back of the sheath, e.g., as encouraged by a lateral spring force resulting from a slight bending of the arms as they extend through the openings, such that a continuous electrical connection is made between the arms and the sheath thus allowing current to be shunted around the springs themselves and through the body of the sheath.

Figures 2, 2I, 3, 4:
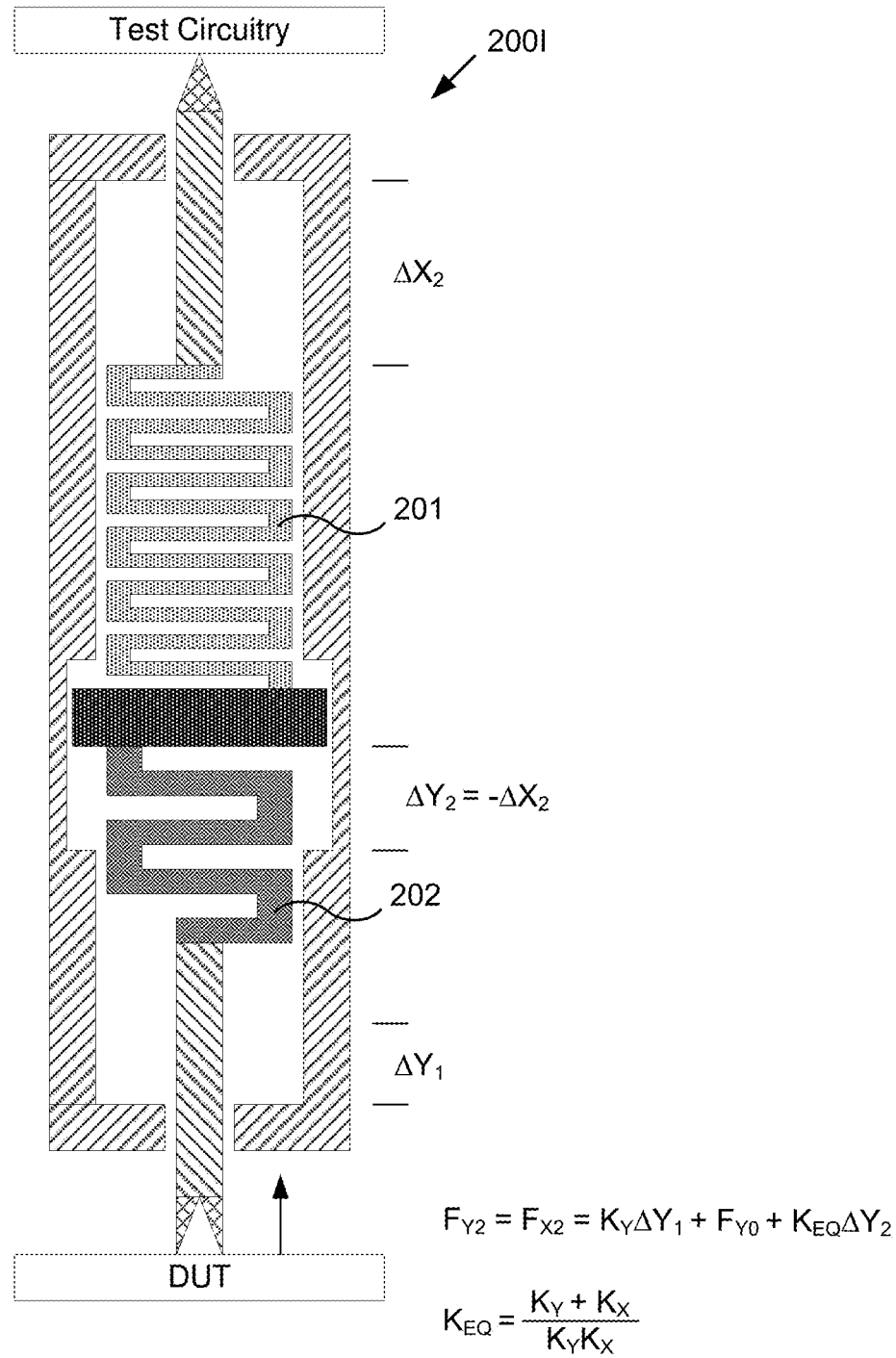
Figures 2, 3, 3C:
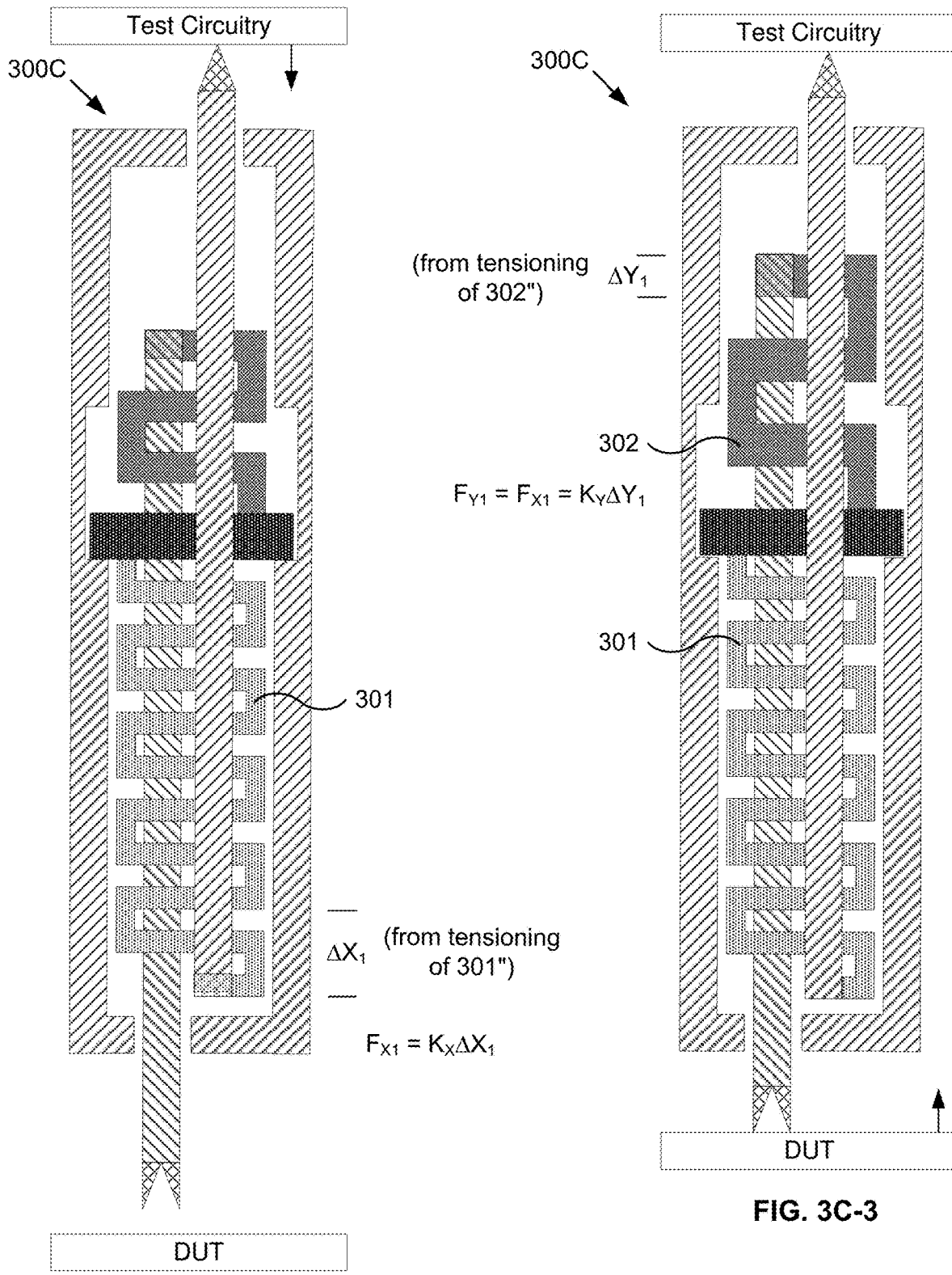
Figures 3, 3C, 4:
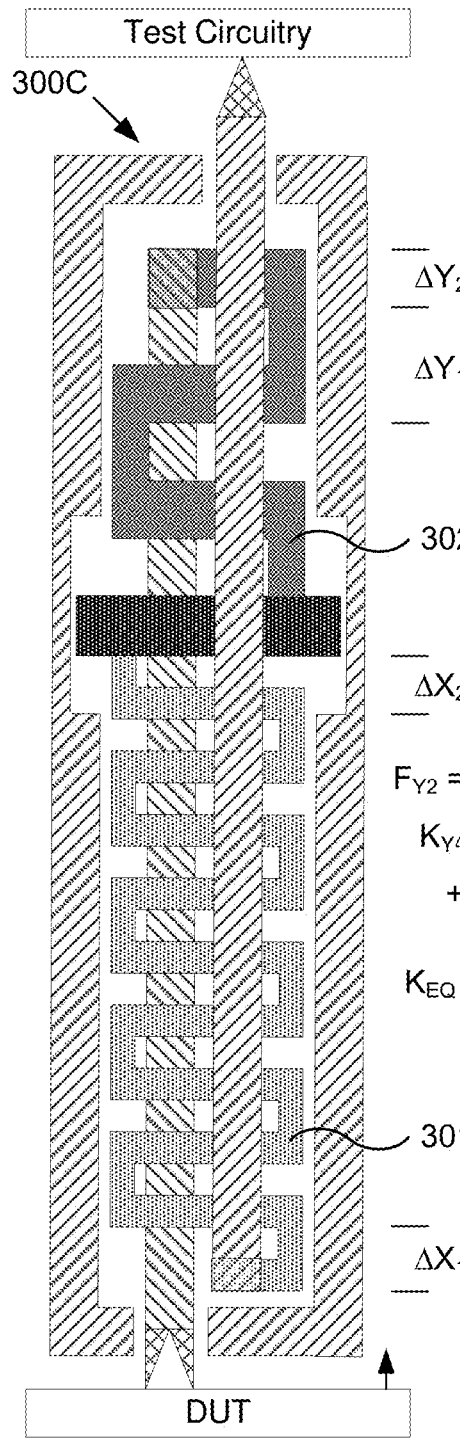

The stages shown include: (1) both probe tips being unbiased—i.e. springs being un-tensioned (FIG. 3C-1); (2) the upper tip 311T being compressed (e.g. by contact with a non-DUT pad or bump) to provide an initial tensioned biasing of the spring 301 to exert a tension force $F_{X1}$ between the movable intermediate stop 322 and the fixed intermediate stop 332 (FIG. 3-C2); (3) the lower tip being compressed upward (e.g. by contact with a DUT pad or bump) to provide the second spring 302 with a deflection and resulting tension force $F_{Y1}$ that matches $F_{X1}$ but does not result in further extension of the first spring 301 and as such does not result in movement of the movable intermediate stop (FIG. 3C-3); and (4) additional compression of the lower tip upward such that both the second and first springs extend based on their relative spring constants where the effective spring constant of the serial combination is reduced to a value below that of the individual spring constants of both the first and second springs (FIG. 3C-4).

Third Group of Embodiments—Probe with a Compression Spring and an Extension Spring Located on the Same Side of a Movable Stop that Interacts with a Fixed Stop Probes of the third group of embodiments have a first spring that is operate under tension and a second spring that operates under compression, with both spring on the same side of a movable stop. The springs together also support a movable stop and each spring separately supports a probe tip arm which in turn supports a tip. The movable stop interacts with a fixed stop to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Third Group of Embodiments—Alternative 1: Probe with Different Springs

Figure 4A:
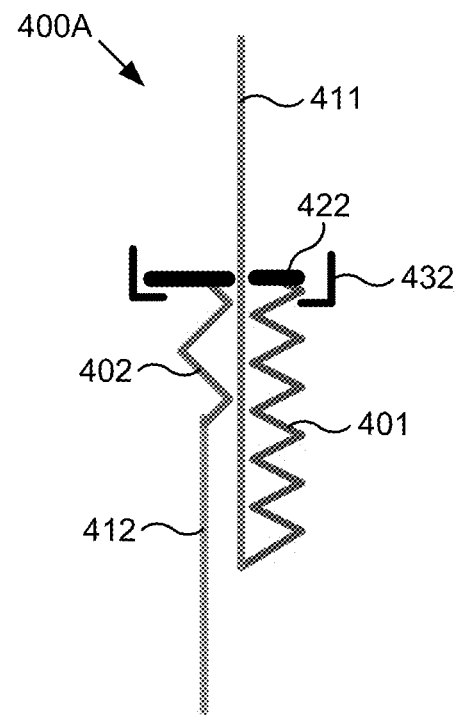
FIGS. 4A-4B provide two different versions of probes according to a third group of embodiments where the probes include first extension spring and second compression spring attached to the same side of a movable stop.

FIG. 4A provides a schematic representation of a probe 400A according to another embodiment of the invention where the probe includes a first extension spring 401 and a second compression spring 402 where the second spring is stiffer (e.g. has a larger spring constant and as such has a lower compliance) than that of the first spring, and where the springs are physically located on the same side of a movable stop and are functionally joined by the movable stop 422 that is made to move longitudinally with the respective tensioning and compression of the springs and made to contact a fixed stop or stop seat 432 upon initial downward loading of the first tip by pressing on the end 411T of extension arm 411 that is connected to, and extends the first spring when the first tip is pressed against a first circuit element (e.g. non-DUT electrical contact) prior to a second tip 412T and associated extension arm 412, that is connected to the second spring 402, being compressed against a pad of a second circuit element (e.g. a contact of DUT) and wherein upon contacting the second tip to the second circuit and compressing the second spring from a zero force state to a compressed force equal to the initial tensioning force on the first spring the effective spring constant reduces from that of the second spring to that resulting from a combination of the serial tensioning of the first spring and compressive loading of the second spring. As shown in FIG. 4A the movable stop can have openings therethrough that allow passage of the tip arms in the same plane as the springs themselves, or in different planes, while in other variations the movable stop may be solid with the arms operating in a plane or multiple planes in front of or behind the movable stop.

Figure 4B:
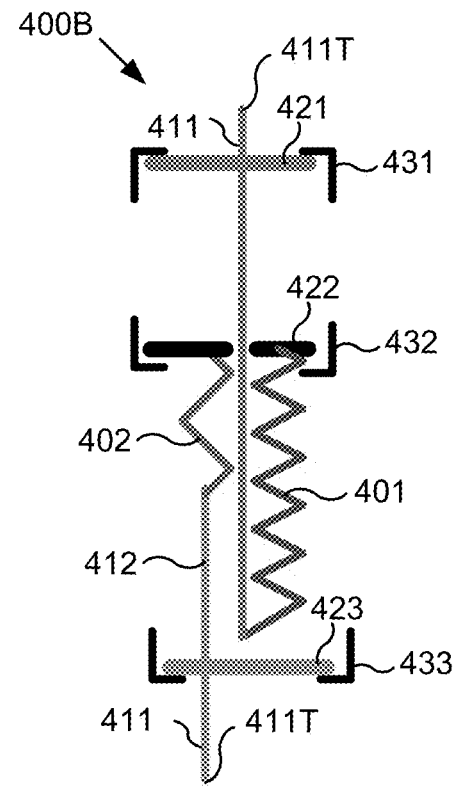

Third Group of Embodiments—Alternative 2: Probe with a Compression Spring and an Extension Spring Located on the Same Side of a Movable Stop as Well as Upper, Intermediate and Lower Movable and Fixed Stops FIG. 4B provides a schematic representation of a probe 400B similar to that of FIG. 4A with the exception that the probe additionally includes an upper movable stop 421 and an upper fixed stop seat 431 and a lower movable stop 423 and a lower fixed stop seat 433 that are respectively used to limit the outward motion of the tip 411T associated with the first spring and the tip 412T associated with the second spring, respectively, where these stops may provide for an initial biasing of one or both springs (prior to tips contacting circuit elements) and wherein the biasing may result in the intermediate movable stop being positioned away from the intermediate fixed stop or against the intermediate fixed stop prior to application of a force to the contact tip 411T associated with the first spring 401. As shown in FIG. 4B the movable stop can have openings therethrough that allow passage of the tip arms in the same plane as the springs themselves, or in different planes, while in other variations the movable stop may be solid with the arms operating in a plane or multiple planes in front of or behind the movable stop.

Figures 1A, 1B, 4C:
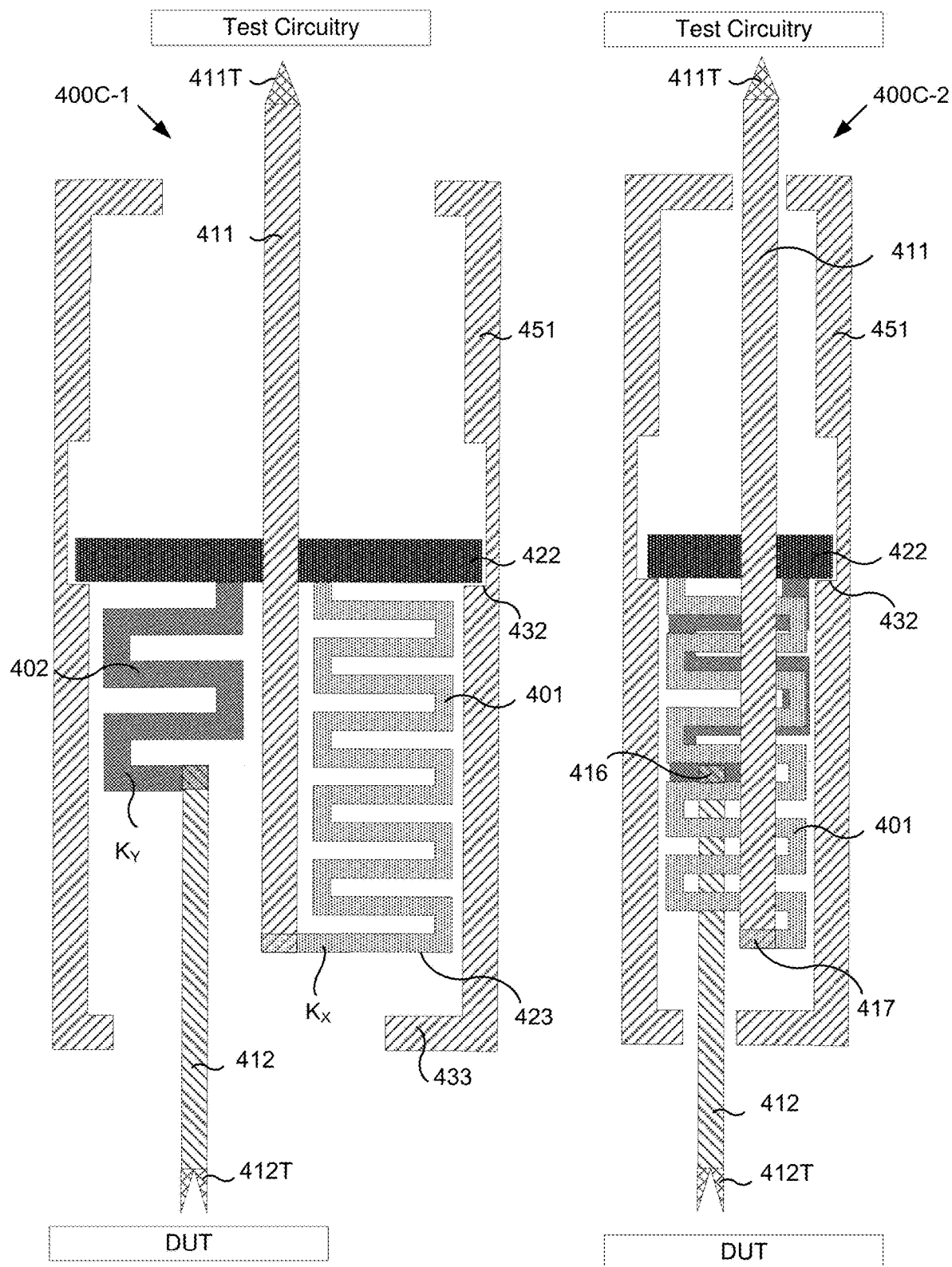
Figures 2A, 2B, 4C:
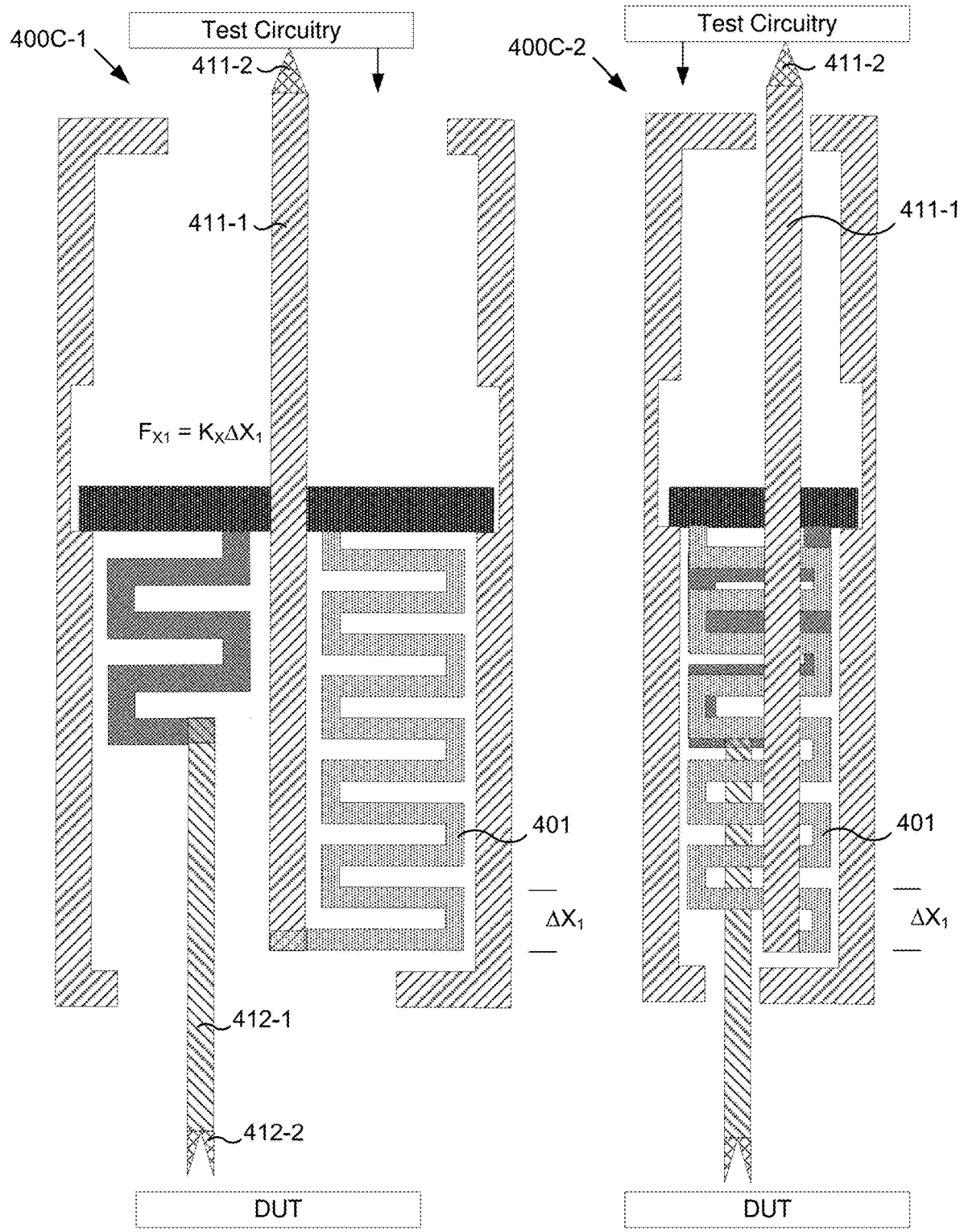

Third Group of Embodiments—Alternatives 3 & 4—Operational Examples: Probe with Either Side-by-Side Springs (One Compressive and the Other Extensive) or with Overlapping (Flat-to-Flat) Springs (One Compressive and the Other Extensive) which are Located on the Same Side of a Movable Stop FIGS. 4C-1A to 4C-4B illustrate the stages of operation of two versions of a probe 400C-1 and 400C-2 shown in cut longitudinal cross-sectional views, where the probe functionalities are similar to that of FIG. 4A but where probe 400C-1 has edge-to-edge springs while probe 400C-2 has springs spaced apart but overlaid with one another face-to-face, side-to-side, or flat-to-flat and with the each probe including one extension spring 402 with a lower arm 412 and tip 412T and one compression spring 401 with an upper arm 411 and tip 411T, an intermediate movable stop 422 that joins the springs, a sheath 451 with a fixed intermediate stop 432. In the "-A" figures, the springs are shown edge-to-edge with arm 411 laying between springs 401 and 402 (either in front of or in the same plane and extending through an opening (not shown) in movable stop 422 while arm 412 lays behind or in line with spring 402. In the "-B" figures, the probe is shown with the springs laying face-to-face, side-to-side or flat-to-flat, and with arm 411 in front spring 401 and with spring 401 separated therefrom by a space, with spring 402 separated from spring 401 by a space and possibly a surface or other separating structure that minimizes spring interference, and in the back of arm 412 (which may alternatively lay in the same plane (or layer) as spring 402. In all the figures, the probes are also shown with probe tips with different configurations and with different materials than that used for the arms.

The stages of operation illustrated include: (1) the probe tips being uncompressed—i.e. springs being un-tensioned and uncompressed (FIGS. 4C-1A and 4C-1B); (2) the upper tip being compressed downward to provide an initial extended biasing of the first spring to exert a tension force $F_{X1}$ between the movable intermediate stop and the fixed intermediate stop (FIGS. 4C-2A and 4C-2B); (3) the lower tip being compressed upward to provide the second spring with a compression force $F_{Y1}$ that matches $F_{X1}$ but does not result in further extension of the first spring and as such does not result in movement of the movable intermediate stop (FIGS. 4C-3A and 4C-3B); and (4) additional compression of the lower tip upward resulting in the second spring compressing more and the first spring extending more based on their relative spring constants such that the effective spring constant KEQ of the serial combination is reduced to a value below the individual spring constants $K_X$ and $K_Y$ of the first and second springs (FIGS. 4C-4A and 4C-4B). In other alternatives, numerous configurational variations are possible.

Fourth Group of Embodiments: Probe with a First Two-Segment Compression Spring and a Second Spring Separated by a Movable Stop that Interacts with a Fixed Stop Probes of the fourth group of embodiments have a first two part (or two segment) compression spring that is operate under and a second compression spring that is separated from the first spring by a movable stop. The springs also individually support a probe tip arm which in turn supports a tip. The movable stop interacts with a fixed stop that may or may not be part of the probe (e.g., it could be part of a mounting structure or guide plate that the probe may engage with) to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Fourth Group of Embodiments—Alternative 1: Probe with Different Springs

FIG. 5A provides a schematic representation of a probe 500A according to another embodiment of the invention where the probe includes a first two-segment 501-1 and 501-2 compression spring connected in series and a second compression spring 502 where the second spring is stiffer than that of the two-segment first spring, and where the first and second springs are physically located on opposite sides of a movable stop 522 and are functionally joined by the movable stop. The movable stop can be made to move longitudinally with the respect to the springs and made to contact a fixed stop 532 upon initial downward loading (i.e. compressing) of a first tip 511T against a first circuit element (e.g., a non-DUT electrical contact) prior to a second tip 512T being pressed against a second circuit element (e.g. a pad of a DUT). Upon contacting the second tip to a DUT and compressing the second spring from a zero force state to a compressed force equal to the initial compressing force on the first spring, the effective spring constant reduces from that of the second spring alone to that resulting from a combination of the serial biasing of the first spring and second spring.

Fourth Group of Embodiments—Alternative 2: Probe Including Upper, Intermediate, and Lower Movable and Fixed Stops FIG. 5B provides a schematic representation of a probe 500B similar to that of FIG. 5A with the exception that the probe additionally includes an upper movable stop 521 and an upper fixed stop seat 531 and a lower movable stop 523 and a lower fixed stop seat 533 that are respectively used to limit the outward motion of the first tip (associated with the first two-segment spring and the second tip (associated with the second spring), respectively, where these stops may provide for an initial biasing of one or both springs (prior to tips contacting circuit elements) and wherein the biasing in may result in the intermediate movable stop being positioned away from the intermediate fixed stop (as shown) or result in the contact between the stops prior to application of a force to the first tip.

Fourth Group of Embodiments—Alternatives 3 & 4—Operational Examples: Illustrating Two Alternative Probe Configurations FIGS. 5C-1A to 5C-4B illustrate cut longitudinal cross-sectional views of probes 500C-1 and 500C-2 at various stages of operation where the probes have similar functionalities to the probe of FIG. 5A but where probe 500C-1 has a first spring with two segments 501-1 and 501-2 with the segments laying edge-to-edge while the segments of the first spring in probe 500C-2 are spaced but lay side-by-side, or flat-surface-to-flat-surface, and where the two probes include a first tip arm 511 and a first tip 511T, a second spring, and a second tip arm 512 and a second tip 512T-2, and an intermediate movable stop 522 that joins the springs, a sheath 551 with a fixed intermediate stop 532 and a number of join regions 516, 517, 518, 519 that highlight the connection of different probe elements. The probes also include a segment-to-segment joining arm 506 that is located between the two spring segments and that connects the end of one to the beginning of the other. In this set of drawings, "-A" figures show the probe 500C-1 in various stages while the "-B" figures show the probe 500C-2 in various stages. The probe segments are spaced from one another but may also be separated by a surface or other separating structure that minimizes spring interference. In all the figures of this set, the probes are also shown with probe tips including different configurations and with different materials than that used for the arms. In other configuration and material variations and combinations may be used.

The stages illustrated include: (1) the probe tips being uncompressed—i.e. springs being uncompressed (FIGS. 5C-1A and 5C-1B); (2) the upper tip being compressed downward to provide an initial compressed biasing of each part of the first spring to exert a biasing force $F_{X1}$ between the movable intermediate stop and the fixed intermediate stop (FIGS. 5C-2A and 5C-2B); (3) the lower tip being compressed upward to provide the second spring with a compression force $F_{Y1}$ that matches $F_{X1}$ but does not result in further compression of the first spring and as such does not result in movement of the movable intermediate stop (FIGS. 5C-3A and 5C-3B); and (4) additional compression of the second spring upward such that the second spring compresses based on its spring constant $K_Y$ and first spring (both segment) compresses based on serial combination of their relative spring constants $K_{X1}$ and $K_{X2}$ where the effective spring constant of the serial combination of springs 502, 501-1, and 501-2 is reduced to a value below the individual spring constants of both the first and second springs (FIGS. 5C-4A and 5C-4B).

Fifth Group of Embodiments: Probe with a First Two-Segment Combination Spring (Tension and Compression) and a Second Compression Spring Separated by a Movable Stop that Interacts with a Fixed Stop Probes of the fifth group of embodiments have a first two-part (or two segment) spring that includes a compression spring operating in series with an extension spring tension which are separated from a second compression spring by a movable stop. The springs also individually support a probe tip arm which in turn supports a tip. The movable stop interacts with a fixed stop that may or may not be part of the probe to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Fifth Group of Embodiments—Alternative 1: Probe with Different Springs

Figure 6A:
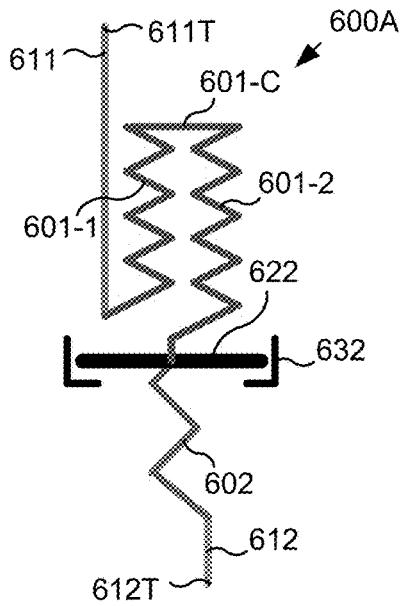
FIGS. 6A-6C provide three different versions of probes according to a fifth group of embodiments where the probes include first combination spring and second compressional spring separated by a movable stop with the first spring divided into a first compression segment that is in series with a second expansion segment.

FIG. 6A provides a schematic representation of a probe 600A according to another embodiment of the invention where the probe includes a first upward point tip 611T which is attached to a tip arm 611 which in turn attaches to a lower portion of a first extension segment 601-1 of a two-segment spring. The first extension spring moves upward to a lateral connector 601-C which connects to the top of a second compression segment 601-2 of the first spring. Segment 601-2 connects then extends down to an upper portion of a movable stop 622. A second compression springs extends downward from the bottom of the movable stop to a tip arm 612 which ends in a tip 612T. The second aligned compression spring 602 is stiffer than the two-part first spring 601-1 in combination with 601-2. The first and second springs are physically located on opposite sides of the movable stop 622 and in the present embodiment, the movable stop interacts with a fixed stop 632 that is located below it. The movement of movable stop 622 it dictated by the forces applied to it by spring segment 601-2, spring 602 and by its direct contact with stop 632. In usage, generally the movable stop is first made to contact fixed stop 632 by applying an unbalanced force to it via tip 611T and associated force propagation through springs 601-1 and 601-2. In general, movable stop 622 is initially made to contact fixed stop or seat 632 with a non-zero biasing force so that a desired amount of force is required to make it move away from the stop. As such generally tip 611T is pressed downward by an electrical circuit element (e.g. a non-DUT electrical contact) to achieve a first loading force prior to the second tip 612 engaging a contact surface of a second circuit element (e.g. a pad of a DUT). Upon contacting the second tip 612 to the second circuit element and compressing the second spring from a zero force state to a compressed force state equal to that of initial loading force, a transition is reached where the movable stop can begin moving away from the fixed stop which causes the effective spring constant to reduce from that of the second spring alone to that resulting from a combination of the serial extending and including of the segments of the first spring and the compressing of the second spring. As with the other embodiments, a variation of the present embodiment, may involve the second tip contacting the DUT or second circuit element and even causing some biasing of the second spring prior to the pressing of the first tip to cause the movable and fixed stops to come together. As with other embodiments, the spring constants of the first and second spring may be the same or reversed from what they are in the above example. As with other embodiments, the features of other embodiments and variations of those other embodiments may be combined with the features and variations of this embodiment.

Figure 6B:
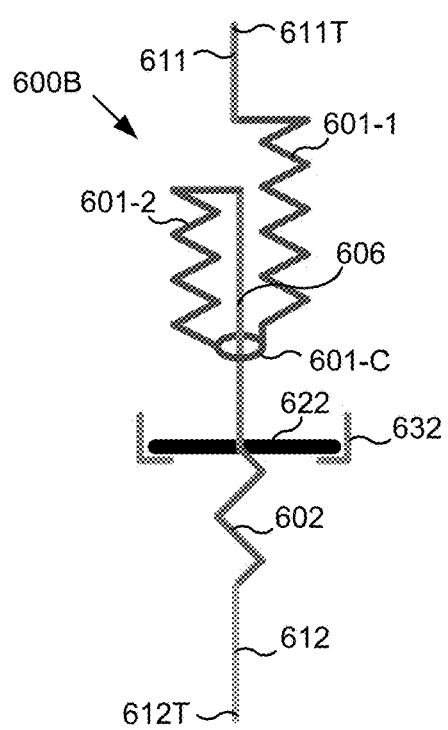

Fifth Group of Embodiments—Alternative 2: Probe with Having a First Spring Made Up of an Alternative Two-Segment Combination FIG. 6B provides a schematic representation of a probe 600B similar to that of FIG. 6A with the exception of the first two-segment spring has reversed compression and tensioning functionality (i.e. the segment 601-1 connected most immediately to the tip 611T compresses while the segment 601-2 connected most immediately to the movable stop 622 is operated under tension) and where the two segments are connected in a way (e.g. via one or more slip rings (as shown), rods or guides and rails, or a combination thereof) that allows a connector arm 605 to be located between the two segments that can provide one or both of an intermediate sliding surface and a separating surface for the spring parts.

Fifth Embodiment—Alternative 3: Probe with a First Spring Having a Second Two-Segment Configuration (Compression and Extension)

Figure 6C:
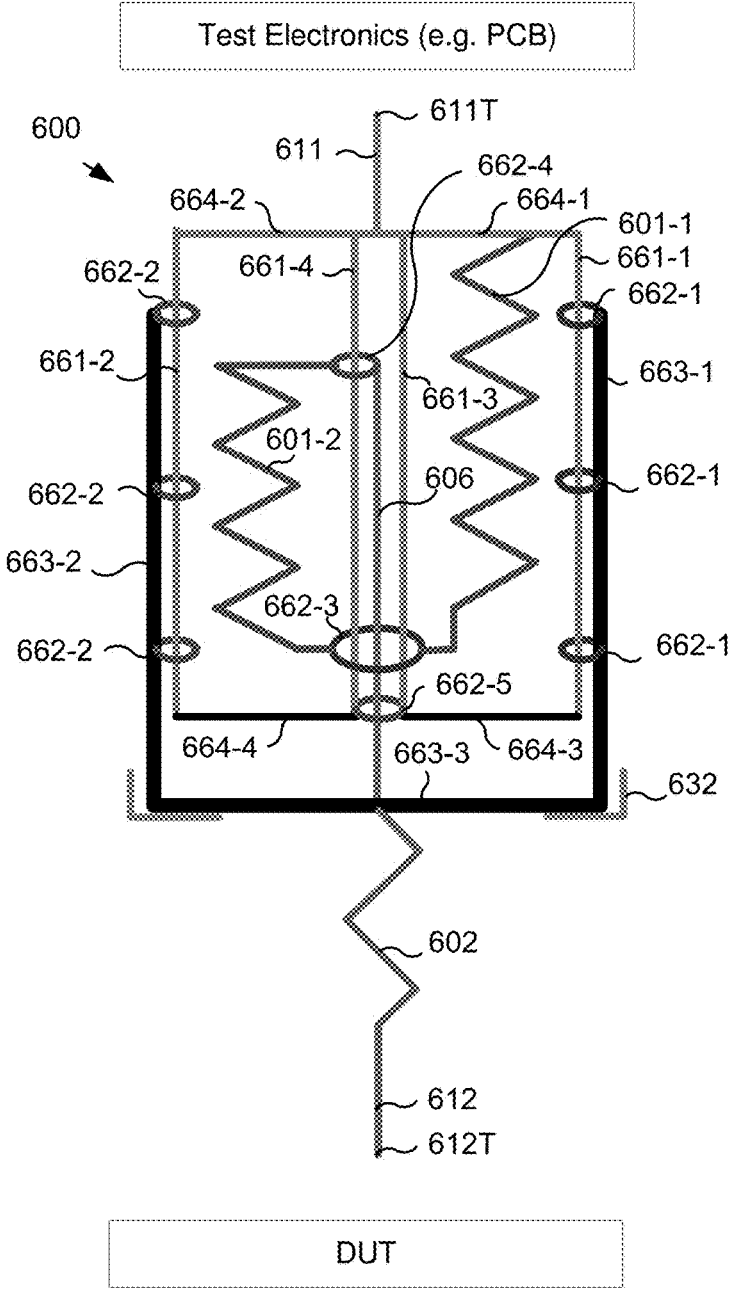

FIG. 6C provides a schematic representation of a probe 600 where tip 611T results in modification of the first spring including compression of spring segment 601-1 and extension of spring segment 601-2 while movement of lower tip 612T results in compression of second spring 602. Since the two spring segments 601-1 and 601-2 are joined at their lower ends by coupling and guide ring 662-3, the compressing of spring segment 601-1 has an impact on the net extension of spring segment 601-2 while the extension of spring 601-2 has a net impact on the compression of spring 601-1. A net force applied to the tips of the probe depends on several factors including the effective spring constant of the two segments of the first spring and the spring constant of the second spring, the net deflection of each spring, and any initial bias created in each spring. An upper probe tip 611T is located at the upper end of tip arm 611 while the other end of the tip arm connects to a relatively rigid sliding frame structure via lateral crossbars 664-1 & 664-2 with these bars in turn connecting to the upper end of spring segment 601-1 as well as to other frame elements 661-1 to 661-4. Frame elements 661-1 to 661-4 at their lower ends connect to lateral cross bars 664-3 and 664-4 which are joined by the coupling and guide ring 662-5. The upper portion of spring 601-2 connects to slip ring 662-4 which also connects to connector arm 606 which joins the bottom of a second frame structure from which an upper end of spring 602 connects while the lower end of spring 602 connects to tip arm 612 which ends in tip 612T. The sliding frame is held by and can slide longitudinally relative to the second frame that includes elements 663-1 to 663-3 with an interface between the two frame structures being a plurality of slip rings 662-1 on the right and 662-2 on the left which are mounted to the second frame while slidingly engaging the first frame with a relative longitudinal positioning of the frames being a function of the relative position of upper and lower circuit elements (such as a DUT, device under test, or a space transformer or other test circuit interface elements that engage probe tips) along with the compression experienced by spring 602. The framing elements help in stabilizing probe functionality and may help ensure that the compression spring 601 does not deflect or bow excessively. In some implementations, additional guide elements may be provided in front and/or behind both faces of one or both springs to provide additional operational stability. For example, initial biasing of one or both springs may be useful in providing different operational characteristics to the probe. For example, selecting and setting a minimum distance between element 663-3 and 664-4 that is greater than a nominal unbiased distance or setting a maximum distance between frame elements 663-3 and 664-2 may result in pre-biasing of the springs to provide an initial non-zero contact force for the probe.

The probe of FIG. 6C may be alternatively described as including the following structures, elements, and relationships: (1) Structure 1 being an elongate structure with a tip for contacting testing circuitry; (2) Structure 2 being an elongate structure on which Structure 1 can slide; (3) Spring 1 being a segmented spring with a compression spring joined on one end to Structure 1 and joined on the other end to a first end to an extension spring which in turn is joined on its second end to Structure 2 via arm 606 such that when Structure 1 is moved to have more overlap with Structure 2 (to decrease the Gap), the force exerted by Spring 1 is increased from an initial value to a first biased value; (4) Structure 3 (663-3 corresponding to 622 of FIG. 6B) being fixed to Structure 2 which can abut a fixed stop structure 632 where the fixed stop can be for example a guide plate, a probe substrate, or other probe head or mounting component; (5) Spring 2 being connected to the end of Structure 3 which may or may not have a larger spring constant than the two-segment Spring 1; and (6) a second tip structure, or tip support structure, being connected to the end of Spring 2 and which is configured to join to a tip contact structure or directly to a DUT pad or bump.

Figures 1, 6D:
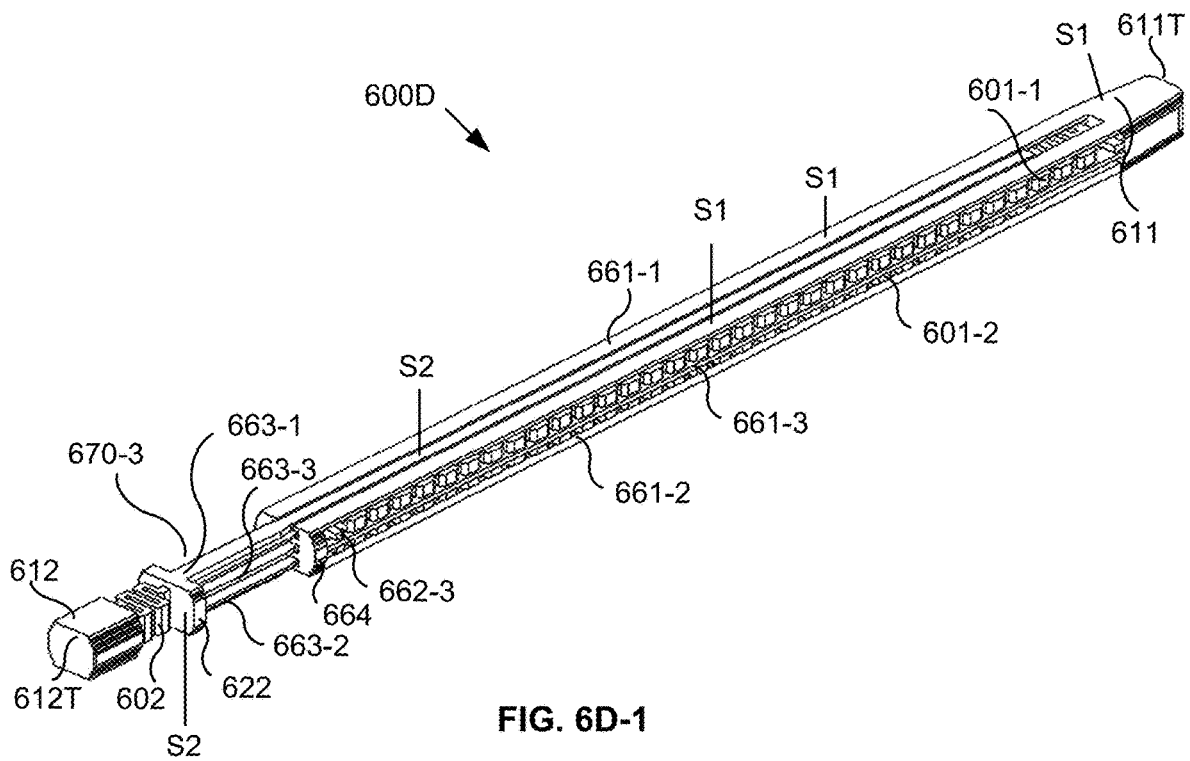
Figures 2, 6D:
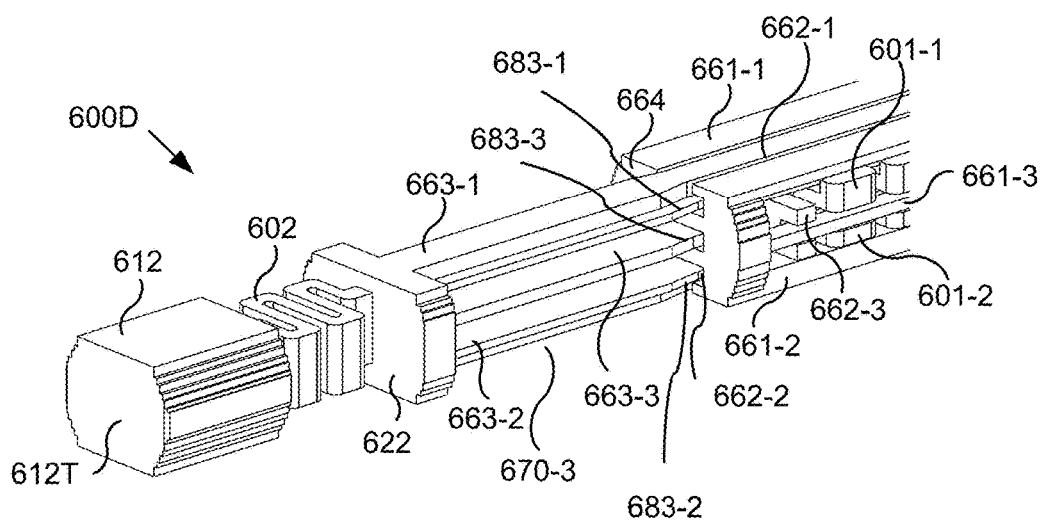
Figures 3, 6D:
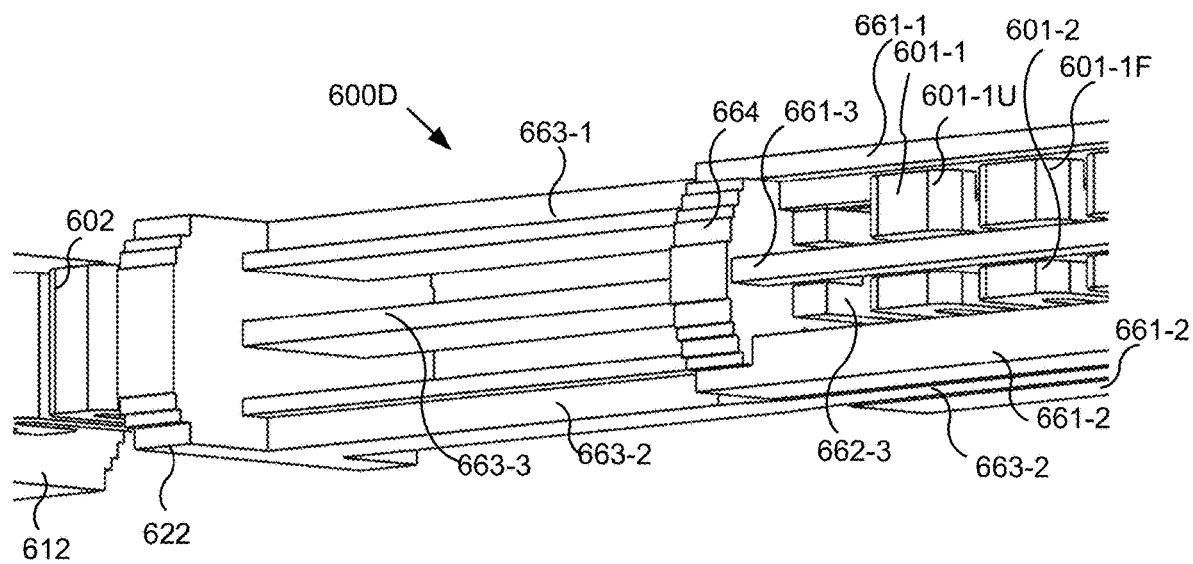
Figures 4, 6D:
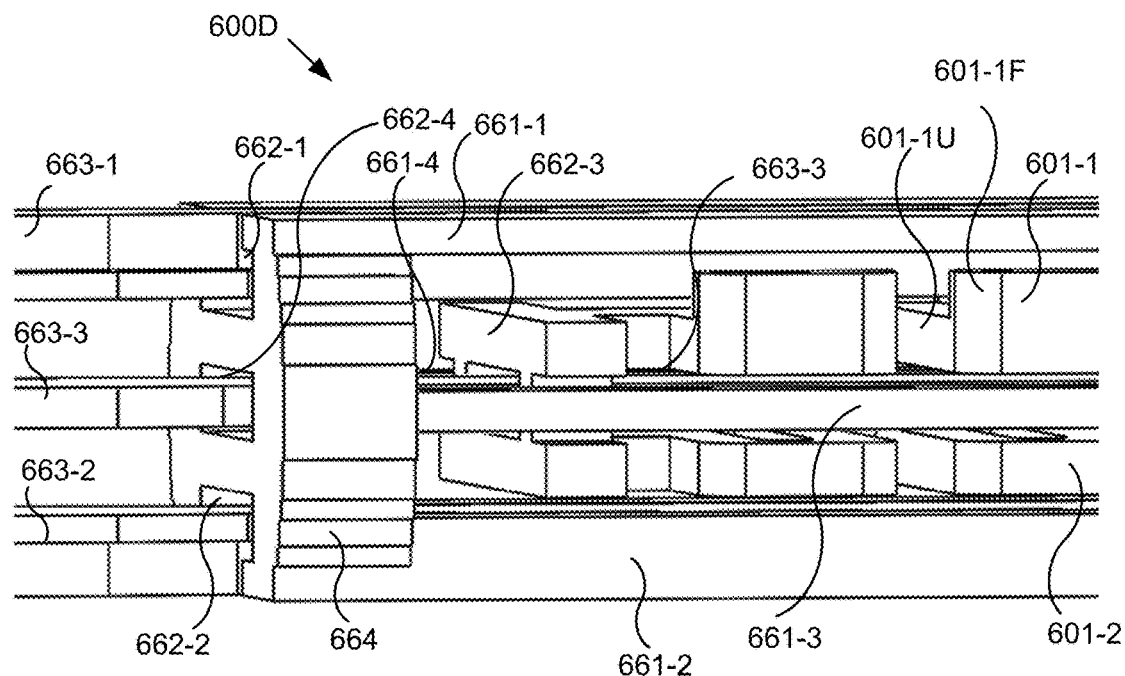

Fifth Embodiment—Alternative 4: Probe with Enhanced Stabilizing Guide Elements, and First and Second Springs, with the First Spring Including a Two-Segment Configuration (Compression and Extension FIG. 6D-1 provides an isometric view of a probe 600D according to another embodiment of the invention that provides functionality and structural relationships similar to those set forth in the probe of FIG. 6C wherein the probe includes first and second relatively movable structures S1 and S2 and three compliant elements including a second spring 602 as well as two probe segments 601-1 and 601-2 connected in series to form a first spring. Structure S1 includes the first tip arm 611 and tip 611T (which may be used to make contact with a contact or bonding pad of a first electrical circuit element), guide arms 661-1 to 661-4 (with only 661-1 to 661-3 being visible) and end connector 664 that joins the guide arms while structure S2 includes guide arms 663-1 to 663-3 and movable stop 622 where S1 and S2 can slide relative to each other. S1 and S2 are connected by a spring assembly or spring group which includes a tensional portion or segment 601-2 that has a right end that joins the right end of S2 and a left end that joins the left end of a compressional spring segment 601-1 via a slidable connector 662-3, which can slide relative to the guide arms of both S1 and S2, which in turn, at a right end, joins S1. The left end of S2 is shown with as movable stop 622 which connects on its left to a second spring 602 which in turn connects to a tip arm 612 which ends in tip 612T. The tip 612T may be used to make electrical connection with a contact pad of a second electrical circuit element (e.g. a DUT or device under test, which may be an integrated circuit still in wafer form) and which, in alternative embodiments, may take on a variety of different forms other than the blunt flat tip configuration of the current example. As shown, movable stop 622 is separated from the right end of S1 to leave a gap 670-3 that allows compression of tip 612T toward tip 611T.

FIG. 6D-2 provides a close up view of the left most portion of the probe of FIG. 6D-1 so that various key elements can be better seen including: (1) Tip 612T; (2) Tip arm 612, (3) Second spring 602, (4) gap 670-3, (5) Three guide arms 663-1, 663-2, and 663-3 of S2; (6) Main guide arms 661-1, 661-2, 661-3 of S1 (661-4 is out of view but corresponds to 661-3 on the opposite side of the probe); (7) Sliding interfaces or slots 662-1 and 662-2 for the T-shape rails or guides of S2, and the complementary shaped guides 661-1 and 661-2 formed by the guide arms of S1; and (8) Tensional segment 601-2 and the compressional segment 601-1, and the connector 662-3 that joins the two segments together and allows for sliding along both S1 and S2. Furthermore, in this example, guides 663-1, 663-2, and 663-3 can be seen as having narrowed regions 683-1, 683-2, and 683-3, respectively, where the narrowed regions can be used to provide a larger gap between the guides and the openings in end 664 during fabrication of the assembled but not fully engaged probe (e.g. where formation occurs using a multi-layer electrochemical fabrication method), whereafter S1 and S2 are transitioned to a working or operational configuration by pressing the ends of the probe together wherein the wider regions of the guides are brought into the openings of 664, thereby narrowing the gap and providing a probe with a more stable operational configuration. For example, during formation, the gap is larger than a minimum feature size (e.g., a size that allows formation of the features to occur with desired or required yield, e.g., 80, 90, 95, or even 99%, or more, feature yield for a given fabrication process) which may be, for example, as large as 5, 10, 20, 30 microns or more. After transition to a working configuration, the gap is smaller than the minimum feature size, for example, and the gap may be reduced to 10, 5, 2 microns or even less. In other probe embodiments of the invention, such configuration size changes between interface regions for fabrication and use may be designed into other probe regions to improve stability and probe operation.

FIG. 6D-3 provides an isometric view of the left end of S1 and S2 from a different angle compared to that of FIG. 6D-2 so that additional features can be more readily seen such as the retention flanges 601-1F at the top of the undulations 601-1U of the compressive spring segment 601-1 which engage a slot along the bottom of guide arm 661-3 with similar flanges on the spring segment on the opposite side of the probe engaging a counterpart guide arm 661-4 on that side (see FIG. 6D-4).

FIG. 6D-4 provides a view of the left end of S1 from a different angle compared to that of FIG. 6D-2 of FIG. 6D-3 so that additional features may be more readily seen such as: (1) The double I-configuration of the connector 662-3 that joins spring segments 601-1 and 601-2 while allowing the central bar 663-3 of S2 and side bars 661-3 and 661-4 of S1 to pass through it; and (2) Flanges 601-1F at the ends of undulations 601-1U (i.e. the elastically deformable compliant building blocks) of the compression spring segment 601-1.

Figures 5, 6D:
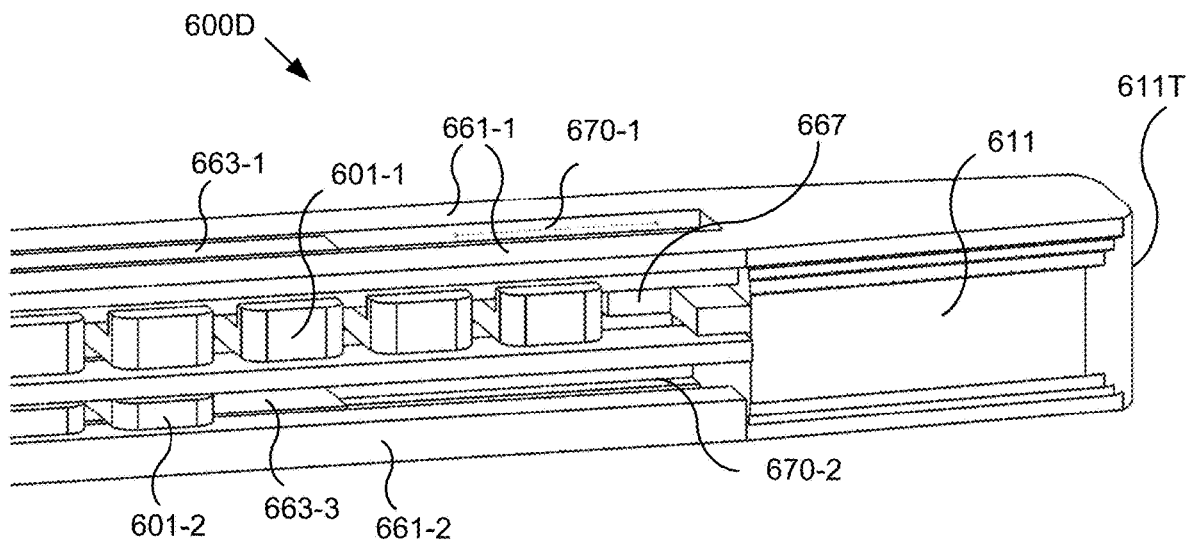

FIG. 6D-5 provides an isometric view of the right most ends of S1 and S2 so that select features may be more readily seen such as: (1) Attachment structure 667 joining the right end of the compression spring segment 601-1 to tip arm 611 of S1; and (2) Gaps 670-1 and 670-2 that provide space for elements 663-1 and 663-2 to move into during compression of the probe tips 611T and 612T toward one another.

Figures 6, 6D:
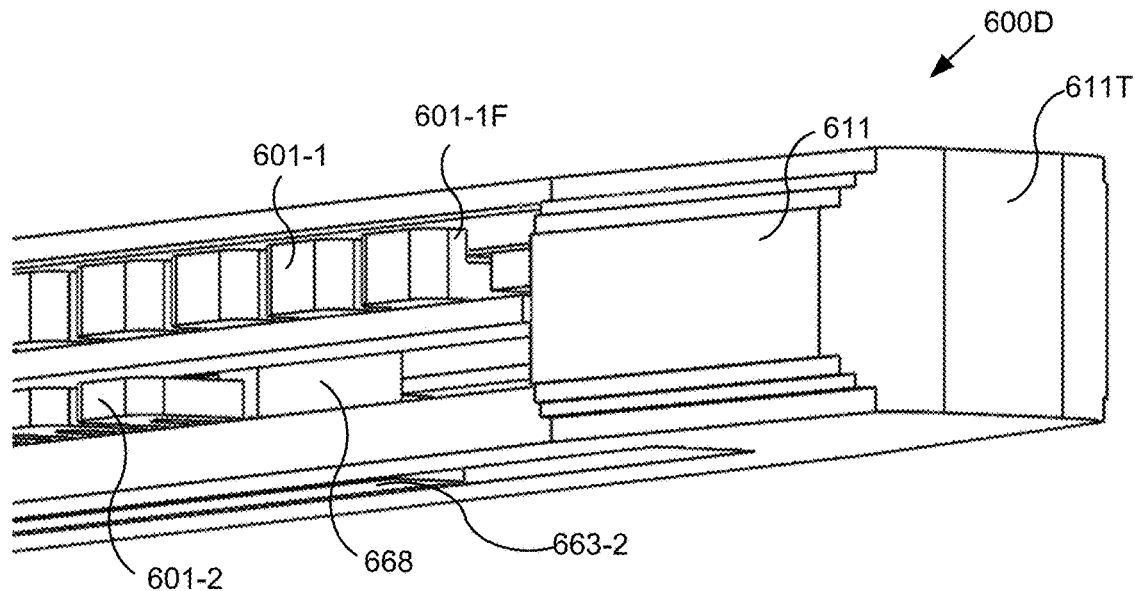

FIG. 6D-6 provides an isometric view of the right most ends of S1 and S2 from a different angle than that shown in FIG. 6D-5 so that selected features may be more readily seen such as the attachment structure 668 that joins the right end of the tension spring segment 601-2 to the right end of the lower bar 663-2 and/or to the central bar 663-3 of S2.

Numerous variations of this embodiment are possible and include for example: (1) adding to the present embodiment features associated other embodiments or replacing some of the features of the present embodiment with those from one or more other embodiments, (2) using or including a different number of stabilizing guides, (3) using or including a different configuration of stabilizing guides, (4) using or including a different number of springs and with different configurations, including different numbers of segments and/or types of segments and/or positional relationships between segments, and/or different connection relationships between segments and other segments or between segments and coupling structures, (5) using or including different tip configurations. (6) using or including different connecting elements that join the spring segments where the connecting elements may or may not provide guide features, (7) using or including fixed stop features, (8) using or including different or additional movable stop features, (9) using or including interface features that aid in aligning with and engaging fixed stop features that are part of array structures, (10) using or including interface features that aid in array loading and retention, and (11) using or including additional features for aiding in the pre-biasing of spring segments.

Still other embodiments may be created by combining the various embodiments and their alternatives with other embodiments and their alternatives as set forth herein Sixth Group of Embodiments: Probe with First and Second Springs with the First Spring Including a Two-Segment Compression Spring that is Separated from a Second Spring by a Movable Stop that Interacts with a Fixed Stop Probes of the sixth group of embodiments have a first two-part (or two segment) spring that includes two compression spring segments operating in series which are separated from a second compression spring by a movable stop. The springs also individually support probe tip arms which in turn support a tips. The movable stop interacts with a fixed stop that may or may not be part of the probe to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Sixth Group of Embodiments—Alternative 1: Probe with Different Springs

Figure 7A:
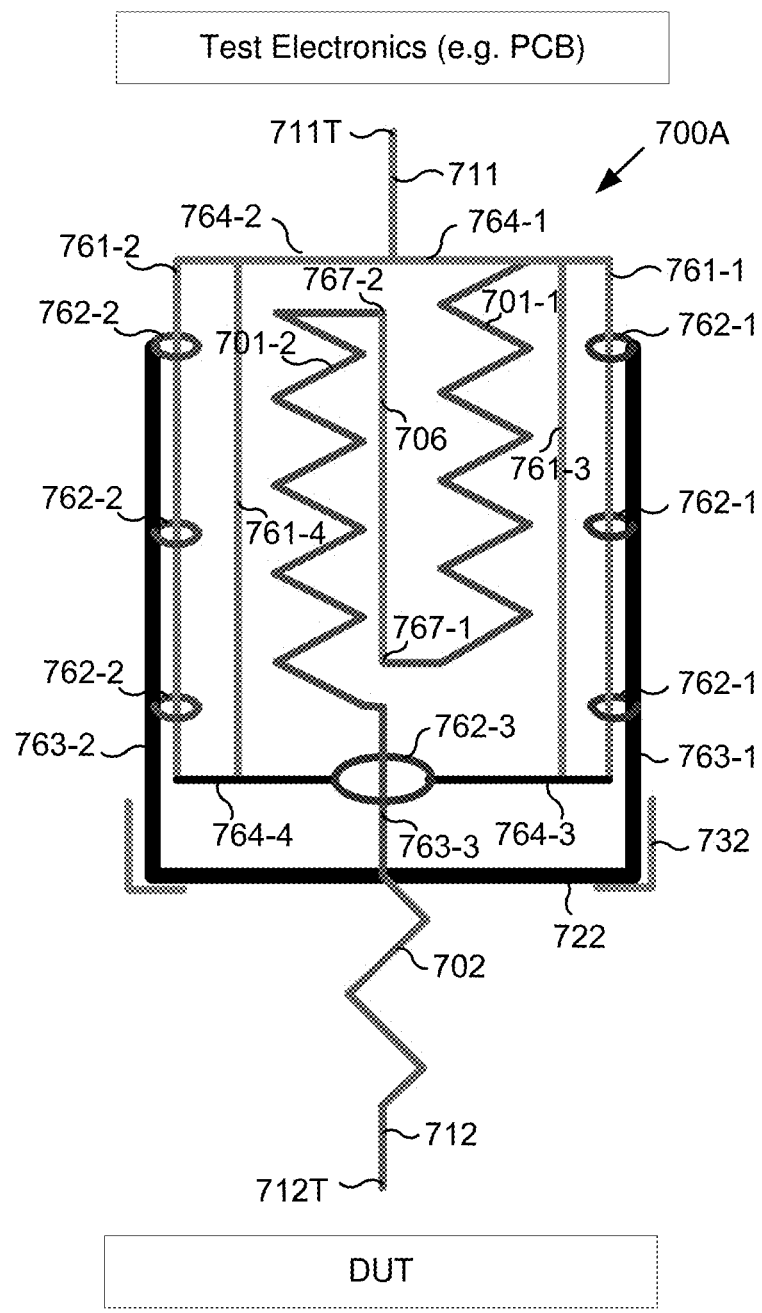
FIG. 7A provide schematic representation of a probe according to a sixth group of embodiments where the probes include first combination spring and second compressional spring separated by a movable stop with the first spring divided into a first compression segment that is in series with a second compression segment and where the probe includes enhanced stabilization features.

FIG. 7A provides similar schematic view of probe 700A which is similar to the probe shown in FIG. 6C with the exception that instead of spring 701-1 and 701-2 including both a compression spring and an extension spring as did spring 601-1 and 601-2 of FIG. 6C, spring 701A includes two compression spring segments 701-1 and 701-2 that are joined by a connecting bar 706.

Sixth Group of Embodiments—Alternative 2: Probe with Stabilizing Guide Elements

Figures 1, 7B:
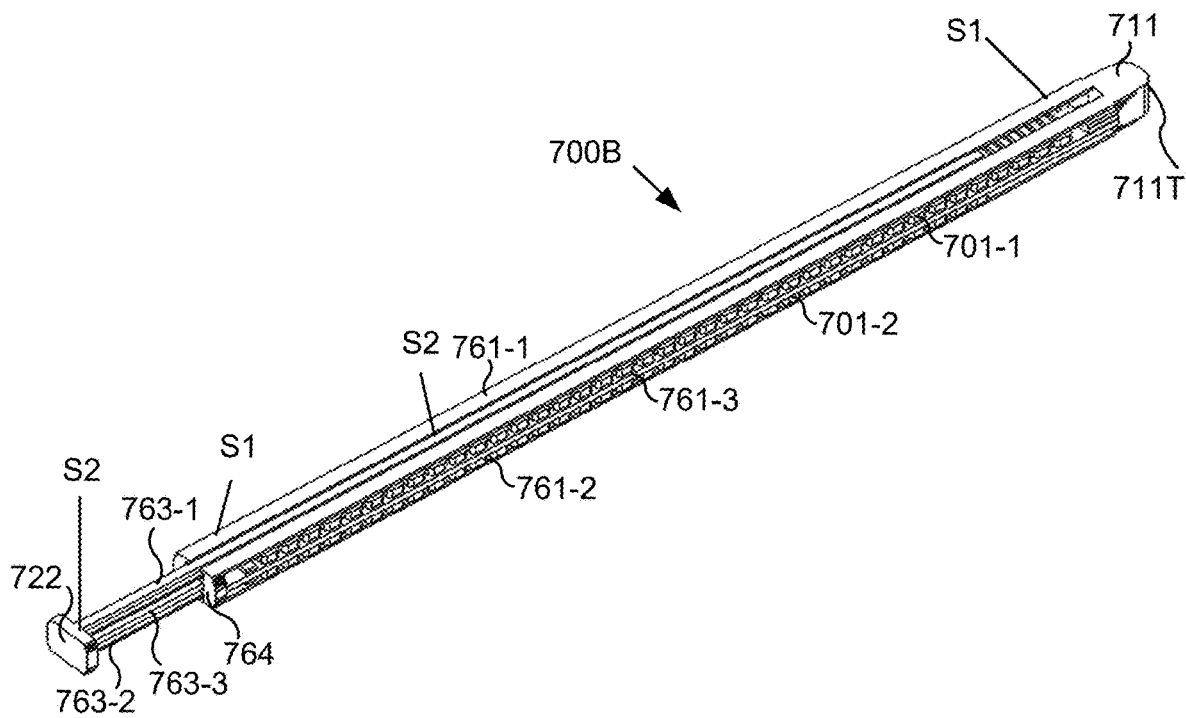
Figures 2, 7B:
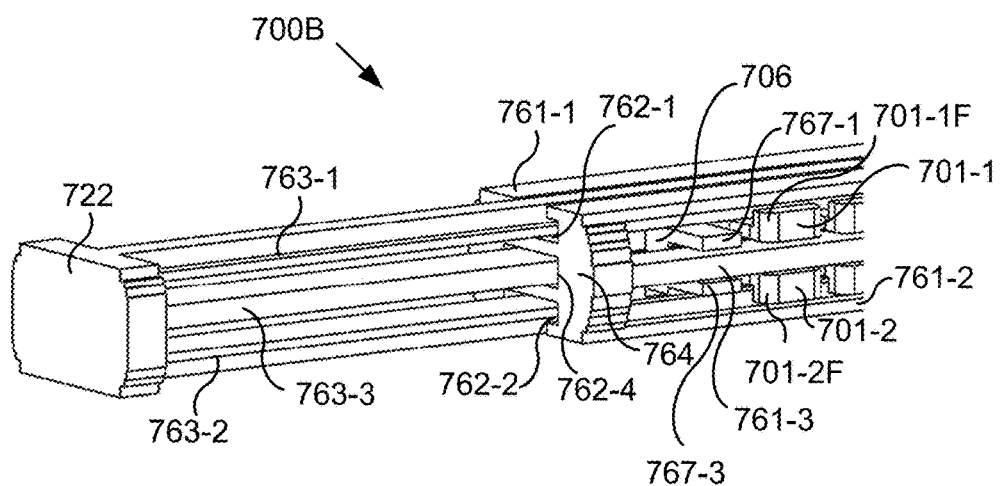
Figures 3, 7B:
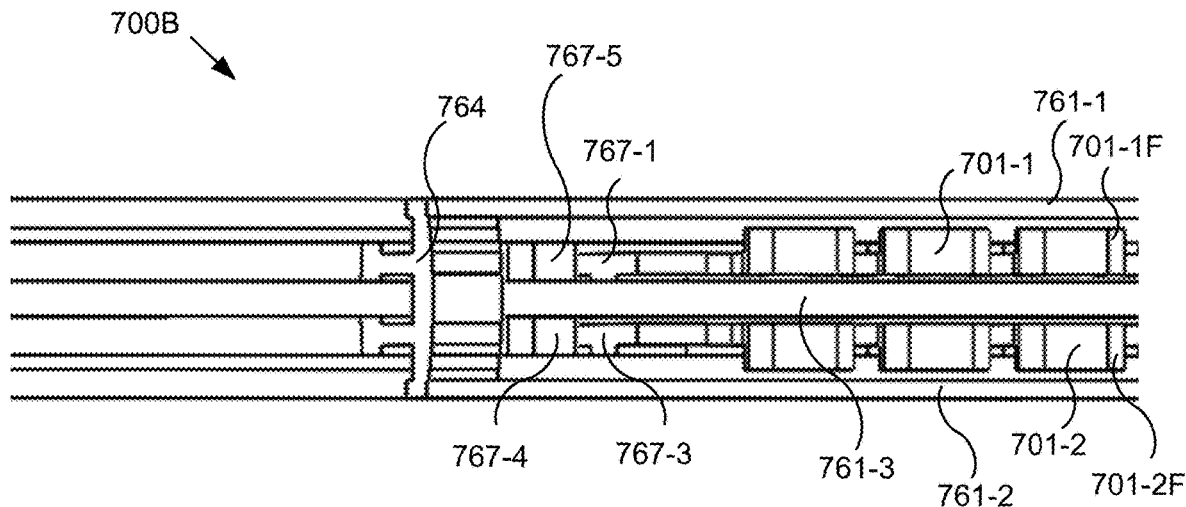
Figures 4, 7B:
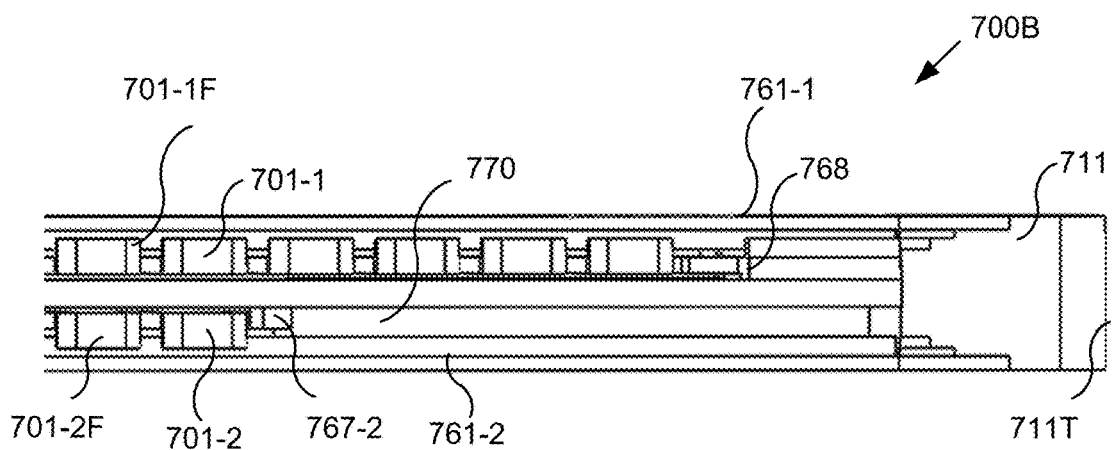

FIG. 7B-1 provides an isometric view of an example probe 700 operating according to the schematic illustration shown in FIG. 7A with the exception that FIGS. 7B-1-7B-4 do not show the second spring 702, the tip arm 712. or the tip 712T as they have been addressed in conjunction with other figures including FIGS. 6D-1 to 6D-6. It is to be inferred that such additional spring, tip arm and tips are included in the present embodiment, though they may be excluded from some embodiments though in still other embodiments such a second spring may be replaced by a multi-part segmented spring or by two or more springs with associated moving stops. Similar features in FIG. 7A and FIGS. 7B-1 to 7B-4 are identified with similar reference numerals. Similar features and reference numbering also exist between FIGS. 7B-1 to 7B-4 and other figures in the drawings. The probe includes first structure S1 and second structure S2 that can longitudinally move relative to one another with the upper spring segment 701-1 rigidly connected on one end to S1 (which includes sliding guides 761-1 to 761-3 and tip arm 711) and with segment 701-2 rigidly connected on one end to S2 (which includes guide arms 763-1 to 763-3 and movable stop 722) and with the opposing ends of the two spring segments (right end of 701-2 and left end of 701-1) being rigidly connected to one another by a longitudinally extending connector bar 706 such that the structures and the springs engage one another to provide spring loaded longitudinal movement of probe ends while limiting excessive non-longitudinal movement of the spring segments and other probe elements.

FIG. 7B-2 provides an isometric view of the left most portion of S1 and S2 so that various elements can be better seen:
(1) Three guide arms 763-1, 763-2, and 763-3 of S2,
(2) Three main guide arms 761-1, 761-2, 761-3 of S1 (the fourth guide arm opposite 761-3 is not visible),
(3) Sliding interfaces 762-1 and 762-2 formed by the T-shape guides 763-1 and 763-2 of S2 and the complementary faces of guides 761-1 and 761-2 of S1,
(4) Lower compressional spring segment 701-2,
(5) Upper compressional spring segment 701-1,
(6) Connector 767-1 that joins the upper segment 701-1 to bar 706 (with 706 extending from the left end of spring segment 701-1 to the right end of spring segment 701-2 via connection element 767-2 (see FIG. 7B-4) that allows for sliding of the opposing ends of the spring segments (right end of segment 701-1 and left end of segment 701-2) along both S1 and S2,
(7) Connector 767-3 that connects the left end of spring segment 701-2 to guide bar 763-2 of S2, and
(8) Slide 764 that is affixed to S1 but retains and allows movement of S2 structures via interfaces 762-1 that allows movement of 763-1, 762-2 that allows movement of 763-2, and 762-4 that allows movement of 763-3, and
(9) Flanges 701-1F at the top of the upper spring 701-1 and flanges 701-2F at the bottom of the lower spring portion 701-2 that ensure that the segments do move out of their intended compressive tracks along guides 761-1 and 761-2.

FIG. 7B-3 provides an isometric view of the left end of S1 and S2 from a different angle compared to that of FIG. 7B-2 so that additional features can be more readily seen:

(1) Connection element 764 that connects upper guide rail 761-1, center guide rail 761-3, and lower guide rails 761-2 of S1 to one another,
(2) Connection element 767-3 that connects the left end of spring segment 701-2 to guide 763-2 of S2,
(3) Connection elements 767-4 and 767-5 which connect 763-2 to 763-3 and 763-3 to 763-1, respectively, and
(4) Retention flanges 701-1F at the top of the compliant elements of upper spring segment 701-1 and retention flanges 701-2F at the bottom of the compliant elements of the lower spring segment 701-2 and how the flanges engage and can slide along the stems of main guide arms 761-1 and 761-2 (with similar flanges on the spring segments on the opposite side of the probe engaging the guide arms on that side—not visible).

FIG. 7B-4 provides an isometric view of the right ends of S1 and S2 so that certain features may be more readily seen:
(1) Connection structure 767-2 that joins bar 706 to the right end of the compression spring segment 701-2 with bar 706 extending longitudinally to the left end of spring segment 701-1 where it is joined to spring segment 701-1,
(2) Connection structure 768 which joins the at right end of spring segment to S1 via tip arm 711 which ends at tip 711T,
(3) The sliding engagement of the compliant elements of spring segment 701-1 to upper guide 761-1 via flanges 701-1F,
(4) The sliding engagement of the compliant elements of spring segment 701-2 to lower guide 761-2 via flanges 701-2F, and
(5) Gap 770 to the right of connection structure 767-2 to allow compressive movement of spring segments and S2 elements relative to S1 elements.

Still other embodiments may be created by combining the various embodiments and their alternatives which have been set forth herein with other embodiments and their alternatives which have been set forth herein.

Seventh Group of Embodiments: Probe with a Two-Segment First Spring and a Second Spring with Both Located on the Same Side of an Intermediate Movable Stop Probes of the seventh group of embodiments have a first two-part (or two segment) spring that includes an extension spring operating in series with a compression spring which connects to a second extension spring on the same side of a movable stop. The tension spring segment and the second spring also individually support a probe tip arm which in turn supports a tip. The movable stop interacts with a fixed stop that may or may not be part of the probe to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Seventh Group of Embodiments—Alternative 1: Probe with Different Springs

Figure 8A:
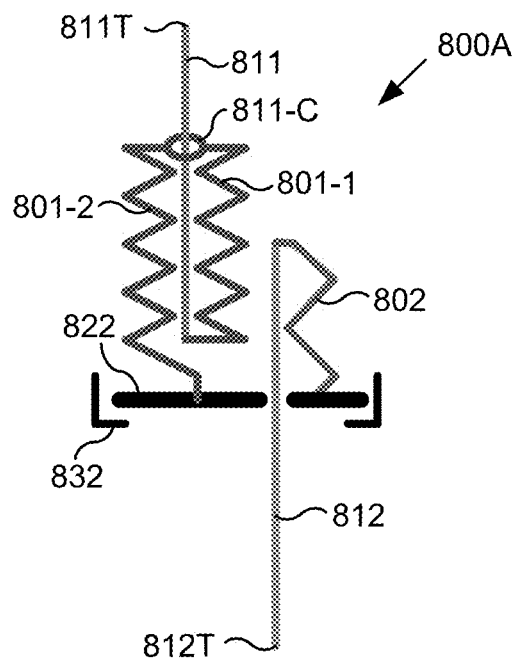
FIGS. 8A-8B provide two different versions of probes according to a seventh group of embodiments where the probes include first combination spring and second extension connected to the same side of movable stop with the first spring divided into a first extension segment that is in series with a second compression segment.

FIG. 8A provides a schematic representation of a probe 800A according to another embodiment of the invention where the probe includes a first two-part spring with an expansion segment 801-1 joined in series to a compression segment 801-2 which is in turn is connected in series to a second expansion spring 802 where the second spring is stiffer (e.g. has a larger spring constant and as such has a lower compliance) than that of the two-segment first spring, and where the first and second springs are located on the same side of a movable stop and are functionally joined by the movable stop 822 that is made to move longitudinally with the respect to the springs and made to contact a fixed stop 832 (that may or may not be part of the probe) upon initial loading (i.e. compressing) of the first tip 811T against a circuit element (e.g. non-DUT electrical contact pad or bump (not shown) but prior to the second tip 812T being compressed against a pad or bump of a DUT (not shown) and wherein upon contacting the second spring to a DUT and compressing the second spring from a zero force state to a compressed force equal to the compressing force initially used to bias the first spring, the effective spring constant reduces from that of the second spring to that resulting from a combination of the serial configuration of the two segments of the first spring and the second spring.

Figure 8B:
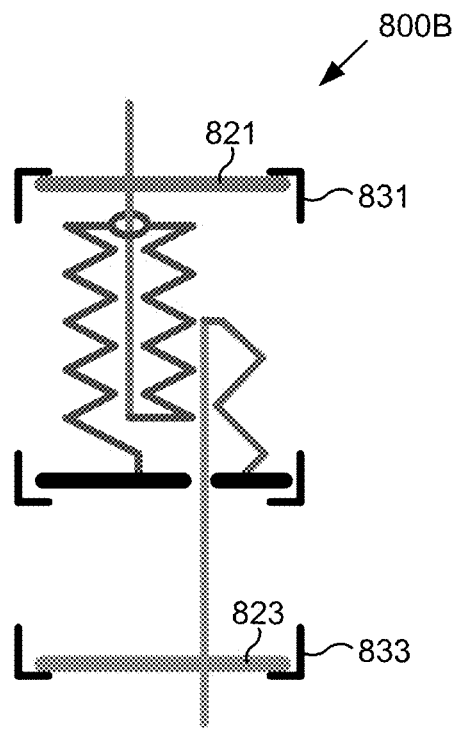

Seventh Group of Embodiments—Alternative 2: Probe with Upper and Lower Movable and Fixed Stops FIG. 8B provides a schematic representation of a probe similar to that of FIG. 8A with the exception that the probe additionally includes an upper movable stop 821 and an upper fixed stop seat 831 and a lower movable stop 823 and a lower fixed stop seat 833 that are respectively used to limit the outward motion of the tip 811T associated with the first two-segment 801-1 and 801-2 spring and the outward motion of tip 812T associated with the second spring 802, respectively, where these stops may provide for an initial biasing of one or both springs (prior to tips contacting circuit elements) and wherein the biasing may result in the intermediate movable stop being positioned away from the intermediate fixed stop (as shown) prior to application of a force to the contact tip associated with the first spring (i.e. the multi-segment spring associated with the upper tip).

Eighth Group of Embodiments: Probe with a Two Segment First Spring and a Two Segment Second Spring with the Springs Located on Either Side of an Intermediate Stop Probes of the eighth group of embodiments have first and second two-part (or two segment) springs that connect together via a movable stop with both of the two-part spring including a compression spring segment connected to the movable stop and an extension segment connected to the other end of the compression segment. On opposite end of each extension segment connects to a tip arm which ends in a tip. The movable stop interacts with a fixed stop that may or may not be part of the probe to provide one of several functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Eight Group of Embodiments—Alternative 1: Probe with Different Springs

Figure 9A:
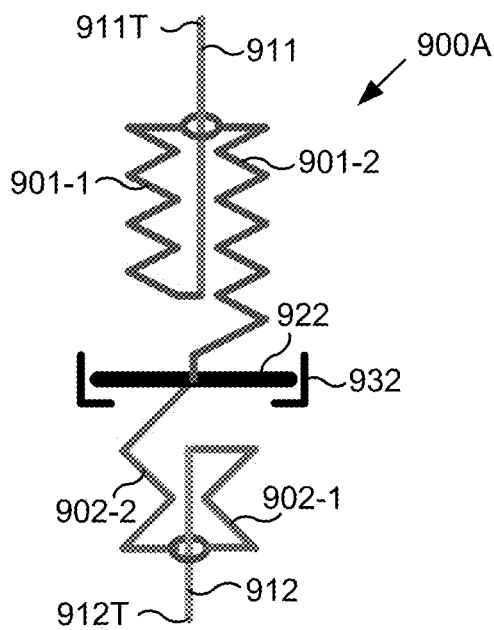
FIGS. 9A-9B provide two different versions of probes according to an eighth group of embodiments where the probes include first combination spring and second combination spring connected to opposite sides of a movable stop.

FIG. 9A provides a schematic representation of a probe 900A according to another embodiment of the invention where the probe includes a first two segment spring with an extension segment 801-1 joined in series to a compression segment 801-2 which is in turn connected in series to a two segment second spring via a slip ring. The second spring includes an expansion segment 902-1 joined in series to a compression segment 902-2 via a slip ring where the second spring is stiffer than the first spring, and where the first and second springs are physically located on opposite sides of a movable stop 922 and are functionally joined by the movable stop that is made to move longitudinally in conjunction with spring compression and extension. In standard use, upon initial contact of a first tip 911 (connected to the first spring) to a first circuit element (e.g. non-DUT electrical contact) the probe is compressed to provide an initial first biasing force that seats the movable stop against the fixed stop prior to a second tip 912 (connected to the second spring) being used to compress the probe while contacting a second circuit element (e.g. a contact region of a DUT) wherein biasing of the second spring from a zero force state to a biased force equal to the first biasing force applied to the first spring, the effective spring constant reduces from that of the second spring to that resulting from a combination of the serial biasing of the first spring and second spring.

Figure 9B:
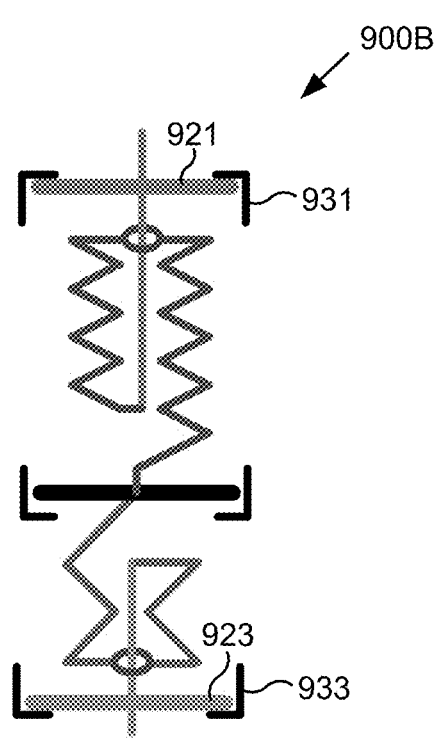

Eighth Group of Embodiments—Alternative 2:
Probe with the Addition of Upper and Lower
Movable and Fixed Stops FIG. 9B provides a schematic representation of a probe 900B similar to that of FIG. 9A with the exception that the probe additionally includes an upper movable stop 921 and an upper fixed stop seat 931 and a lower movable stop 923 and a lower fixed stop seat 933 that are respectively used to limit the outward motion of the tip associated with the first spring and the tip associated with the second spring, respectively, where these stops may provide for an initial biasing of one or both springs (prior to tips contacting circuit elements) and wherein the biasing in this example results in the intermediate movable stop being positioned away from the intermediate fixed stop prior to application of a force to the first contact tip 911. In variations of this example, the biasing caused by the upper and lower stops may cause the intermediate movable stop to contact its fixed stop.

Ninth Group of Embodiments: Probe with Three
Compression Springs and Two Intermediate
Movable Stops Probes of the ninth group of embodiments have three springs in series separated by two movable stops. The two outermost springs also individually support a probe arm which in turn end in a tip. The movable stops interact with respective fixed stops with both stops facing in the same direction with a first fixed stop located between the two movable stops and the other located behind the first fixed stop and the behind its respective movable stop. The fixed stops may or may not be part of the probe. The combination provides at least one of several possible functionalities related to varying probe compliance with increased compression of probe tips, and more particularly to increasing compliance with increased compression of probe tips. Numerous variations of the probes of this group of embodiments are possible and include those listed in association with the first group of embodiments as well as others that will be apparent to those of skill in the art upon review of the teachings herein.

Ninth Group of Embodiments—Alternative 1:
Probe with Different Springs

Figure 10A:
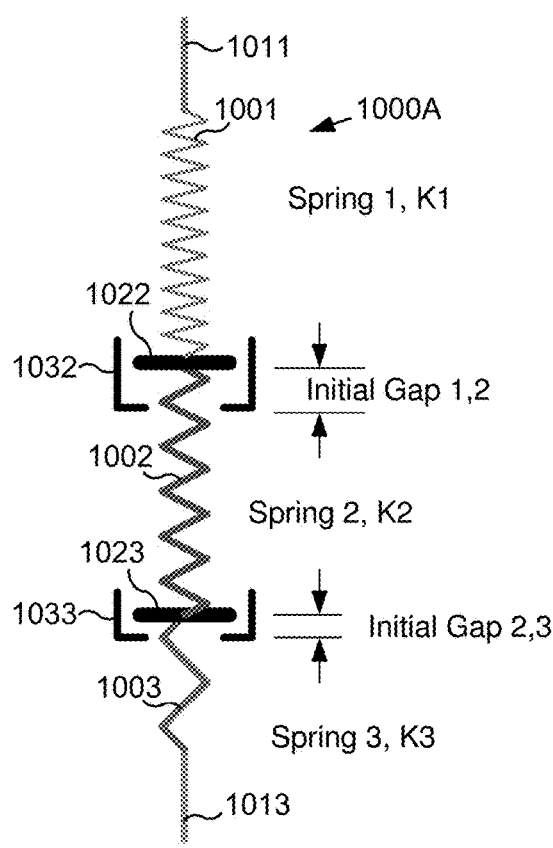
FIGS. 10A-10B provide two different versions of probes according to a ninth group of embodiments where the probes include three springs in series with each spring separated from its neighbor or neighbors by a movable stop.

FIG. 10A provides a schematic representation of a probe 1000A according to another embodiment of the invention where the probe includes a first (upper) compression spring 1001, second (middle) compression spring 1002, and third (lower) compression spring 1003 where the second spring is stiffer than that of the first spring, and the third spring is stiffer than the second spring, and where the springs are functionally separated by movable stops 1022 and 1023 made to move longitudinally with the compression of the springs with a lower movable stop 1023 made to contact the upper side of a lower fixed stop 1033 prior to the upper movable stop 1022 making contact with the upper side of an upper fixed stop 1032 upon compression toward the fixed stops of a first (upper) tip 1011T connected via arm 1011 to the first spring 1001. The compression of tip 1011 preferably occurs by contact with a first circuit component (e.g. a non-DUT electrical contact) prior to a second (lower) tip 1013T causing compression of the third spring against a second electrical circuit (e.g. a pad or bump of a DUT). Upon contacting the second tip to a DUT and compressing the third spring from a zero force state to a compression force equal to that on the second spring (caused by the initial pressing on the first tip) the effective spring constant reduces from that of the third spring to that resulting from a combination of the serial compression of both the second and third springs and wherein upon further compression when the force exerted by the combined second and third springs matches that exerted by the first spring (caused by the initial pressing on the first tip), after which the effective spring constant again changes from that associated with a series combination of the second and third springs to that associated with a series combination of the first, second and third springs. In some alternative embodiments the lower probe tip may contact a circuit element prior to the first tip completing its compression of the first spring. In other alternatives, additional springs, movable stops, and fixed stops may be added. In other alternative embodiments not all potential compliance changes may be experienced due to insufficient compression occurring. Still other embodiment and compliance changes may be obtained by changing the positions and/or orientations of the fixed stops. Numerous other variations are possible and will be apparent to those of skill in the art.

Figure 10B:
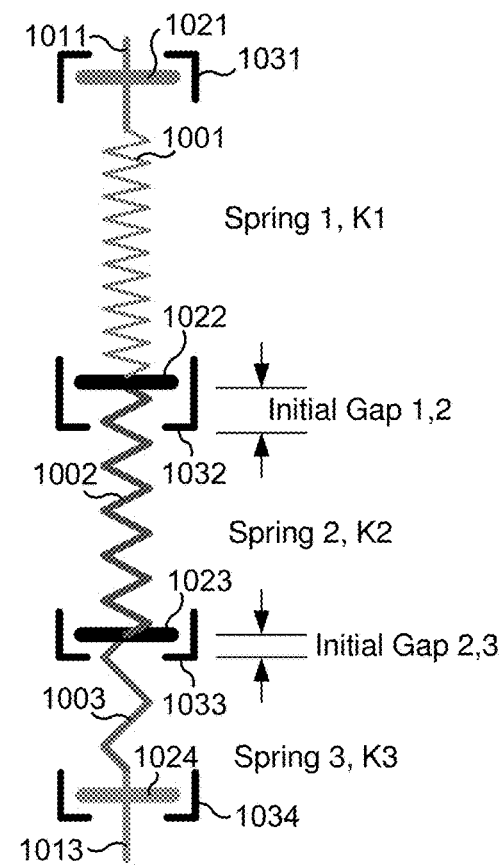

Ninth Group of Embodiments—Alternative 2:
Probe with the Addition of Upper and Lower
Movable and Fixed Stops FIG. 10B provides a schematic representation of a probe 1000B similar to that of FIG. 10A with the exception that the probe additionally includes a movable stop 1021 at the upper end of the first spring and below an upper fixed stop seat 1031 and a movable stop 1024 at the lower end of the third spring and above fixed stop seat 1034 wherein the two added movable and fixed stops are used to limit the outward motion of the tips associated with the first and third springs, respectively, where these stops may provide for an initial biasing of one or more of the first to third springs (prior to tips contacting circuit elements) and wherein the biasing as shown in this example results in the intermediate movable stops being positioned away from the intermediate fixed stops prior to application of a force to the first contact tip. In variations of this example, the biasing caused by the upper and lower stops may cause one or both the intermediate movable stops to contact their fixed stops.

Tenth Group of Embodiments: Assembly to Form Arrays and/or Probes with One or More Pre-Biased Springs and/or More Stable Configurations Including Two or More Springs and One or More Movable Stops

Figure 11A:
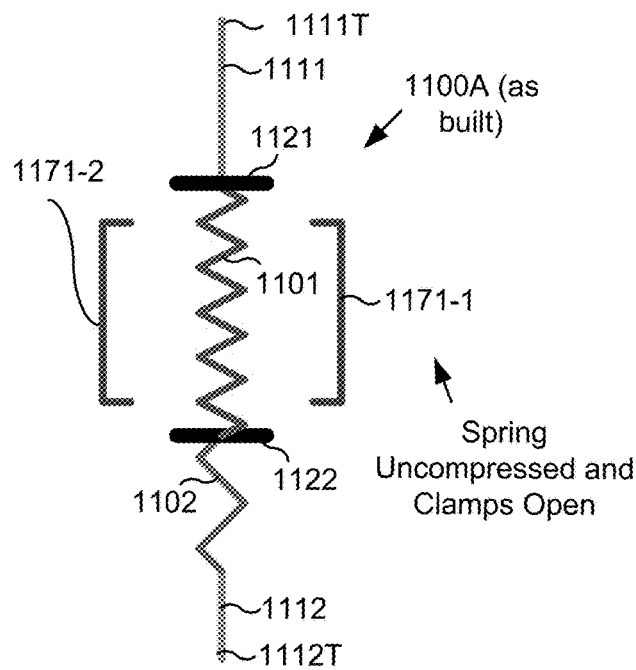
FIGS. 11A-11B provide before and after images of a two-spring probe according to a first alternative of a tenth group of embodiments of the invention where the probe is initially formed in an unbiased state and then is biased using a laterally movable clamping structure.
Figure 11B:
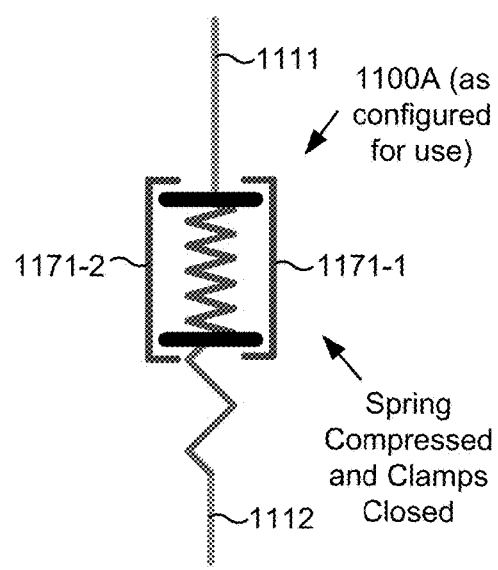

Tenth Group of Embodiments—Alternative 1: Probe with a Laterally Movable Clamping Structure or Sheath for Providing a Compression Bias to an Upper Spring FIGS. 11A and 11B provide schematic illustrations of a dual spring probe 1100A according to another embodiment of the invention wherein the probe includes a first spring 1101 located between two movable stops with a second spring 1102 connected to one of the stops 1122 which in turn connects to a probe arm 1112 which ends in a probe tip 1112T. Another probe arm 1111 extends form the other stop 1121 and ends in a tip 1111T. The probe is formed in a build state (i.e. with the first spring having an uncompressed length as shown in FIG. 11A. The probe is formed with a clamping structure that includes open (i.e. widely spaced) opposing clamp elements 1171-2 and 1171-1 or alternatively such clamp elements are formed separated and located in proximity to the first spring in preparation for probe assembly. After formation of the probes (e.g. by multi-layer multi-material electrochemical fabrication methods) the probe undergoes compressive biasing and the opposing clamps are closed around the compressed movable stops to slidably capture them. Once captured and retained, the biasing is removed, the spring expands to the extend allowed by the clamps leaving a biased assembled probe including the spring assembly, the clamps and any other assembly components (FIG. 11B). During assembly the clamps are held or fixed in place at a desired lateral spacing (i.e. a spacing that provides for slidable retention of the springs and movable stops) by appropriate mechanical means (mechanical locking structures, snap together structures, bonding of structures to one another, or the like). After assembly the probes may be manually or automatically located for individual use or they may undergo assembly with other probes to form arrays. Such array configurations may include insertion of probes into one or more guide plates, bonding to one or more substrates, probe-to-probe connections or the like. In some alternatives, the clamps may not lock together by themselves but may need to be held together until loading of the probes into an array assembly or into another structure that will complete the locking and retention process.

Figure 12A:
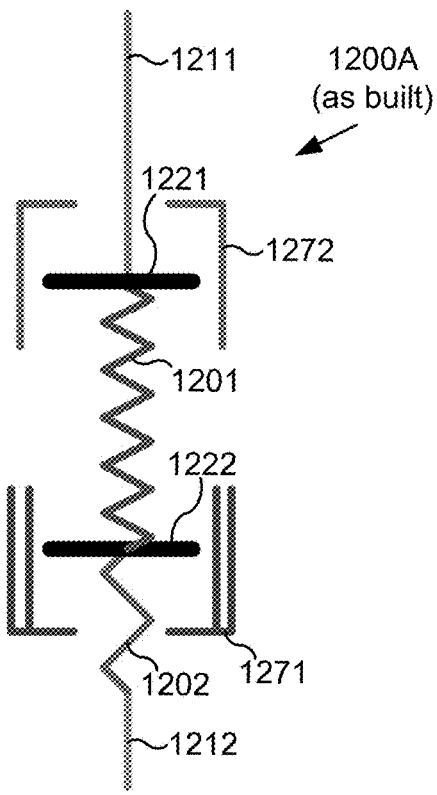
FIGS. 12A-12B provide before and after images of a two-spring probe according to a second alternative of a tenth group of embodiments of the invention where the probe is initially formed in an unbiased state and then is biased using a longitudinally movable clamping structure.
Figure 12B:
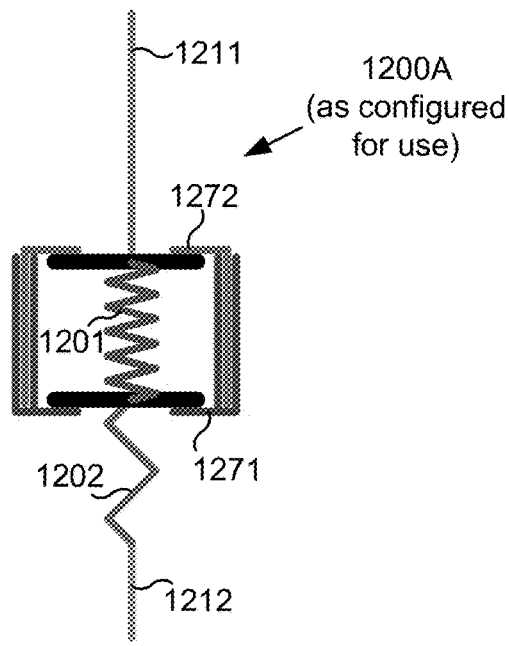

Tenth Group of Embodiments—Alternative 2: Probe with a Longitudinally Movable Clamping Structure for Providing a Compressive Bias to an Upper Spring FIGS. 12A and 12B provide schematic illustrations of a dual spring probe 1200A and an alternative clamping structure according to another embodiment of the invention wherein the probe is formed in a build configuration (FIG. 12A) and after formation (e.g. by multi-layer multi-material electrochemical fabrication methods) the probe undergoes compressive biasing of the upper spring 1201 and simultaneous clamping by the sliding together of interlocking stop structures to produce an assembled probe (FIG. 12B). Interlocking of the clamping structures may occur by frictional contact between the middle arms of the upper fixed stop 1272 with the inner and outer arms of the lower fixed stop 1271. Alternatively interlocking may occur by the arms including sloped features allowing closure with flatter features or even reentrant features discouraging or inhibiting unclamping. Such interlocking may occur after initial probe formation but prior to loading into an array frame or may occur as part of assembling an array.

As with all other figures herein, other elements in FIGS. 12A and 12B may be identified by the similarity between their references numbers and the reference numbers used in other embodiments. As with all other figures herein, still other features may be recognized by their configurational similarity with other features identified in other embodiments.

Figure 12D:
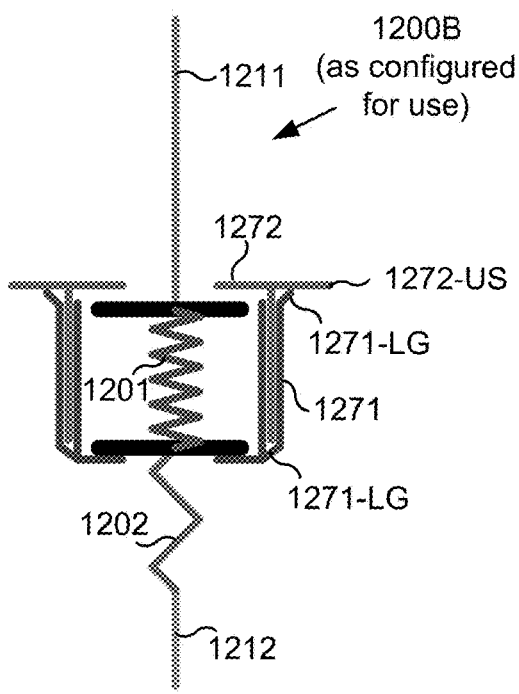
FIGS. 12C-12D provide before and after images of a two-spring probe according to a variation of the second alternative of a tenth group of embodiments of the invention where the probe is initially formed in an unbiased state and then is biased using a longitudinally movable clamping structure that includes enhanced assembly and array mounting features.
Figure 12C:
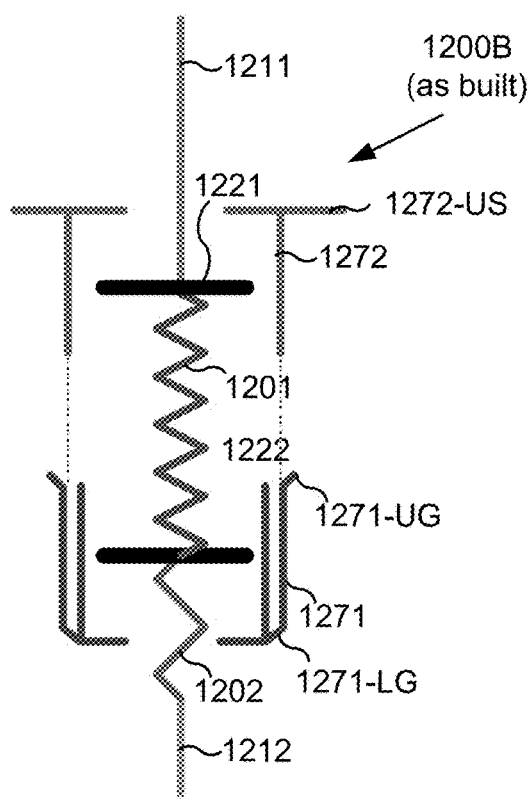
Figures 1, 2, 12E, 12F:
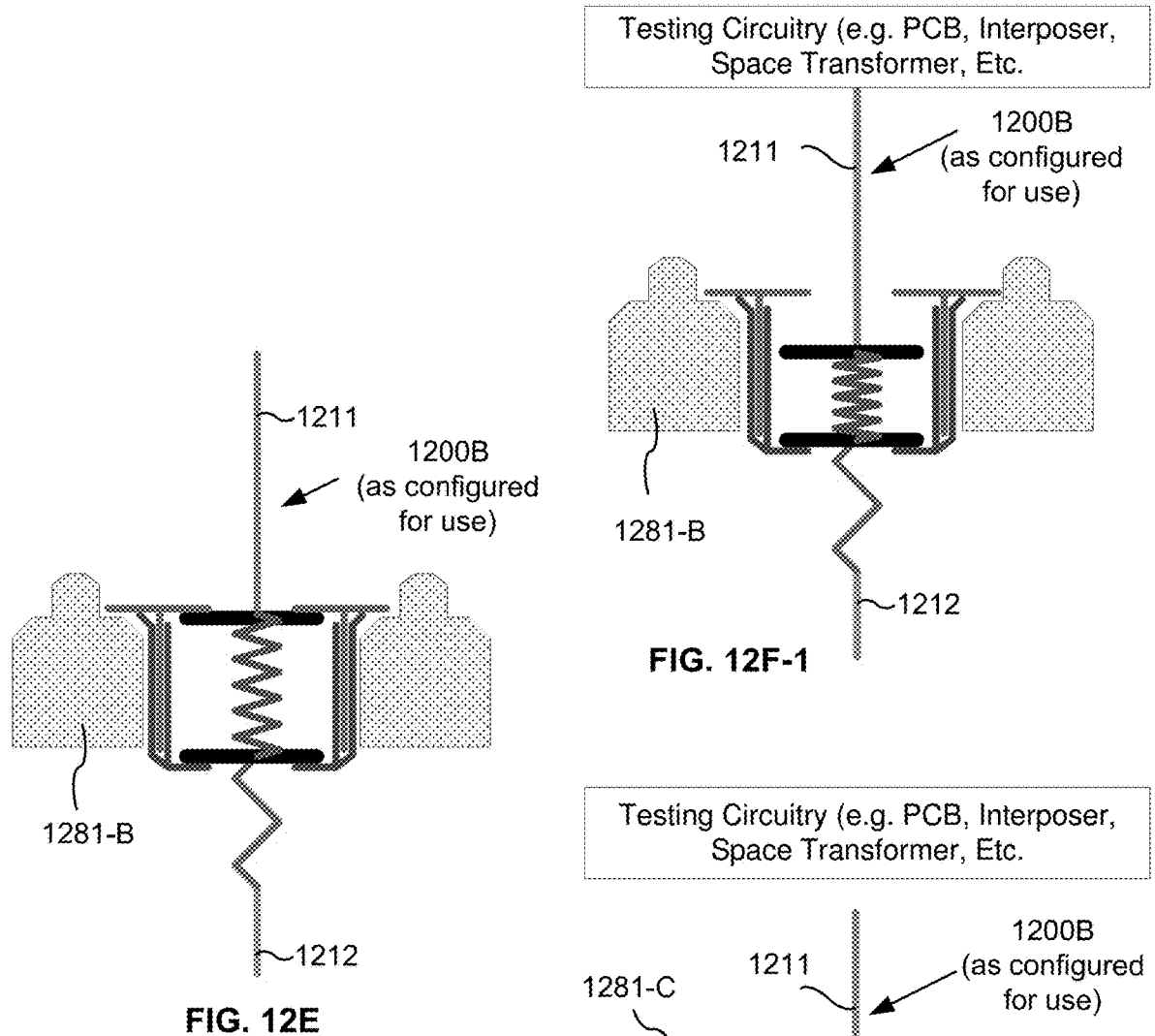

FIGS. 12C and 12D show a probe similar to that of FIGS. 12A and 12B in both a fabrication state (FIG. 12C) and an assembled, configured, or working state (FIG. 12D) but with positioning arms 1272-US extending laterally from the upper fixed stop structure and with sloped guide features 1271-LG located on both the upper and lower portions of the lower stop structure 1271. The positioning arms 1272-US and the lower guide features 1271-LG may be in assembling the probes into array structures or hold them in such array structure. The upper guide features 1271-LG may be useful to guide the down-facing upper arms into the slots of the up-facing lower arms. In other embodiments, alternative positioning arms and other guide features may be included. Another advantage of the present stop configuration is that array structural elements need not be located below the lower most stop structures of the probe thus allowing a reduction in overall probe height or possibly shorting of tip arm length in favor of an enhanced spring height.

FIGS. 12E-12F-1 and 12F-2 show the probe of FIG. 12D being held by an array frame 1281-B (FIG. 12E), by an array frame structure 1281-B and biasing of the spring by an upper tip that contacts testing circuitry (FIG. 12F-1), or alternatively by a lower array frame 1281-B in combination with a capping frame 1281-C (or an upper part of an array frame) that clamps the positioning arms between the frame elements. In other embodiments, other array frame elements may be used in combination with other stop structures and/or positioning arm configurations.

Figure 13A:
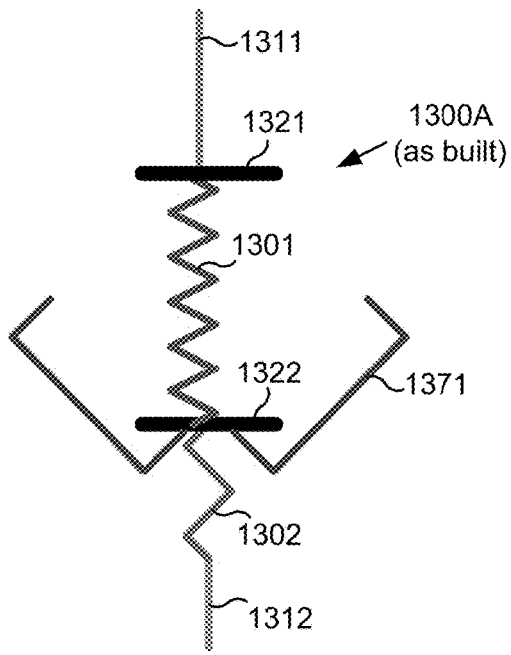
FIGS. 13A-13D provide images of various states associated with a method for bias two-spring probes using a rotatable clamping mechanism according to a third alternative to the tenth group of embodiments of the invention.
Figure 13C:
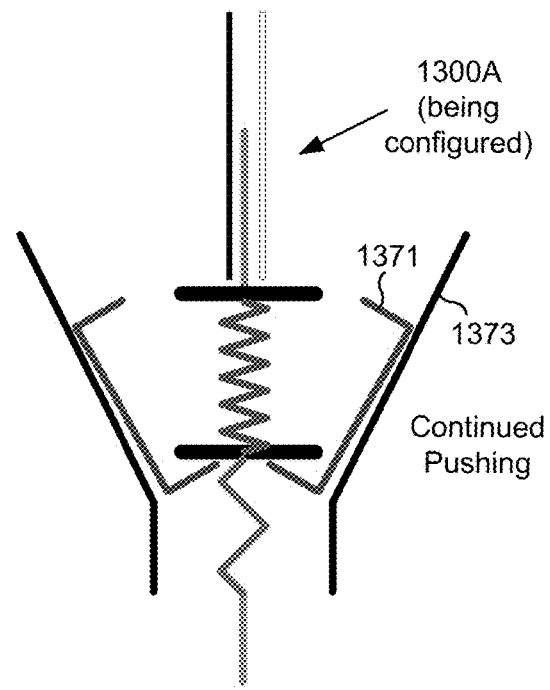
Figure 13B:
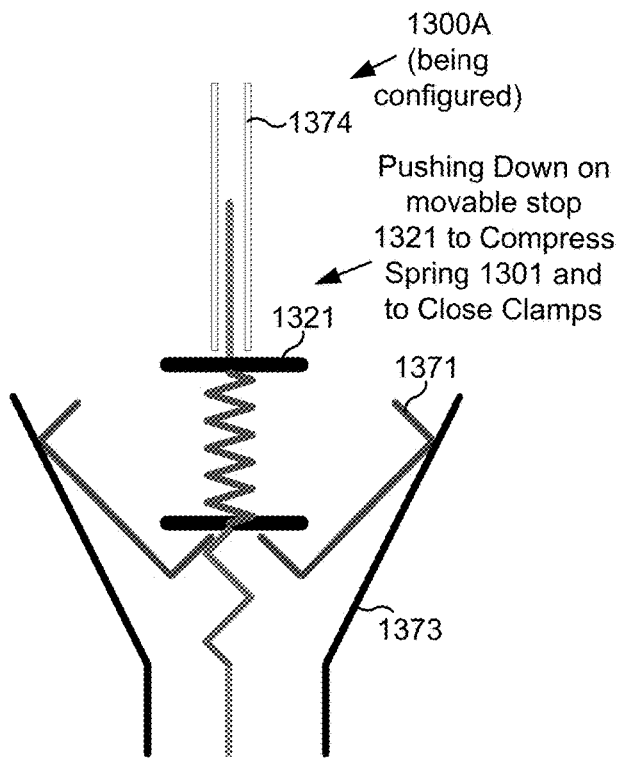
Figure 13D:
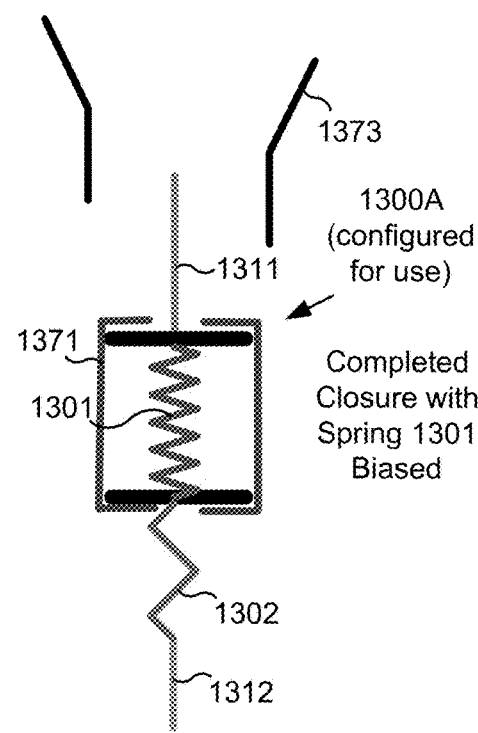

Tenth Group of Embodiments—Alternative 3: Probe with a Rotatable Clamping Structure for Providing a Compressive Bias to an Upper Spring Along with a Method and Means for Loading and Clamping the Spring Portion of the Probe FIGS. 13A-13D provide schematic illustrations of a dual spring probe 1300A along with an alternative clamping structure 1371 according to another embodiment of the invention wherein the probe is formed in a build configuration (FIG. 13A) and after formation (e.g. by multi-layer multi-material electrochemical fabrication methods and release from a sacrificial build material) the combined spring assembly and clamping structure may be converted to a to compressed and clamped configuration by forced rotation of the clamping structures by pressing down on movable stop 1321 while the probe is located in a funnel shaped loading guide 1373. The pressing compresses spring 1301 while causing rotation and closure of the clamps around the compressed spring so that a locked configuration is obtained that engages both movable stop structures and pre-biases spring 1301. Various stages of the loading process are shown in FIGS. 13B-13D.

Figures 14, 29:
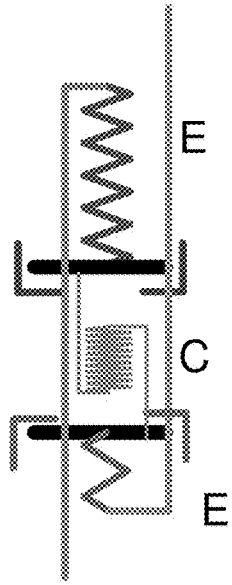

Tenth Group of Embodiments—Alternative 4: Probe with Three Springs and Two Intermediate Stops with a Laterally Movable Clamping Structure for Providing a Compressive Bias to a Middle Spring FIGS. 14A-14B provides schematic representations of a probe 1400A in an unassembled state (FIG. 14A—i.e. fixed stops have not been laterally moved inward to engage with the middle spring and movable stops) and in a fully assembled state (FIG. 14B—i.e. fixed stops have been laterally moved inward to engage with the spring and the movable stops once compressed) according to another embodiment of the invention where the probe includes a first (upper) compression spring 1401, a second (middle or intermediate) compression spring 1402, and third (lower) compression spring 1402 where the springs are aligned for serial operation and where the second spring is less stiff (e.g. has a smaller spring constant and as such has a higher compliance) than the first spring, and the third spring is stiffer than both the first and the second springs, and where the springs are functionally separated by movable stop. Fixed stops are provided by the clamping structure once engaged with the movable stops so as to provide for compressive biasing of the middle spring even in absence of any compressive force being applied to an upper tip 1411T or a lower tip 1412T (i.e. the upper moveable stop presses against the lower portion of the upper fixed stop while the lower moveable stop presses against the upper portion of the lower fixed stop) such that the movable stops on the middle spring can still move away from the fixed stop upon application of sufficient force against either one or both of an upper or lower probe tips wherein a decrease in effective spring constant of the combined springs can occur when pressing either tip against a circuit element with a force greater than that which presses the associated movable stop against the associated fixed stop. In other words, in probes configured, as set forth in this embodiment, a probe with a two-sided step up in compliance can be achieved.

Figures 15, 29:
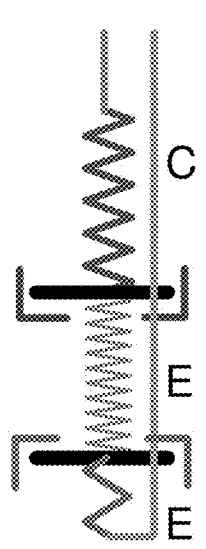
Figures 16, 29:
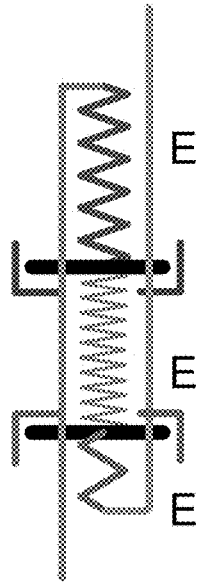

Tenth Group of Embodiments—Alternative 5: Probe with Three Springs and Two Intermediate Stops with a Longitudinally Movable Clamping Structure for Providing a Compressive Bias to an Intermediate Spring FIGS. 15A-15B provides schematic representations of a probe 1500A in an unassembled state (FIG. 15A—i.e. fixed stops have not been longitudinally moved together to interlock connection arms and to engage the springs and movable stops) and in a fully assembled state (FIG. 15B—i.e. fixed stops have been longitudinally moved to engage with the spring and the movable stops) according to another embodiment of the invention where the probe includes a first (upper) spring 1501, a second (middle or intermediate) spring 1502, and third (lower) spring 1503 wherein the springs are serially aligned compression springs and where the second spring is less stiff than the first spring, and the third spring is stiffer than both the first and second springs. The springs are functionally separated by movable stops 1522 and 1523. Once the fixed stop assembly is engaged around the movable stops, fixed stops 1572 and 1573 will provide for compressive biasing of the middle spring even without any compressive force applied to an upper probe tip 1511T or lower probe tip 1512T (i.e. the upper moveable stop presses against the lower portion of the upper fixed stop while the lower moveable stop presses against the upper portion of the lower fixed stop) such that the movable stops on the middle spring can still move away from their respective fixed stops upon application of sufficient force against either one or both of an upper or lower probe tip wherein a decrease in effective spring constant of the combined springs can occur when pressing either tip against a circuit element with a force greater than that which presses the associated movable stop against the associated fixed stop. In other words, in probes configured, as set forth in this embodiment, a probe with a two-sided step up in compliance can be achieved.

Figures 16A, 16B:
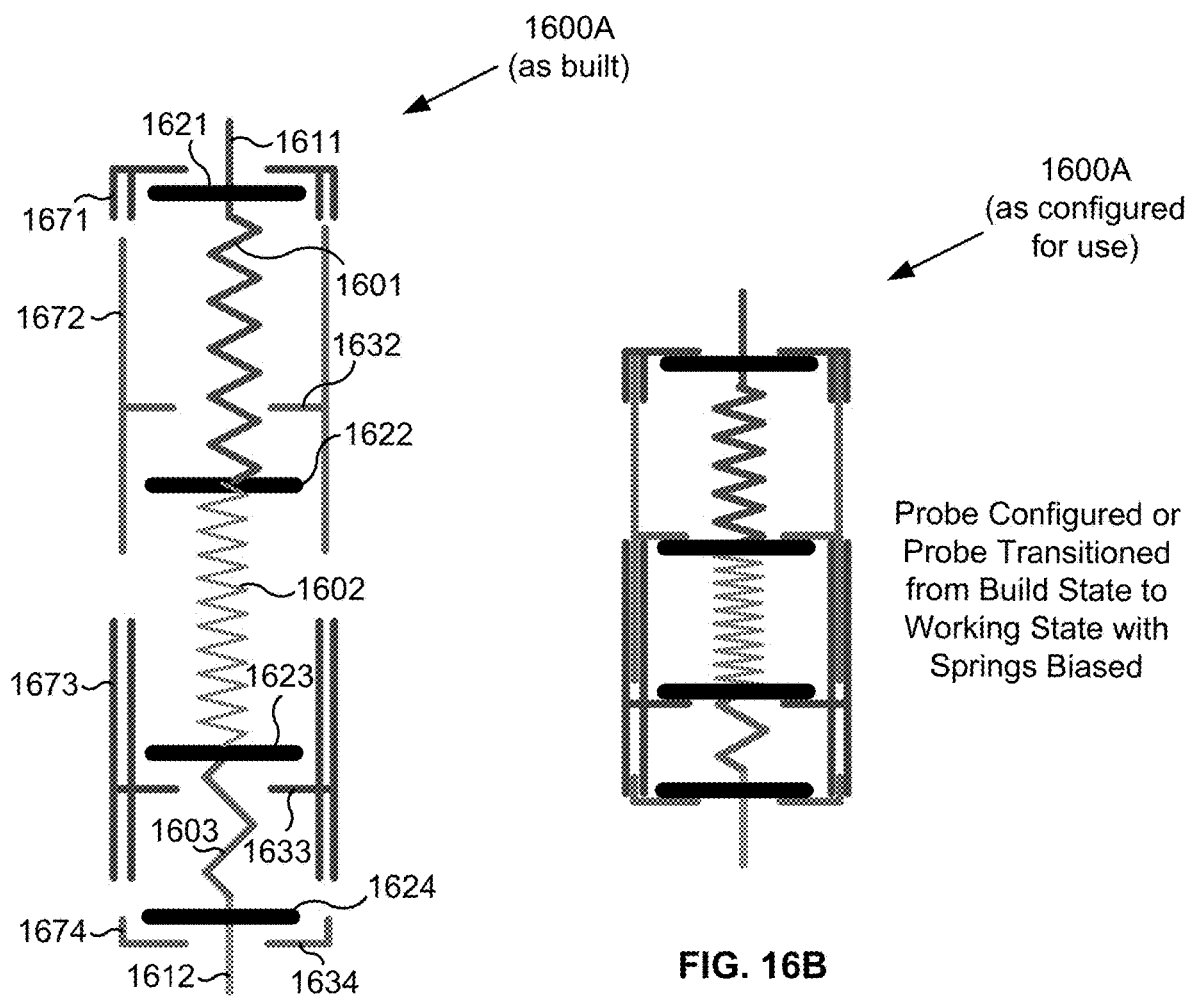
FIGS. 16A-16B provide before and after images of a three-spring probe according to a sixth alternative of the tenth group of embodiments of the invention where the probe is initially formed in an unbiased state and then is biased using a longitudinally movable clamping structure that provides four fixed stops for four movable stops.

Tenth Group of Embodiments—Alternative 6: Probe Having Three Springs and Intermediate, Upper and Lower Movable and Fixed Stops with a Longitudinally Movable Set of Clamping Structures for Providing Capture of the Four Movable Stops Associated with the Three Springs FIGS. 16A-16B provides schematic representations of a probe 1600A in an unassembled state (FIG. 16A—i.e. fixed stops have not been longitudinally moved together to interlock connection arms and to engage with the four movable stops associated with the three springs) and in a fully assembled state (FIG. 16B—i.e. fixed stops have been longitudinally moved together to engage the connection arms along with the movable stops) according to another embodiment of the invention where the probe is similar to that of FIGS. 15A and 15B with exception that movable stops 1621 and 1624 and fixed stops 1671 and 1674 are also included above the upper spring and below the lower spring such that upon assembly not only is the intermediate spring biased but the upper and lower springs are also biased.

Figures 17, 29:
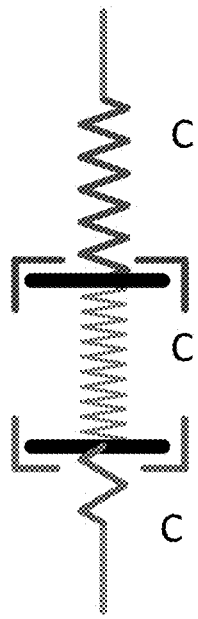
Figures 18, 29:
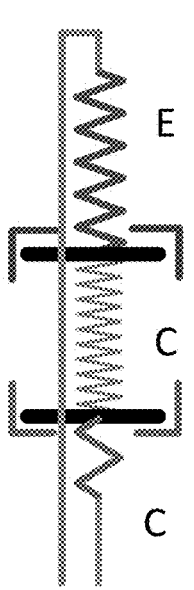
Figures 19, 29:
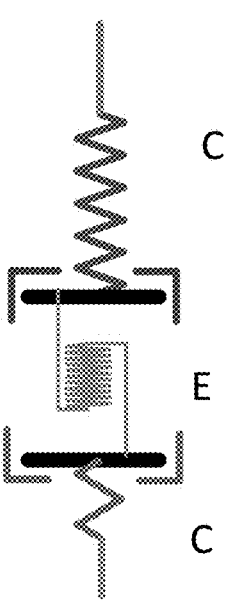
Figures 20, 29:
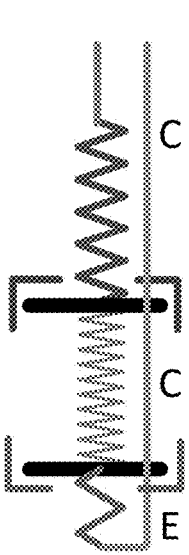
Figures 21, 29:
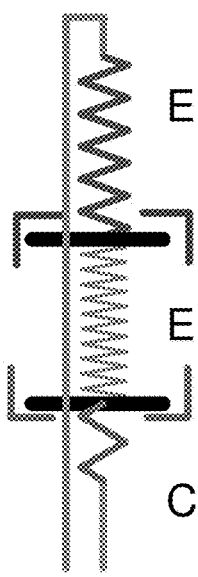
Figures 22, 29:
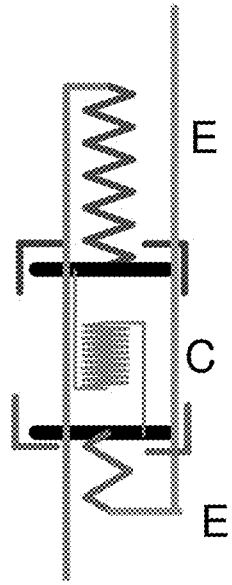
Figures 23, 29:
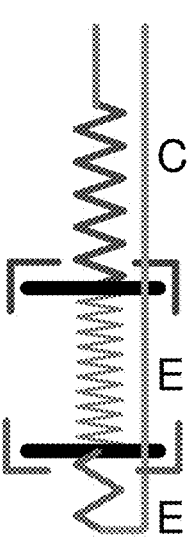
Figures 24, 29:
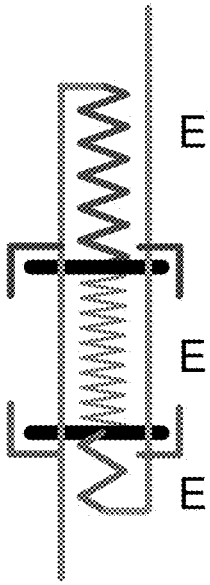
Figures 25, 29:
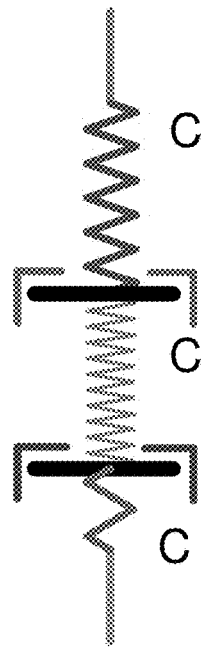
Figures 26, 29:
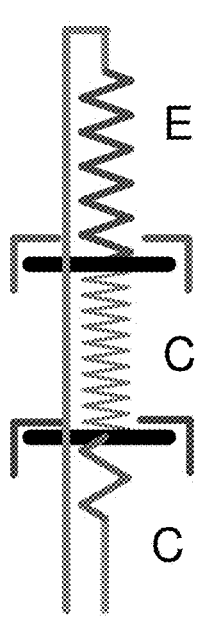
Figures 27, 29:
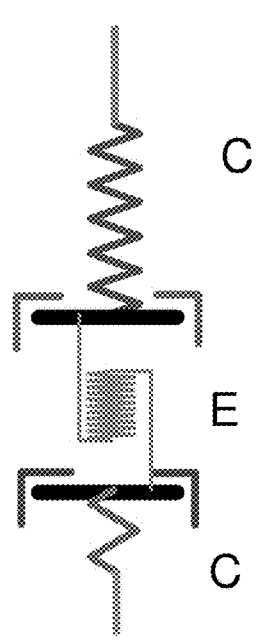
Figures 28, 29:
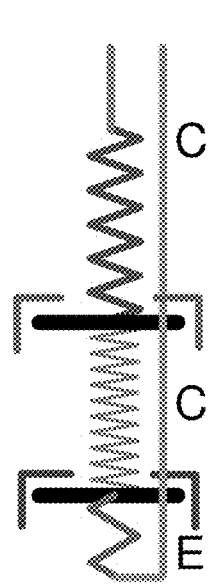
Figure 29:
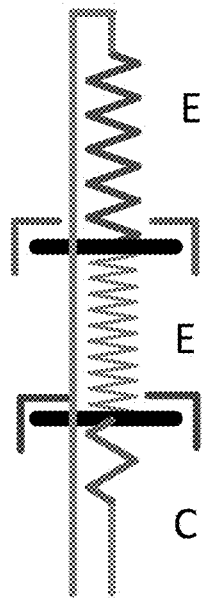

Tenth Group of Embodiments—Alternative 7: Example of an Array Assembly that Includes Probes Having Two Springs and a Movable Stop FIGS. 17A-17C provide side section illustrations of a plurality of probes (two probes in this example) being loaded into an array frame that provides intended lateral (XY) positioning and a fixed stop for limiting the downward motion of the movable probe stop as well as a cap that allows limited upward movement of the moveable probe stop. FIG. 17A shows the probes, lower and upper array regions of the frame with the probes an array frame separated longitudinally but aligned laterally with one another. In FIG. 17A, openings within the array frame our shown with dashed lines). During assembly probes will be inserted into these openings. FIG. 17B—Option 1 shows the state of the process after locating the probes on the lower array frame such that they protrude both above and below the openings. FIG. 17B—Option 2 shows a similar arrangement of the array structure and the probes but further shows that standoffs and a second array structure have been laterally aligned and longitudinally located above the partially completed probe/array plate group. FIG. 17C—Option 1 shows the state of the process after a contact device has been pressed into longitudinal contact with the probes which bias the first spring and holds the probe in place. FIG. 17C—Option 2 shows the state of the process after the standoffs and second array structure of FIG. 17B—Option 2 have been lowered into place to provide an upper fixed stop to limited acceptable movement of the probe's movable stop. In the illustrations of FIGS. 17A-17C (including each of Options 1 and 2 for FIGS. 17B and 17C), the lower array frames and the movable stops of the probes are shown with sloped sidewalls to aid in lateral positioning of the probes during assembly and repeated operation of the probe that involves moving the movable stop away from the fixed stop (i.e. lower array frame in this example) and then allowing it to reseat when contact between the lower tip and a DUT is being made and released. In the Option 1 configurations (FIGS. 17B-Option 1 and 17C-Option 1) and the probes are held in place by pressure between the array frame and testing circuitry transmitted by an upper tip and the spring as the array frame and testing circuitry are pressed and held in position. In the Option 2 configurations (FIGS. 17B-Option 2 and 17C-Option 2) the probes can be held in place in a manner similar to that of Option 1 but also by the fact that the movable stop is trapped between upper and lower array frame elements. In other alternatives, other holding and retention arrangements are possible.

Figure 18A:
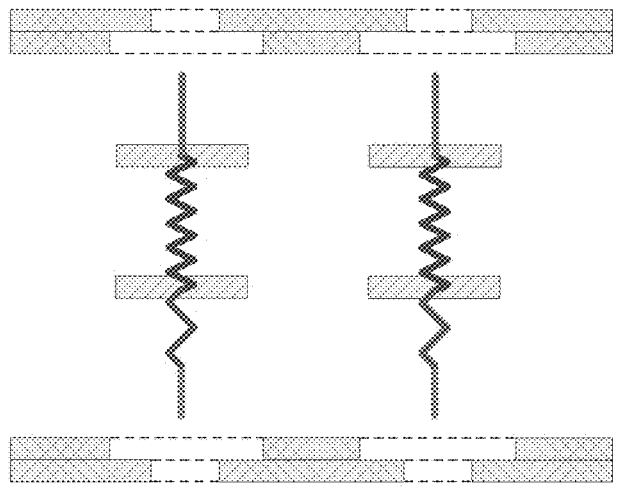
FIGS. 18A-18D provide schematic representations of four states in a process of assembling probes having two-spring in a pair of array structures according to an eighth alternative of the tenth group of embodiments of the invention.
Figure 18B:
Figure 18C:
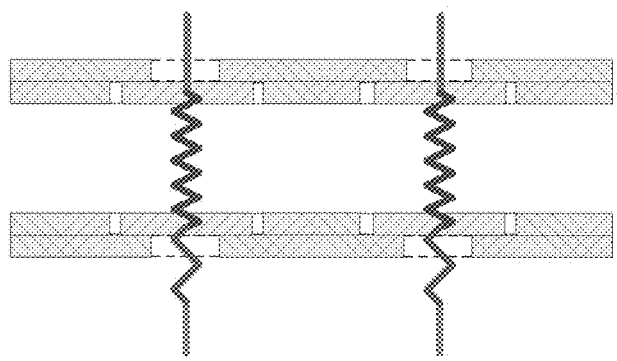
Figure 18D:
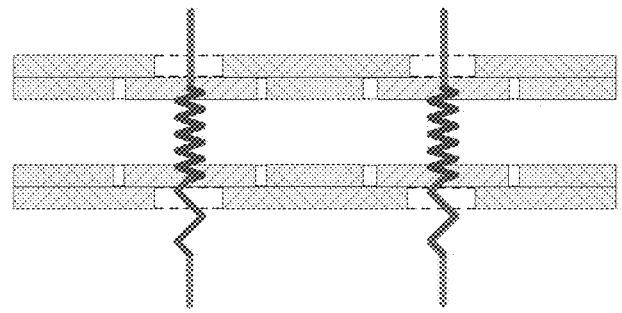

Tenth Group of Embodiments—Alternative 8:
Example of Assembly of Pairs of Array Structures with Probes Having Two-Compression Springs and Two Movable Stops Probes FIGS. 18A-18D provide side section illustrations of a plurality of probes (2 probes in this example) being loaded into a lower and upper array frame (e.g. guide plates) having recesses and through holes for receiving and seating movable stops and passage of tip arms. The array frames together provide for retention and possible compression of the upper spring between two movable probe stops depending on the longitudinal spacing between the upper and lower array frames and the length of the upper spring, wherein intended lateral (XY) positioning is achieved as well as fixed downward and upward stops for extension of the lower and upward movable probe stops wherein FIG. 18A shows the probes and upper and lower array frames separated from, but laterally aligned with, one another prior to assembly where openings (shown as dashed lines) represent holes in these structures through which probe elements (arms and possibly springs extend) after assembly, FIG. 18B shows the state of the process after locating the probes on the lower frame array with lower spring and lower tips protruding through openings in the lower array frame, FIG. 18C shows the state of the process after moving the upper array frame into position above the upper spring stop but prior to any biasing of the upper springs, while FIG. 18D shows the state of the process after further relative longitudinal movement of the upper and lower array frames toward one another cause a desired level pre-loading, or biasing, of the upper springs (i.e. the positions shown in FIG. 18C or 18D where the positions of the array frames may be maintained by standoffs, clamping mechanisms and/or other position stabilizing elements.

Figures 19A, 19B:
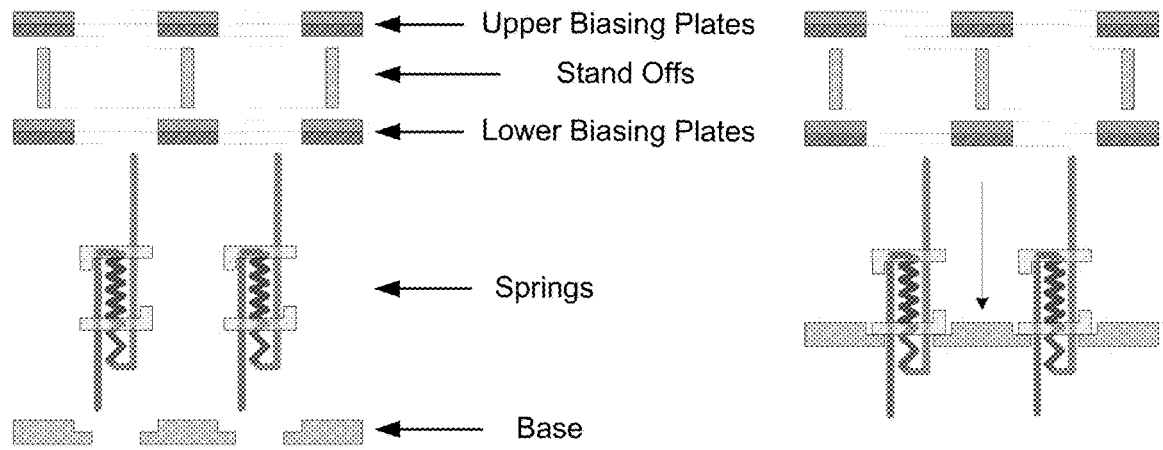
FIGS. 19A-19J provide schematic representations of ten states in a process of assembling and tensional biasing probes having two-extension springs in a pair of array structures according to a ninth alternative of the tenth group of embodiments of the invention FIGS. 20A-20C provide schematic representations of a slidable stack of array plates and a method for using the array plates for retaining probes that have been placed in an array configuration according to a tenth alternative of the tenth group of embodiments of the invention FIGS. 21A-21D provide schematic representations of four states in a process of assembling probes into array structures while simultaneous biasing them according to an eleventh alternative of the tenth group of embodiments of the invention.
Figures 19C, 19D:
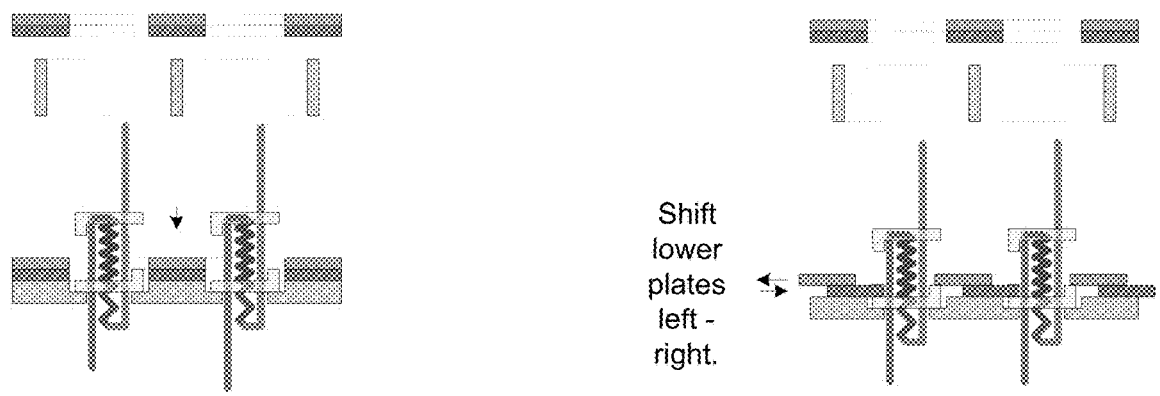
Figures 19E, 19F:
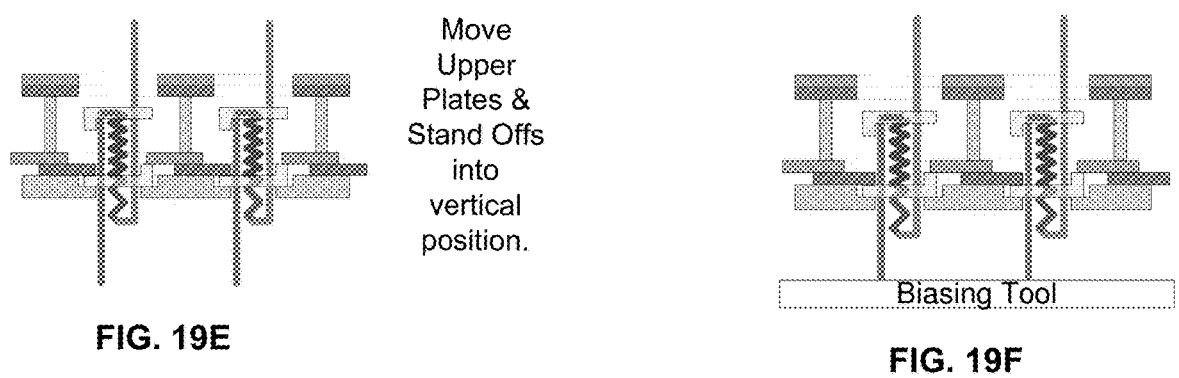
Figure 19G:
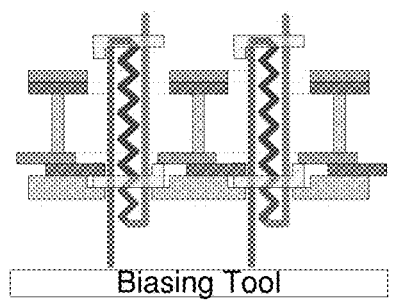
Figure 19H:
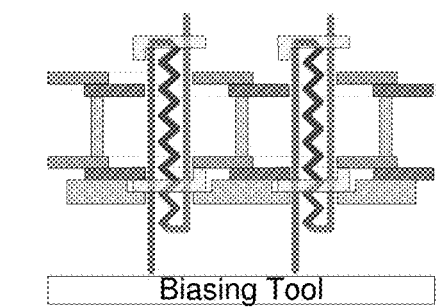
Figure 19I:
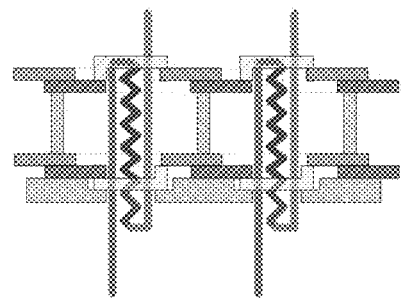
Figure 19J:
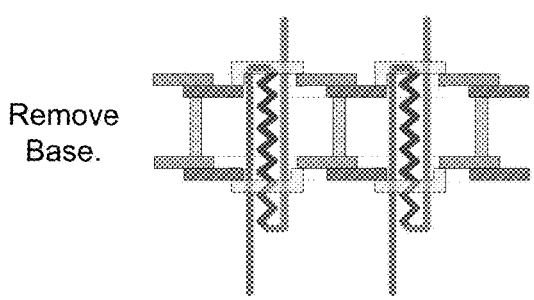

Tenth Group of Embodiments—Alternative 9:
Example of Assembly of Two-Spring Probes (with Two Movable Stops and Extension Springs) into an Array FIG. 19A provides a side schematic representation of an initial state in a probe array assembly process where a base, probes, a lower biasing or stop plate pair, standoffs, and an upper biasing or stop plate pair are shown as being longitudinally separated and laterally aligned. The lower biasing plate pair and the upper biasing plate pair include a bottom plate and a top plate that can be laterally shifted relative to one another while maintaining their longitudinal proximity. FIG. 19B shows the probes and the base after being brought together longitudinally. FIG. 19C shows the lower stop plate pair being shifted longitudinally to a position on or near the base. FIG. 19D shows the state of the process after relative lateral movement that splits the bottom and top biasing plates of the lower pair laterally to close the openings and trap the probe's movable stop plate temporarily against the base. As shown, the left side of the lower movable stops of the probes are captured by the right edges of openings in the lower biasing plate while the slightly higher right side of the lower movable stops of the probes are captured by the slightly higher left edges of the openings in the top biasing plate (of the lower set of plates) such that the probes are temporarily restrained by the base and the lower biasing plate pair. FIG. 19E illustrates the state of the process after the standoffs and upper fixed stop plate set are lowered into contact with each other and into contact with the upper plate of the lower set. FIG. 19F shows the state of the process after a biasing tool is moved into position below the lower probe tips. FIG. 19G shows the state of the process after relative longitudinal movement of the biasing tool and the base (or of some other features of the probes or probe frames) causes the spring to extend such that the lower surface of the upper movable stop is located above the longitudinal level of the lower surface of the top biasing plate of the upper biasing plate pair. FIG. 19H shows the state of the process after relative lateral movement of the bottom and top biasing plates of the upper plate pair such that the right edges of the openings in the bottom plate move laterally under the left edges of movable upper stops of the probes and the left edges of the openings in the top biasing plate are below the right edges of the upper movable stops of the probes. FIG. 19I shows the state of the process after relative longitudinal movement of the base and the biasing tool allow the upper springs to contract so as to allow the upper movable probe stops to contact the upper plate pair while still maintaining some tensional biasing of the springs. FIG. 19J shows the state of the process after the base has been removed, leaving only the configured probe array with the biasing plates being used as guide plates for the array while allowing the probe tips to be compressed toward one another when making electrical contact with circuit elements while allowing the upper movable stops to move upward and the lower movable stops to move downward, thus allowing the compliance of the springs to provide controlled mating of the probes and the circuit elements. In alternative embodiments, the movable stops of the probe may not have raised and lowered plate engagement features as any height difference associated with the side-to-side displacement of the upper and lower biasing plates of a biasing plate pair may be insignificant or otherwise acceptable. In other embodiments, additional plates may be included within a pair so as to provide a higher level of surface engagement (e.g., three plates undergoing lateral displacement along 120° orientations, or four plates undergoing displacement at 90° orientations). In still other alternative embodiments, different probe structures may be used instead of the example shown. Similar processes may be used to cause loading of springs into multiple probe sheaths to provide pre-biasing of at least one spring in such probes after which the encased probes may be loaded into array frames or guide plates.

Figure 20A:
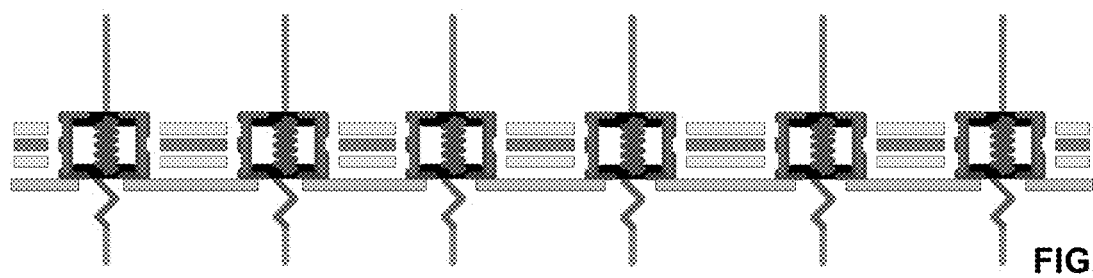
Figure 20B:
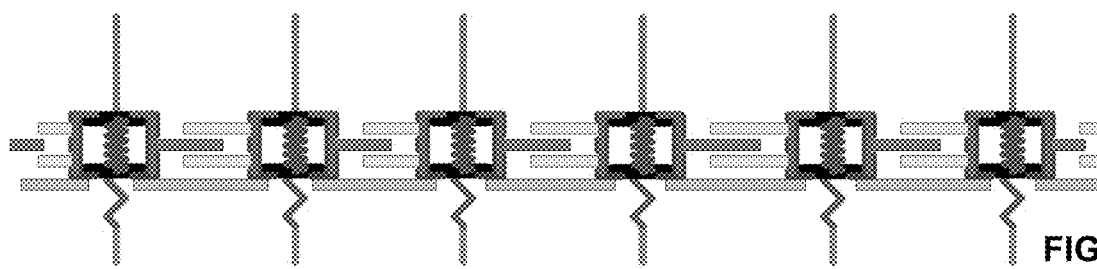
Figure 20C:
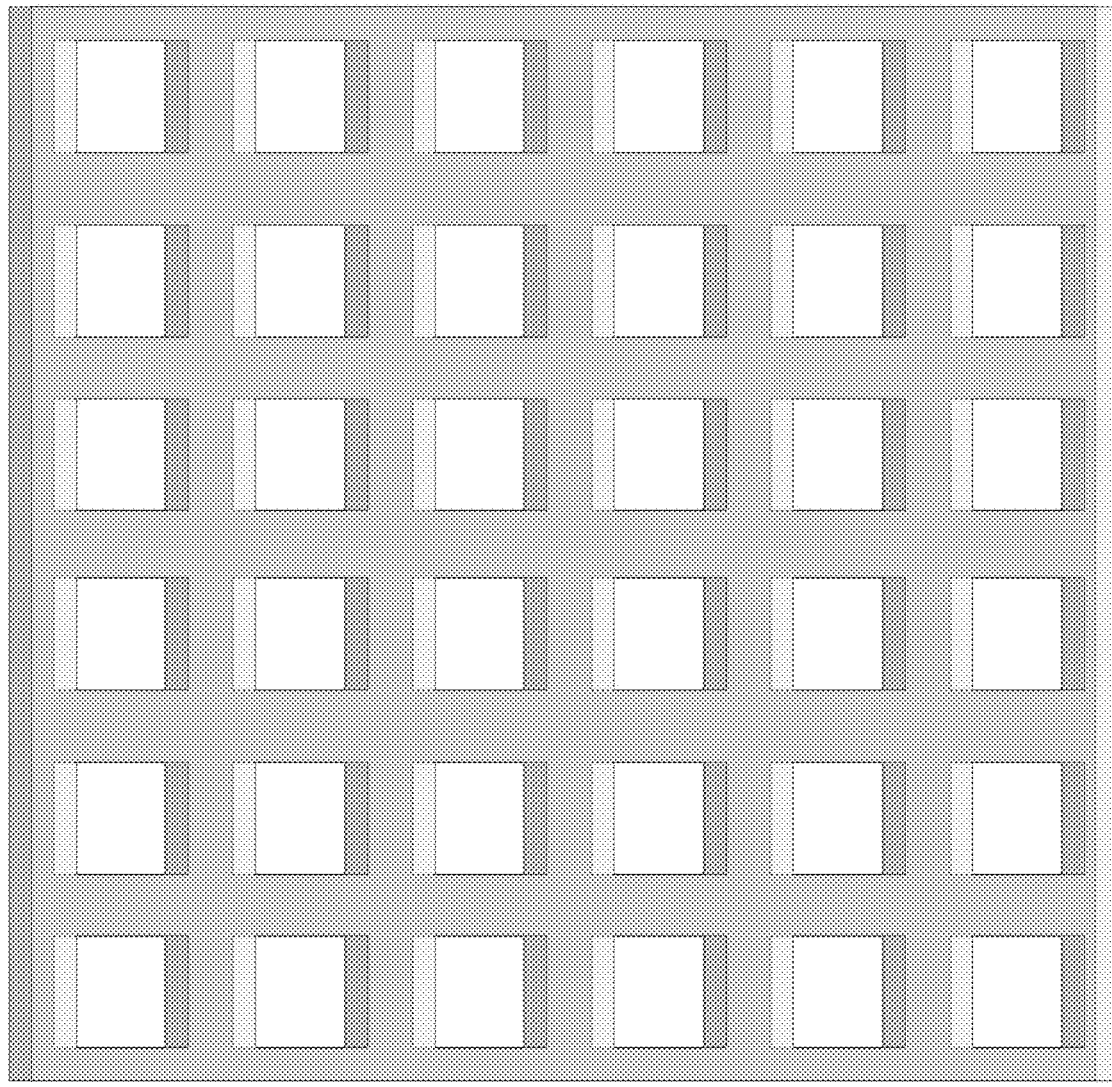

Tenth Group of Embodiments—Alternative 10: Example of Array Assembly Including Use of an Array Base Plate and a Stack of Three Laterally Shiftable Plates and Incorporation of Preassembled Probe Modules Each Including Two Springs with One Pre-Biased FIGS. 20A-20B provide side views of an array of pre-biased two spring probe module having sheaths sitting on a baseplate. FIG. 20A shows three levels of laterally slidable array plates laid over the probes with the sheath bodies being aligned with holes in the array plates. FIG. 20B shows the same array after the array plates have been laterally displaced to the left and right to engage holes or recesses in the sides of the sheaths to fix the probes in place relative to the array plates. FIG. 20C shows a top view of two array plates without probes (with holes for a 6 by 6 probe array) with the plates shifted to provide left and right clamping of any probes within the holes.

Figure 21A:
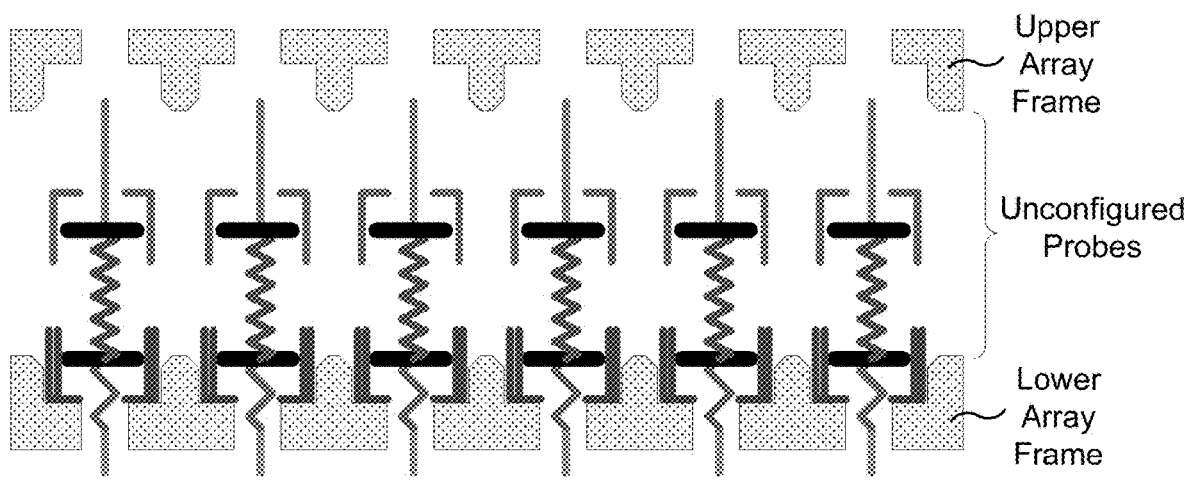
Figure 21B:
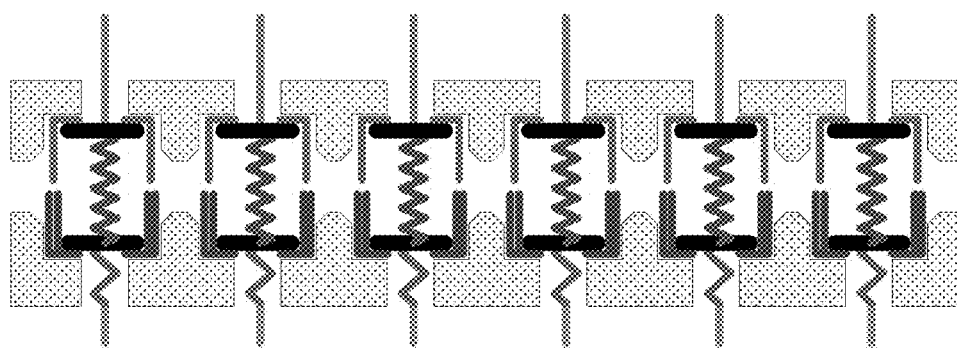
Figure 21C:
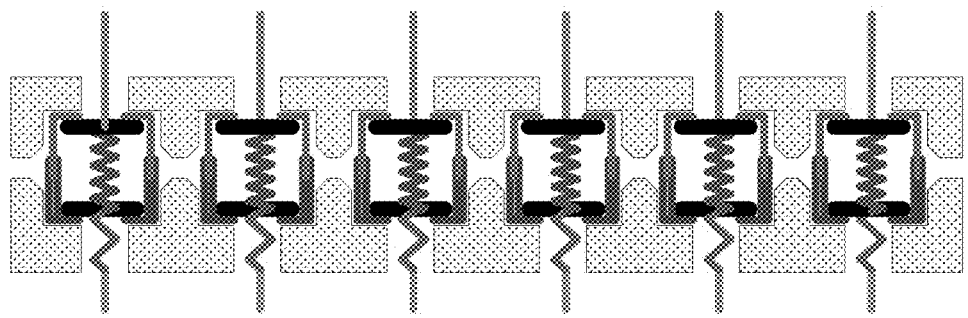
Figure 21D:
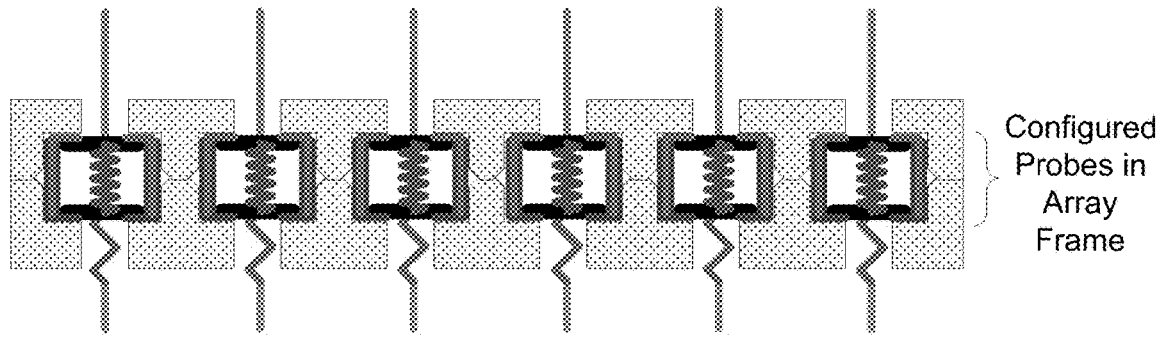

Tenth Group of Embodiments—Alternative 11: Example of Array Assembly Including of Two-Spring Probes (with Two Movable Stops and Loadable Sheaths) into an Array FIGS. 21A-21D provide illustrations of a plurality of probes being loaded into an array frame that not only provides intended lateral (XY) positioning and longitudinal (Z) positioning of the probes relative to one another but also provides for biasing the upper springs and locking together upper and lower retention structures (e.g. sheath elements) that include or hold the fixed stops. FIG. 21A shows the probes loaded into a lower array frame where longitudinal engagement of multipart probe biasing sheaths or frame structures has not yet occurred. FIG. 21B shows the probes as the upper array frame is lowered relative to the lower frame elements to bring upper and lower parts of the biasing frame or sheath together. FIG. 21C shows the probes as relative movement of the upper and low array frames has provided partial but incomplete biasing compression of the upper springs. FIG. 21D shows the state of the process after array elements have been fully mated and the biasing frames or sheaths fully assembled.

Figure 22B:
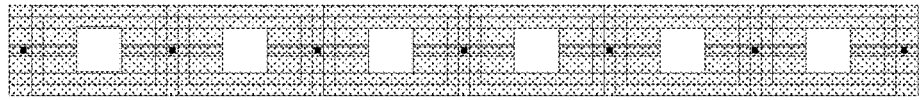
FIGS. 22A-22G provide schematic representations of five states in a process of permanently biasing/assembling probes in a batch process according to a twelfth alternative of the tenth group of embodiments of the invention.
Figure 22A:
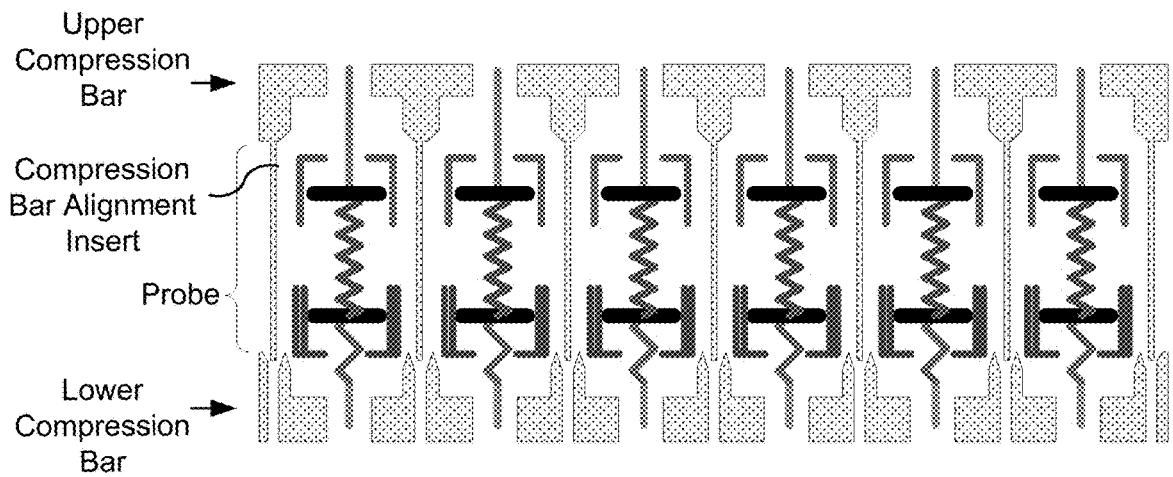
Figure 22C:
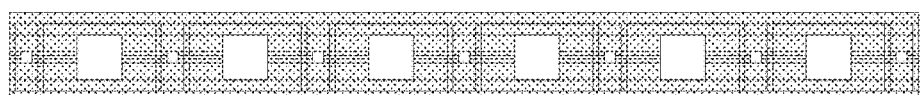
Figure 22D:
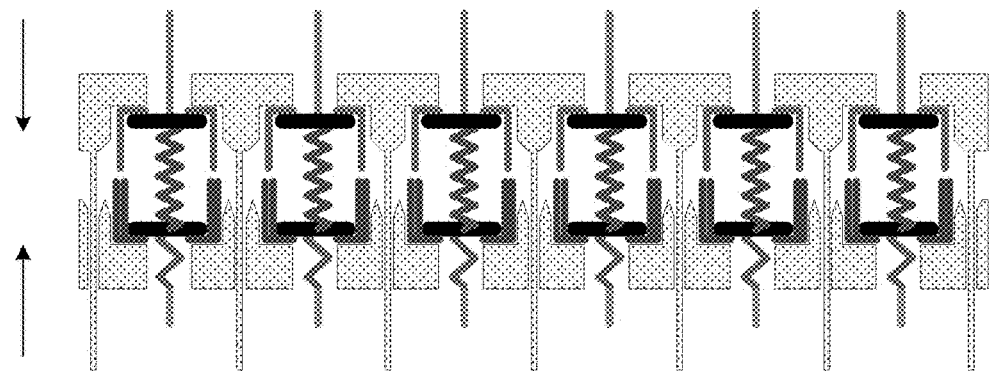
Figure 22E:
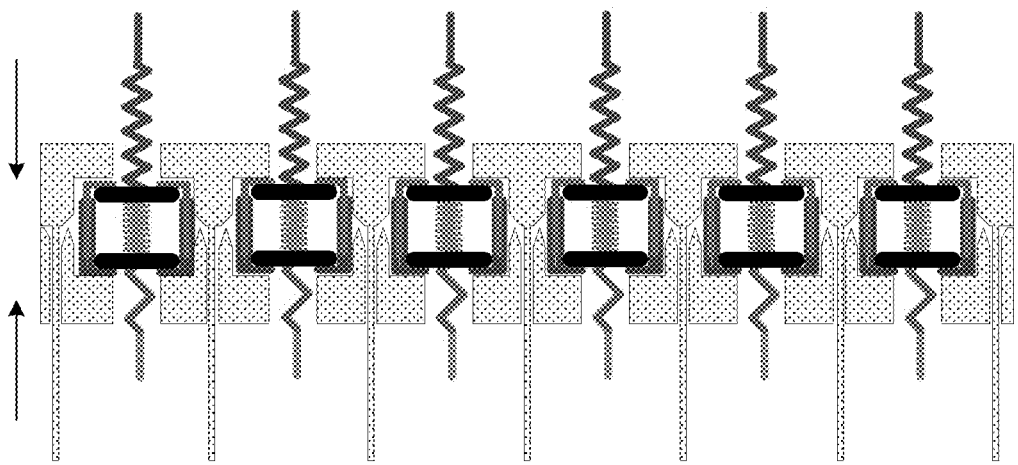
Figure 22F:
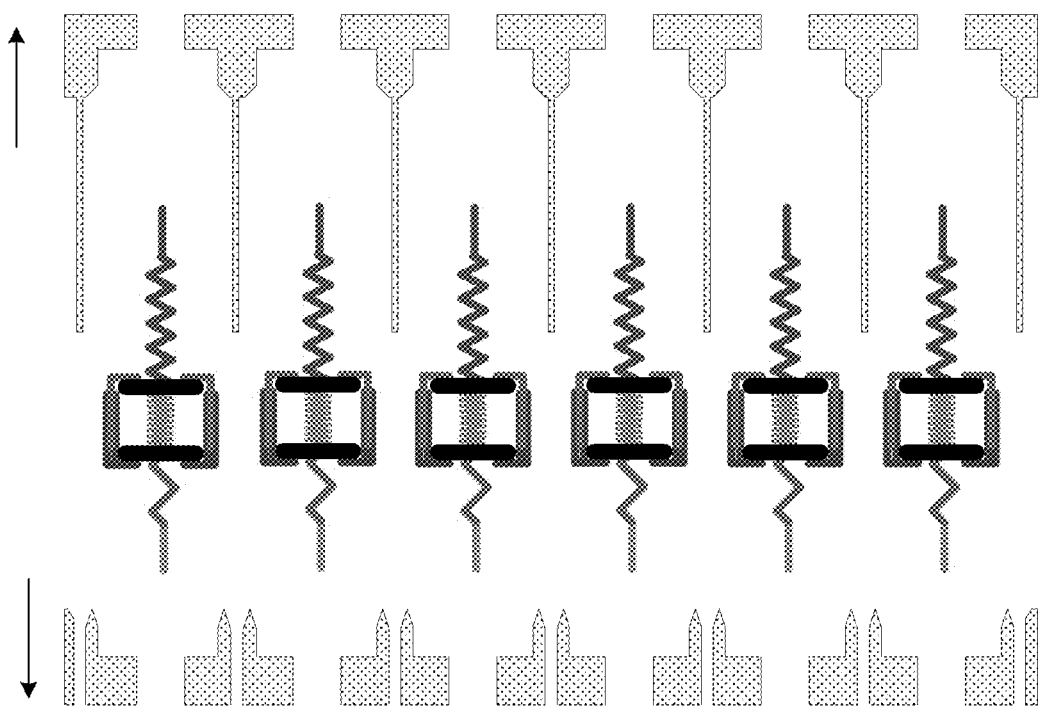
Figure 22G:
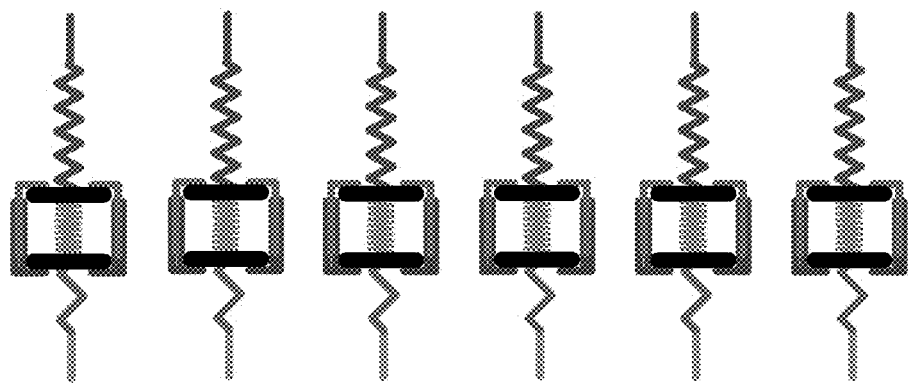

Tenth Group of Embodiments—Alternative 12: Forming and Configuring Two-Spring Probes into their Sheaths to Provide Retained Biasing for One of the Springs FIGS. 22A-22G shows various views associated with an example process and tools used in the simultaneous configuration of a plurality of probes as they are transitioned from a build state to working state with two-part sheaths going from unengaged to fully engaged with compressed and retained springs. FIG. 22A provides a side section view of a plurality of probe structures with two springs and unassembled two-part sheaths located between an upper compression bar and a lower compression bar (where the probes and compression bars may be formed in the indicated relative positions, with appropriate retention tabs (not shown) or may be arranged into such positions after formation. FIGS. 22B and 22C respectively show top views of the top and bottom compression bars with openings in which probe tips and alignment inserts can be moved. FIG. 22D shows the state of the process after relative proximal longitudinal movement of the compression bars cause seats (or recesses) in the compression bars to engage the upper and lower probe sheaths in preparation for engagement and locking. FIG. 22E shows the state of the process after further proximal movement has fully engaged the upper and lower sheath arms to complete probe assembly, FIG. 22F shows the state of the process after the compression bars have been separated to release the probes, while FIG. 22G shows the released and configured probes.

Figure 23A:
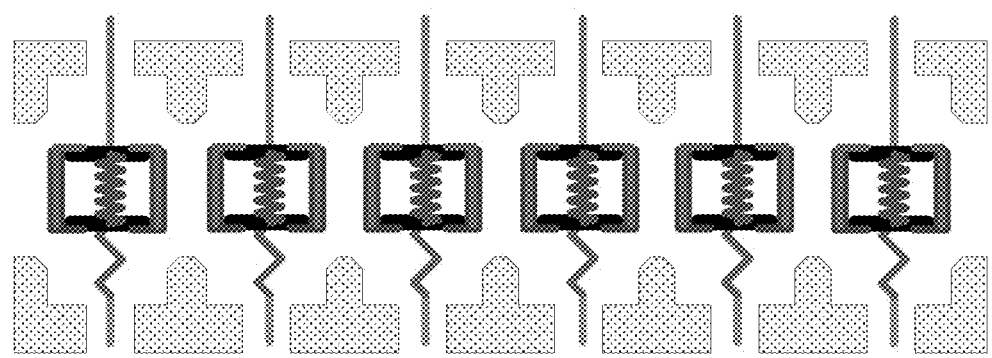
FIGS. 23A-23B provide schematic representations of two states in a process of loading pre-biased/assembled probes of FIGS. 22A-22G into an array structure that provides for clamping of the biasing structures of the probes according to a thirteenth alternative of the tenth group of embodiments of the invention.
Figure 23B:
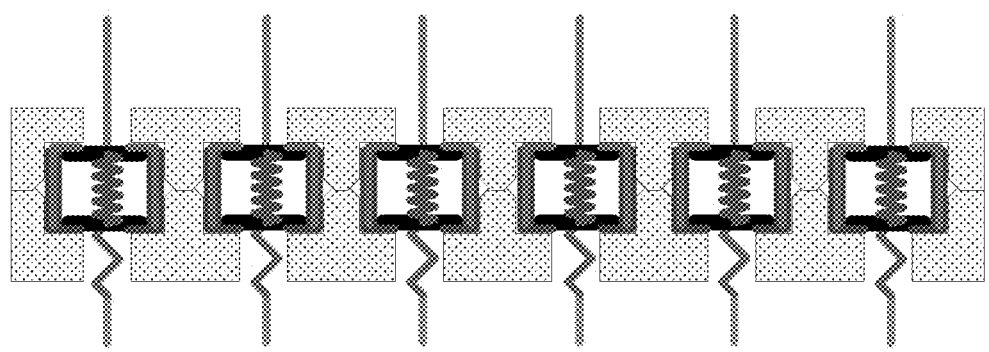

Tenth Group of Embodiments—Alternative 13: Assembly of Pre-Biased Probes into an Array FIGS. 23A-23B illustrate initial and final states of a process of taking pre-configured probes (such as those formed in FIGS. 22A-22G) and loading them into upper and lower array frame structures. FIG. 23A shows the probes laterally aligned with the array frames while FIG. 23B shows the probes loaded into the closed alignment frame structures which hold in probes in desired lateral configurations as well as longitudinal configurations with probe tips generally defining a plane but which may define non-planar configurations in alternative embodiments.

Figure 24A:
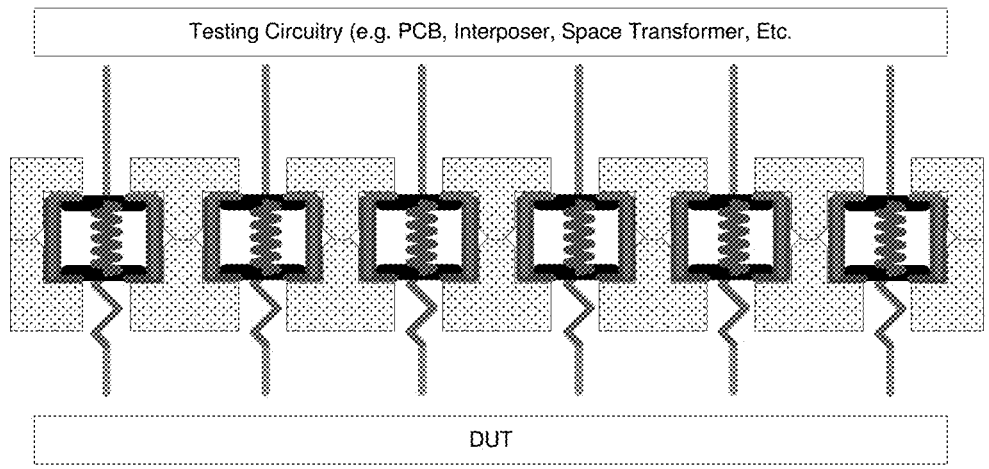
FIGS. 24A-24C provide schematic representations of three states in a process for achieving a compliance change when making contact between probes and a DUT using the probes and array structures of either FIGS. 21A-21D or FIGS. 24A-24C according to a fourteenth alternative of the tenth group of embodiments of the invention.
Figure 24B:
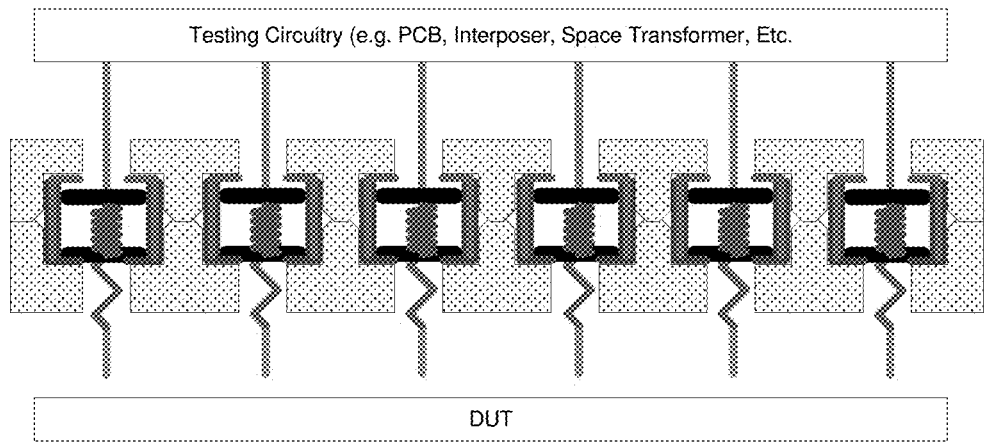
Figure 24C:
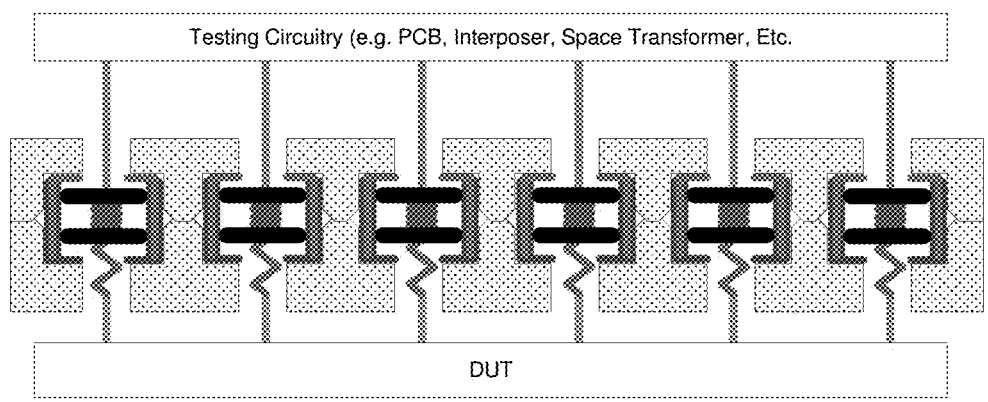

Tenth Group of Embodiments—Alternative 14: Use of Biased Two-Spring Probes in an Array FIGS. 24A-24C provide illustrations of the probe array of FIGS. 21A-21D or FIGS. 23A-23B at three stages of usage. FIG. 24A shows the probe array prior to contacting testing circuitry from above and a DUT from below, FIG. 24B shows the probe array after the upper probe tips contact the testing circuitry whereby further biasing of the upper springs occur. FIG. 24C shows the probe array after lower probe tips are compressed by contact with DUT pads whereby the lower springs provide all initial compliance and after compression of the lower springs reach force levels equal to those of the biasing forces from the upper springs, both upper and lower spring movements contribute to a combined compliance that is greater than that initially provided thereby reducing force increase for a given increment of additional compression.

Figure 25A:
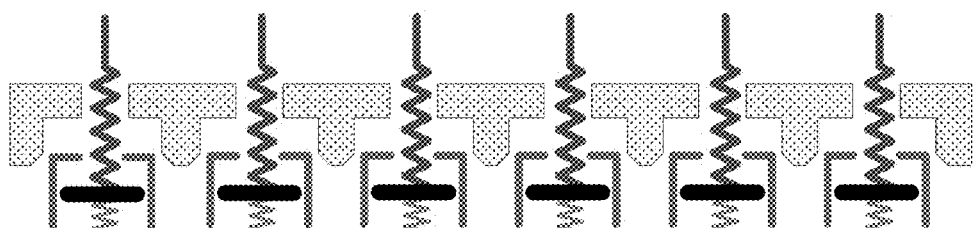
FIGS. 25A-25D provide schematic representations of four states in a process of assembling probes having three spring each into an array structure while simultaneously biasing them according to a fifteenth alternative the tenth group of embodiments of the invention.
Figure 25B:
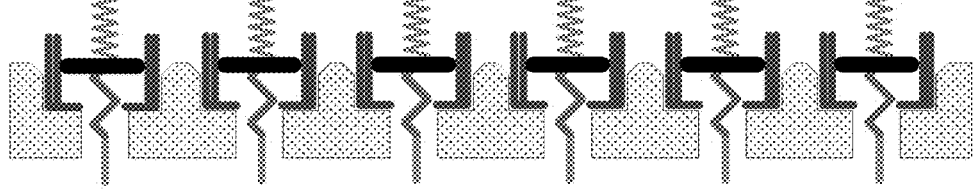
Figure 25C:
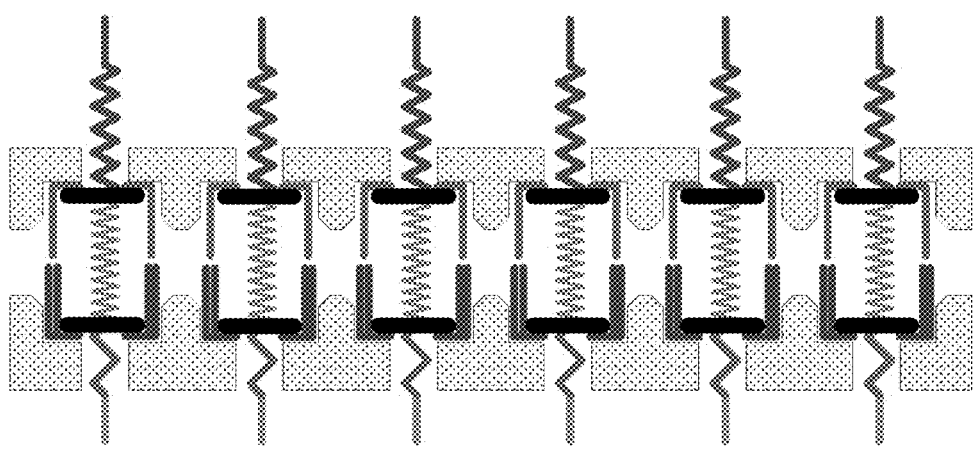
Figure 25D:
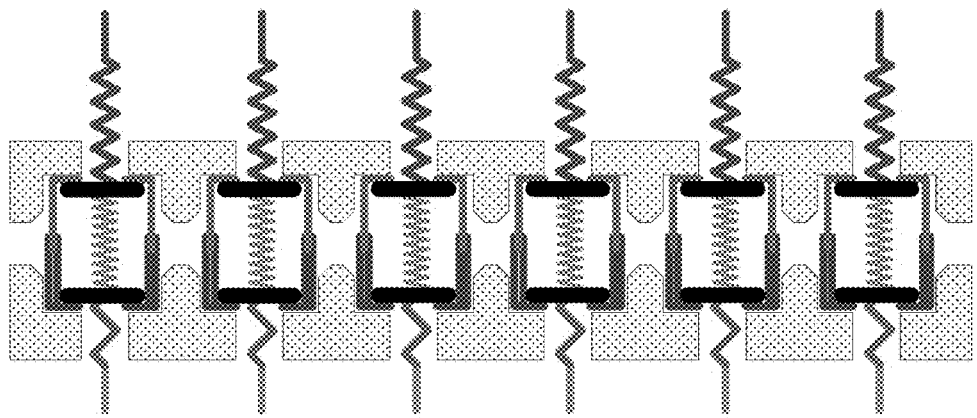

Tenth Group of Embodiments—Alternative 15: Biasing and Assembly of Three-Spring Probes into an Array FIGS. 25A-25D provide illustrations of a plurality of probes being loaded into an array frame that not only provides intended lateral (XY) positioning and longitudinal (Z) positioning of the probes relative to one another but also provides for biasing of the intermediate springs and locking together upper and lower retainment structures (e.g. sheath elements) that include or hold the fixed stops. FIG. 25A shows the probes loaded into a lower array frame. FIG. 25B shows the probes as the upper array frame is lowered relative to the lower frame elements to engage the probes. FIG. 25C shows the probes as relative movement of the upper and lower array frames provide for incomplete biasing (i.e. compression in this example) of the intermediate springs, and FIG. 25D shows the array with array elements mated and the intermediate springs biased at a desired level.

Figure 26A:
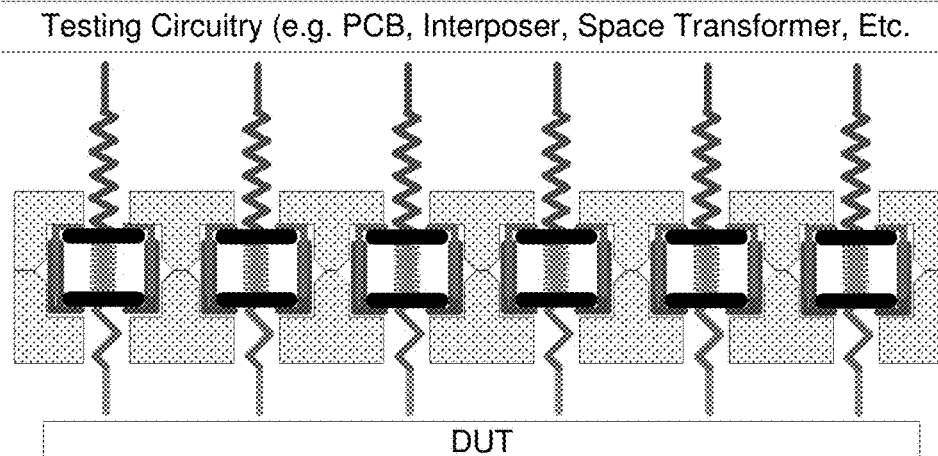
FIGS. 26A-26C provide schematic representations of three states in a process for achieving a compliance change first when pressing probes like those of FIGS. 25A-25D against testing circuitry and then again when pressing those probes against contacts on one or more DUTs according to a sixteenth alternative of the tenth group of embodiments of the invention.
Figure 26B:
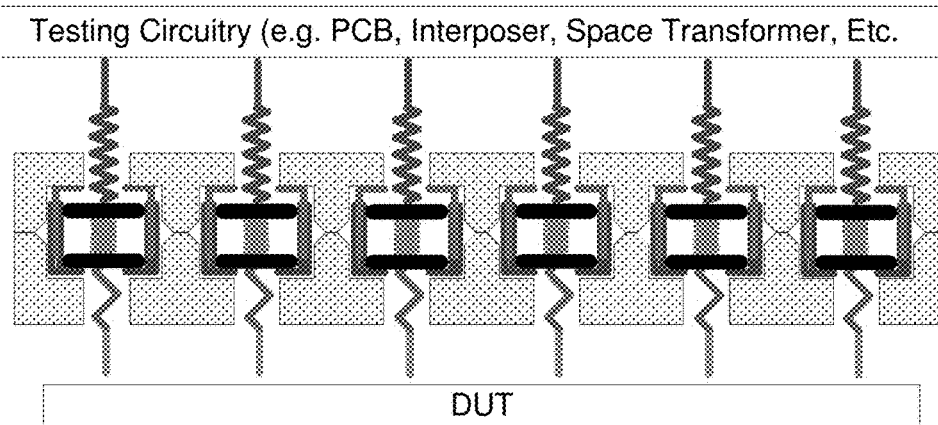
Figure 26C:
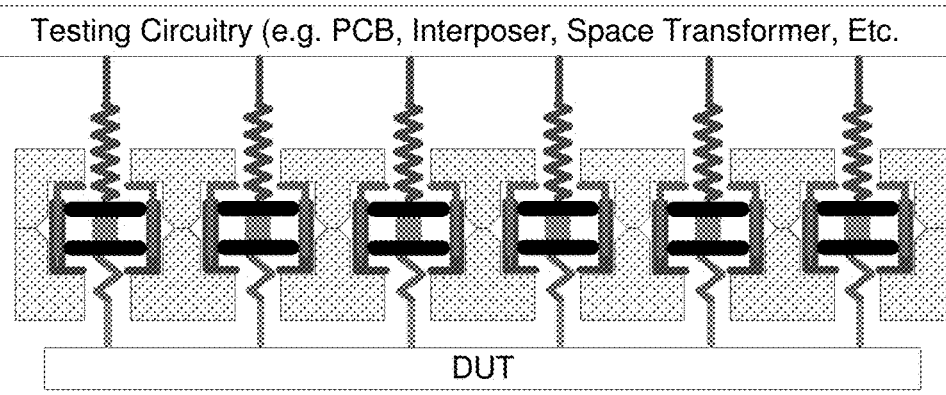

Tenth Group of Embodiments—Alternative 16: Use of Biased 3 Spring Probes in an Array with PCB Biasing First FIGS. 26A-26C provide illustrations of the probe array of FIGS. 25A-25D at three stages of usage. FIG. 26A shows the probe array prior to contacting testing circuitry from above or a DUT from below. FIG. 26B shows the probe array after the upper probe tips contact the testing circuitry whereby biasing of the upper springs occurs followed by further biasing of the intermediate spring (i.e. after the force on the upper spring matches that of the initially biased intermediate spring) whereby an increase in compliance occurs to reduce rate of increase in force on the testing circuitry as further spring overtravel occurs. FIG. 26C shows the probe array after lower probe tips are compressed by contact with DUT pads whereby the lower springs provide all initial compliance and after compression of the lower springs reaches force levels equal to that of the biasing forces on the intermediate springs, all of upper, intermediate, and lower spring movements contribute to a combined compliance that is greater than that initially provided thereby reducing force increase for a given increment of additional compression (in the event that increased compression drives the upper movable stop into the upper fixed stop, the compliance will be reduced to only that provided by a combination of the intermediate and lower springs).

Figure 27A:
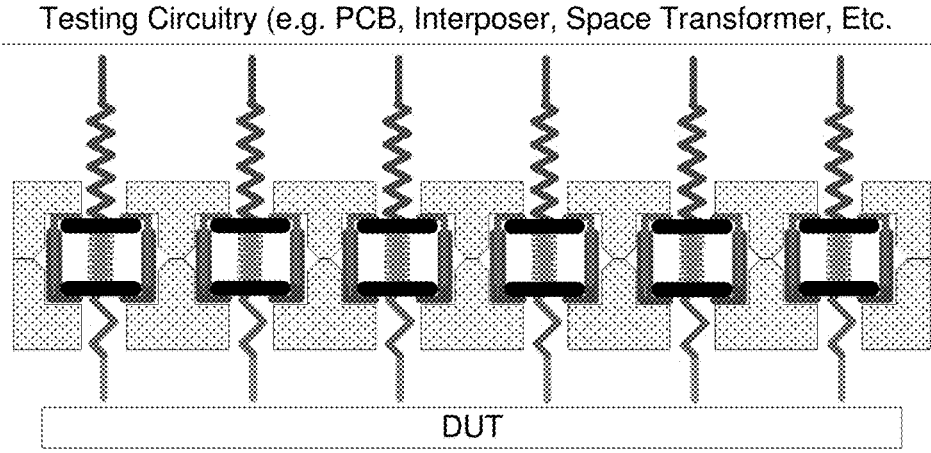
FIGS. 27A-27C provide schematic representations of three states in a process for achieving a compliance change first when pressing probes like those of FIGS. 25A-25D against one or more contacts on one or more DUTS and then again when pressing those probes against one or more testing circuitry contacts according to a seventeenth alternative of the tenth group of embodiments of the invention.
Figure 27B:
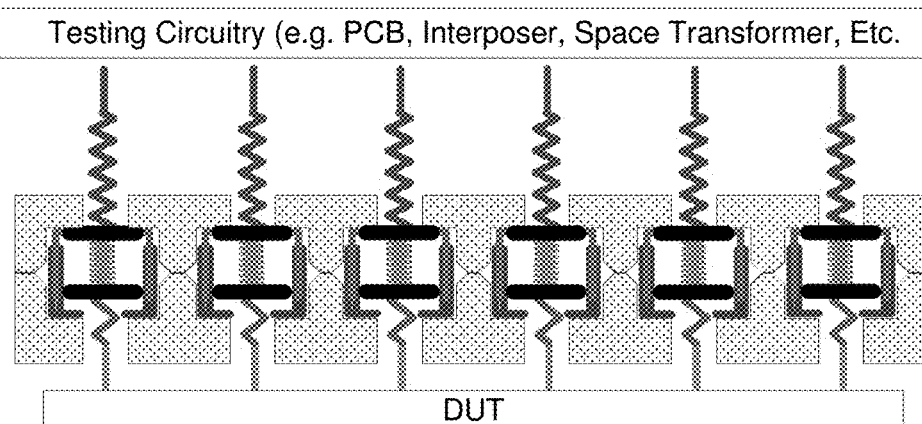
Figure 27C:
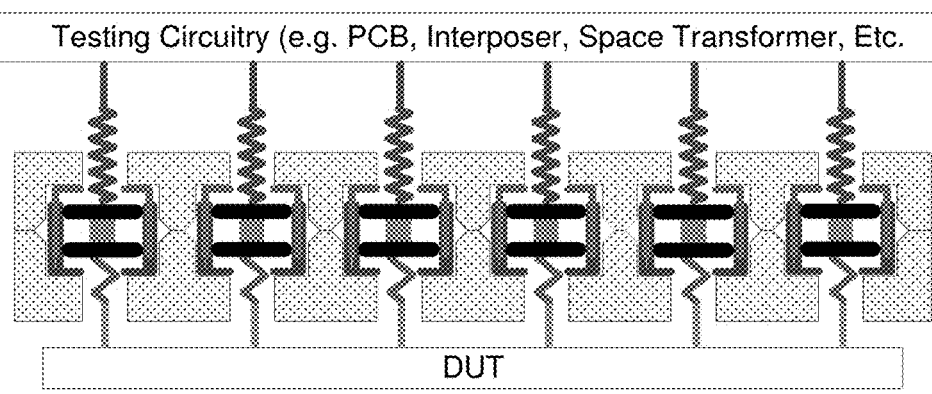

Tenth Group of Embodiments—Alternative 17: Use of Biased Three Spring Probes in an Array with DUT Biasing First FIGS. 27A-27C provide illustrations of the probe array of FIGS. 25A-25D at three stages of usage. FIG. 27A shows the probe array prior to contacting testing circuitry from above or a DUT from below. FIG. 27B shows the probe array after the lower probe tips contact the DUT whereby biasing of the lower springs occurs followed by further biasing of the intermediate spring (i.e. after the force on the lower springs match those of the initially biased intermediate springs) whereby an increase in compliance occurs to reduce the rate of increase in force on the DUT as further spring over travel occurs. FIG. 27C shows the probe array after upper probe tips are compressed by contact with testing circuitry pads whereby the upper springs provide all initial compliance and after compression of the upper springs reaches force levels equal to those of the biasing forces on the intermediate springs, all of upper, intermediate, and lower spring movements contribute to a combined compliance that is greater than that initially provided thereby reducing force increase for a given increment of additional compression (in the event that increased compression drives the lower movable stop into the lower fixed stop, the compliance will be reduced to only that provided by a combination of the intermediate and upper springs).

Additional Embodiments

Figures 1, 28:
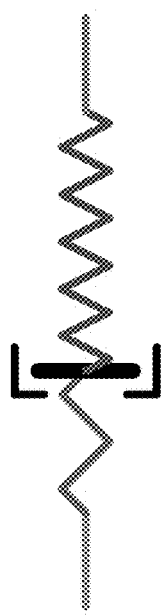
Figures 2, 28:
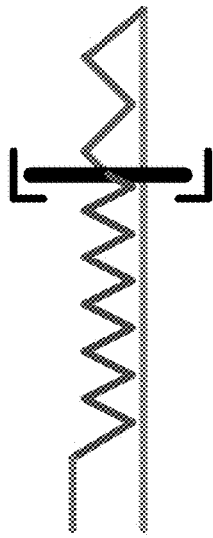
Figures 3, 28:
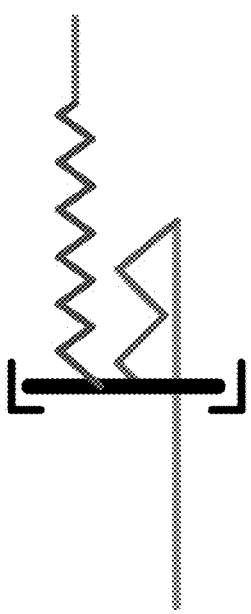
Figures 4, 28:
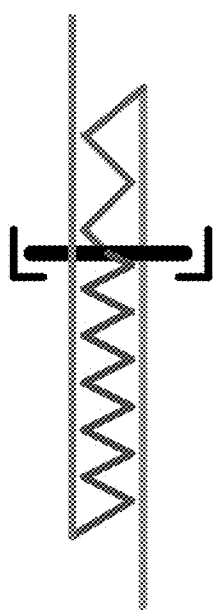
Figures 5, 28:
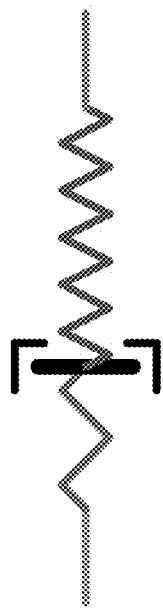
Figures 6, 28:
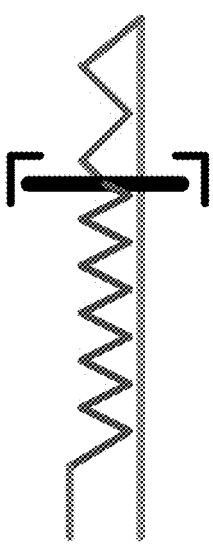
Figures 7, 28:
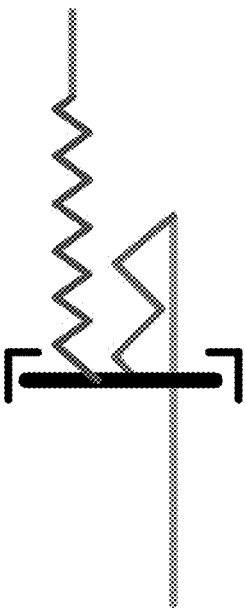
Figures 8, 28:
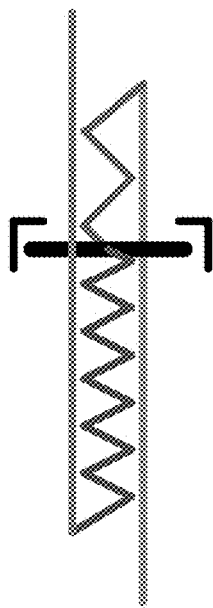

FIGS. 28-1 to 28-8 provide schematic illustrations of eight potential two-spring, one-stop embodiments of the invention laid out according to the various example combinations of two spring biasing methods (compression and tension) and two fixed stop configurations (up-facing and down-facing). The following table outlines the different configurations of FIGS. 28-1 to 28-8.

| FIG. | Upper Spring | Lower Spring | Fixed Stop | Functional Example or Limitation |
| --- | --- | --- | --- | --- |
| 28-1 | C | C | UF | Provides for a change in K from the bottom when the top is biased first |
| 28-2 | E | C | UF | Tips are on same side of probe |
| 28-3 | C | E | UF | Similar to 28-1 |
| 28-4 | E | C | UF | Similar to 28-1 |
| 28-5 | C | C | DF | Provides for a change in K from the top when the bottom is biased first |
| 28-6 | E | C | DF | Tips are on same side of probe |
| 28-7 | C | E | DF | Similar to 28-5 |
| 28-8 | E | E | DF | Similar to 28-5 |

C = Compression Biasing,
E = Extension or Tension Biasing,
UF = Up-Facing Fixed Stop, and
DF = Down-Facing Fixed Stop
K = Spring Constant or More Generally a Rate of Change of Force Per Change in Length FIGS. 29-1 to 29-32 provide schematic illustrations of 32 plus potential three-spring, two-stop, two-tip probe embodiments of the invention laid out according to the various example combinations of three spring biasing methods (compression and tension) and two fixed stop configurations (up-facing and down-facing) according to the following table.

| FIG. | Upper Spring | Middle Spring | Lower Spring | Upper Fixed Stop | Lower Fixed Stop | Operational Possibilities |
| --- | --- | --- | --- | --- | --- | --- |
| 29-1 | C | C | C | UF | UF | 2 Modes (Biasing from top first): 2 changes in K if bottom stop then top stop engages. 1 change in K if top stop engages before bottom stop |
| 29-2 | E | C | C | UF | UF | Tips are on same side |
| 29-3 | C | E | C | UF | UF | Similar to 29-1 |
| 29-4 | C | C | E | UF | UF | Tips are on same side |
| 29-5 | E | E | C | UF | UF | Tips are on same side |
| 29-6 | E | C | E | UF | UF | Similar to 29-1 but with spring activation and positions reversed |
| 29-7 | C | E | E | UF | UF | Tips are on same side |
| 29-8 | E | E | E | UF | UF | Similar to 29-1 but with spring activations reversed |
| 29-9 | C | C | C | UF | DF | Given certain fixed stop spacings (single fixed stop contact with initial biasing into the fixed stop), FIG. 28A-1 functionality is possible from either direction |
| 29-10 | E | C | C | UF | DF | Tips are on same side |
| 29-11 | C | E | C | UF | DF | Similar to 29-9 |
| 29-12 | C | C | E | UF | DF | Tips are on same side |

| FIG. | Upper Spring | Middle Spring | Lower Spring | Upper Fixed Stop | Lower Fixed Stop | Operational Possibilities |
|---|---|---|---|---|---|---|
| 29-13 | E | E | C | UF | DF | Tips are on same side |
| 29-14 | E | C | E | UF | DF | After middle spring pre-biasing, both side K change is possible |
| 29-15 | C | E | E | UF | DF | Tips are on same side |
| 29-16 | E | E | E | UF | DF | Similar to 29-14 |
| 29-17 (Left) | C | C | C | DF | UF | Similar to 29-14 |
| 29-18 | E | C | C | DF | UF | Tips are on same side |
| 29-19 | C | E | C | DF | UF | Similar to 29-14 |
| 29-20 | C | C | E | DF | UF | Tips are on same side |
| 29-21 | E | E | C | DF | UF | Tips are on same side |
| 29-22 | E | C | E | DF | UF | Similar to 29-9 |
| 29-23 | C | E | E | DF | UF | Tips are on same side |
| 29-24 | E | E | E | DF | UF | Similar to 29-9 |
| 29-25 | C | C | C | DF | DF | Same as 29-1 but upside-down |
| 29-26 | E | C | C | DF | DF | Tips are on same side |
| 29-27 | C | E | C | DF | DF | Same as 29-1 but upside-down |
| 29-28 | C | C | E | DF | DF | Tips are on same side |
| 29-29 | E | E | C | DF | DF | Tips are on same side |
| 29-30 | E | C | E | DF | DF | Same as 29-6 but upside-down |
| 29-31 | C | E | E | DF | DF | Tips are on same side |
| 29-32 | E | E | E | DF | DF | Same as 29-8 but upside-down |

Figures 29, 30:
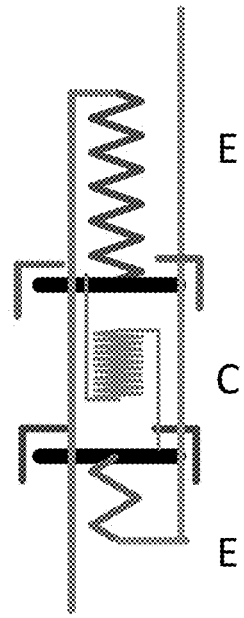
Figures 29, 30, 31:
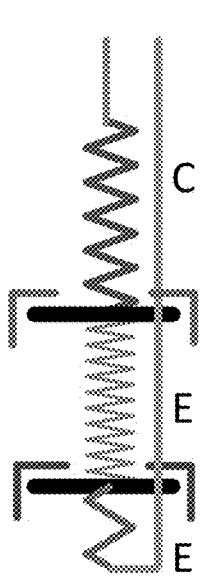
Figures 29, 30, 31, 32:
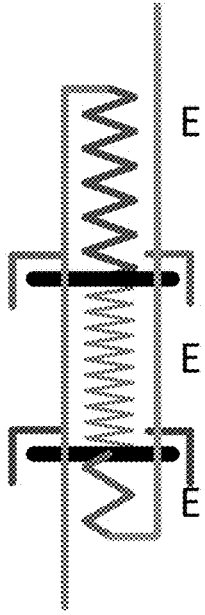
Figures 1, 30:
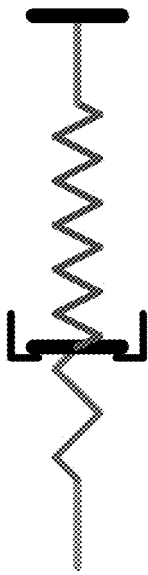
Figures 2, 30:
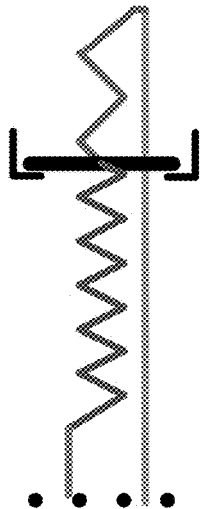
Figures 3, 30:
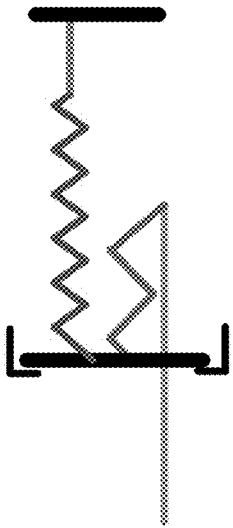
Figures 4, 30:
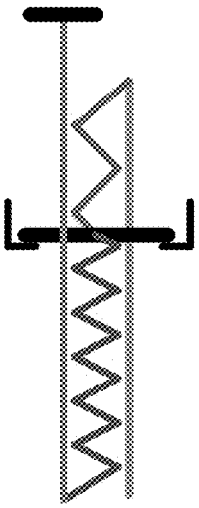
Figures 5, 30:
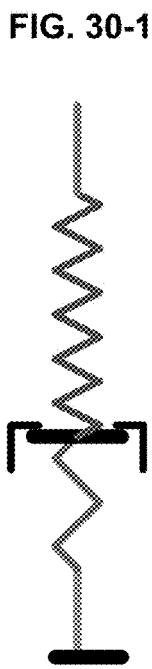
Figures 6, 30:
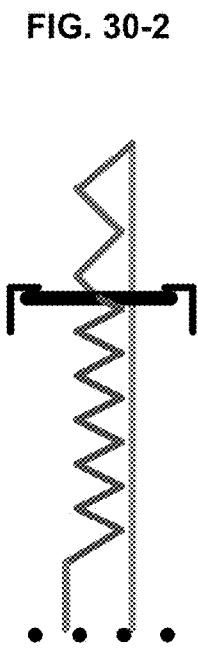
Figures 7, 30:
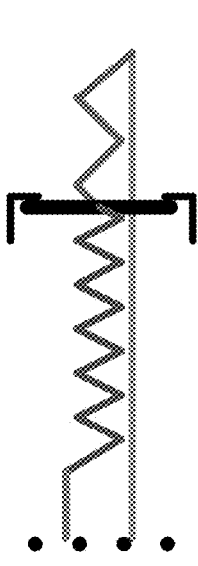
Figures 8, 30:
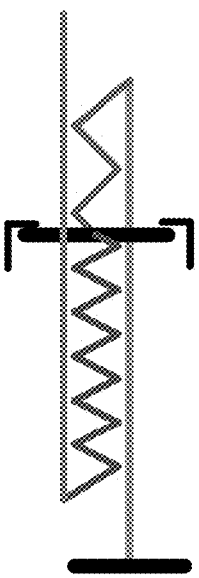

C = Compression Biasing,
E = Extension or Tension Biasing,
UF = Up-Facing Fixed Stop, and
DF = Down-Facing Fixed Stop
K = Spring Constant or More Generally a Rate of Change of Force FIGS. 30-1 to 30-8 provide various schematic illustrations of one contact tip probes using two springs where the spring is sandwiched functionally by the movable stop and the fixed stop is pre-biased or preloaded so that when the contact tip is pressed against a pad or bump of a DUT or other electronic circuit element the compliance can undergo an increase once a contact force exceeds an initial loading force that presses the movable stop against its fixed stop.

More generally embodiments similar to those of FIGS. 28-1 to 30-8 provide spring probes as one sided contact elements with contact on a first side being provided by a probe element with a single moveable tip and at least two springs with at least one intermediate movable stop with pre-loading of the second spring or other springs (the one or ones that are serially more removed from the tip) such that upon compression of the first tip, at least one change that increases compliance occurs (e.g. transition from biasing one spring or one set of springs only to biasing at least one additional spring) and where an electrical connection from the probe to a holder of the probe or an array structure that holds many probes is provided where the electrical connection may be isolated from other conductive paths on the probe holder or array structure such that any voltage or signal going to or coming from the probe may be isolated from that going to or from other probes. An electrical connection to the first probe may be fed out of the probe holder or array structure by wiring or cabling or by a second one-sided probe contact element that is electrically connected to the first one-side probe but mechanically (or at least compressively or compliantly) isolated therefrom. The second probe may or may not include more than one spring and may or may not include one or more movable stops. In this example, it may be desirable that the first spring make contact with a DUT while the second spring makes contact with a PCB or other tester related circuitry.

In other variations, probes with three or more springs such as some of those shown in FIGS. 29-1 to 29-32 may be repurposed as one tip probes with the other tip being replaced with a connector or bonded element such that three stages of compliance may be obtained at various loading conditions on the single tip.

Other embodiments may be created by combining features from the various embodiments and their alternatives as set forth herein with the other embodiments and their alternatives which have also been set forth herein. Other embodiments may extend the embodiments set forth herein. As a first example, such embodiments may provide more than two compliance changes (i.e., three or more changes, i.e. four or more compliances with each increased relative to the previous one) when compressing a second tip (e.g. against a DUT) after initially compressing a first tip to bias N springs (N>3) which are connected by N-1 intermediate movable stops which engage respective fixed stops in order from last to first as initial loading occurs. In some array usage embodiments, due to (1) assembly tolerances, (2) fabrication tolerances, (3) planarity tolerances on probe tips in the probe array, and/or (4) planarity tolerance of the contact surfaces on a DUT, not all probes may undergo all N-1 compliance increments but due to the configuration of such an array the force increase experienced by each DUT contact pad or bump will be limited after an initial contact and compression at an initially relative low compliance provides an adequate force to ensure good electrical contact between the probe and the DUT contact.

Other extended embodiments, can provide for more than one compliance reduction (i.e. more than two compliances) during compression of both probe tips when a single probe includes 5 or more springs separated by intermediate movable stops with the center spring pre-biased at a first force level, the remaining two intermediate springs biased at a second force level which is less than the first force level and the two outer springs having no initial bias or a bias that is less than the second force level such that upon usage a compression of a tip provides for initial increased biasing of the outer most spring only, then a combination of the outermost spring and the next spring, and finally from a combination of the all three springs from the center to the outer most spring, with a similar result occurring upon compression of the other tip with a possible difference being that the transition forces will be higher when compressing the second tip if the two tips are not being compressed simultaneously.

Further Comments and Conclusions

Various other embodiments of the present invention exist. Some of these embodiments may be based on a combination of the teachings herein with various teachings incorporated herein by reference. For example, some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu) in combination with one or more materials, beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003: (1) U.S. Patent Application No. 60/534,184 (P-US032-A-SC), which is entitled "Electrochemical Fabrication Methods Incorporating Dielectric Materials and/or Using Dielectric Substrates"; (2) U.S. Patent Application No. 60/533,932 (P-US033-A-MF), which is entitled "Electrochemical Fabrication Methods Using Dielectric Substrates"; (3) U.S. Patent Application No. 60/534,157 (P-US041-A-MF), which is entitled "Electrochemical Fabrication Methods Incorporating Dielectric Materials"; (4) U.S. Patent Application No. 60/533,891 (P-US052-A-MF), which is entitled "Methods for Electrochemically Fabricating Structures Incorporating Dielectric Sheets and/or Seed layers That Are Partially Removed Via Planarization"; and (5) U.S. Patent Application No. 60/533,895 (P-US070-B-MF), which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include: (1) U.S. patent application Ser. No. 11/139,262 (P-US144-A-MF), filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216 (P-US128-A-MF), filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957 (P-US127-A-SC), by Cohen, which was filed on Jan. 3, 2005, now abandoned, and which is entitled "Incorporating Dielectric Materials and/or Using Dielectric Substrates"; (4) U.S. patent application Ser. No. 10/841,300 (P-US099-A-MF), by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378 (P-US106-A-MF), by Lembrikov et al., which was filed on May 7, 2004, now U.S. Pat. No. 7,527,721, and which is entitled "Electrochemical Fabrication Method for Producing Multilayer Three-Dimensional Structures on a Porous Dielectric"; (6) U.S. patent application Ser. No. 11/325,405 (P-US152-A-MF), filed Jan. 3, 2006 by Dennis R. Smalley, now abandoned, and which is entitled "Method of Forming Electrically Isolated Structures Using Thin Dielectric Coatings"; (7) U.S. patent application Ser. No. 10/607,931 (P-US075-A-MG), by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006 (P-US104-A-MF), by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295 (P-US061-A-MG), by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556 (P-US081-A-MG), by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material or to reduce stress. Various teachings concerning the use of diffusion bonding in electrochemical fabrication processes are set forth in U.S. patent application Ser. No. 10/841,384 (P-US103-A-SC), which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. patent application Ser. No., Filing Date U.S. App Pub No., Pub Date U.S. Pat. No., Pub Date | First Named Inventor, Title |
|---|---|
| 10/271,574 - Oct. 15, 2002 2003-0127336 - July 10, 2003 7,288,178 - Oct. 30, 2007 | Cohen, "Methods of and Apparatus for Making High Aspect Ratio Microelectromechanical Structures" |
| 10/387,958 - Mar. 13, 2003 2003-022168 - Dec. 4, 2003 — | Cohen, "Electrochemical Fabrication Method and Application for Producing Three-Dimensional Structures Having Improved Surface Finish" |
| 10/434,289 - May 7, 2003 2004-0065555 - Apr. 8, 2004 — | Zhang, "Conformable Contact Masking Methods and Apparatus Utilizing In Situ Cathodic Activation of a Substrate" |
| 10/434,294 - May 7, 2003 2004-0065550 - Apr. 8, 2004 — | Zhang, "Electrochemical Fabrication Methods With Enhanced Post Deposition Processing" |
| 10/434,315 - May 7, 2003 2003-0234179 - Dec. 25, 2003 7,229,542 - Jun. 12, 2007 | Bang, "Methods of and Apparatus for Molding Structures Using Sacrificial Metal Patterns" |
| 10/434,494 - May 7, 2003 2004-0000489 - Jan. 1, 2004 — | Zhang, "Methods and Apparatus for Monitoring Deposition Quality During Conformable Contact Mask Plating Operations" |
| 10/677,498 - Oct. 1, 2003 2004-0134788 - Jul. 15, 2004 7,235,166 - Jun. 26, 2007 | Cohen, "Multi-cell Masks and Methods and Apparatus for Using Such Masks To Form Three-Dimensional Structures" |
| 10/697,597 - Dec. 20, 2002 2004-0146650 - Jul. 29, 2004 — | Lockard, "EFAB Methods and Apparatus Including Spray Metal or Powder Coating Processes" |
| 10/724,513 - Nov. 26, 2003 2004-0147124 - Jul. 29, 2004 7,368,044 - May 6, 2008 | Cohen, "Non-Conformable Masks and Methods and Apparatus for Forming Three-Dimensional Structures" |
| 10/724,515 - Nov. 26, 2003 2004-0182716 - Sep. 23, 2004 7,291,254 - Nov. 6, 2007 | Cohen, "Method for Electrochemically Forming Structures Including Non-Parallel Mating of Contact Masks and Substrates" |
| 10/830,262 - Apr. 21, 2004 2004-0251142 - Dec. 16, 2004 7,198,704 - Apr. 3, 2007 | Cohen, "Methods of Reducing Interlayer Discontinuities in Electrochemically Fabricated Three-Dimensional Structures" |
| 10/841,100 - May 7, 2004 2005-0032362 - Feb. 10, 2005 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347 - May 7, 2004 2005-0072681 - Apr. 7, 2005 — | Cohen, "Multi-step Release Method for Electrochemically Fabricated Structures" |
| 10/949,744 - Sep. 24, 2004 2005-0126916 - Jun. 16, 2005 7,498,714 - Mar. 3, 2009 | Lockard, "Multi-Layer Three-Dimensional Structures Having Features Smaller Than a Minimum Feature Size Associated with the Formation of Individual Layers" |
| 12/345,624 - Dec. 29, 2008 — 8,070,931 - Dec. 6, 2011 | Cohen, "Electrochemical Fabrication Method Including Elastic Joining of Structures" |
| 14/194,564 - Feb. 28, 2014 2014-0238865 - Aug. 28, 2014 U.S. Pat. No. 9,540,233 - Jan. 10, 2017 | Kumar, "Methods of Forming Three-Dimensional Structures Having Reduced Stress and/or Curvature" |
| 14/720,719 - May 22, 2015 — 9,878,401 - Jan. 30, 2018 | Veeramani, "Methods of Forming Parts Using Laser Machining" |
| 14/872,033 - Sep. 30, 2015 — — | Le, "Multi-Layer, Multi-Material Microscale and Millimeter Scale Batch Part Fabrication Methods Including Disambiguation of Good Parts and Defective Parts" |

Various other embodiments of the present invention exist. Some of these embodiments may be based on a combination of the teachings herein with various teachings incorporated herein by reference. Some method of making embodiments may not use any blanket deposition process and/or they may not use a planarization process. Some embodiments may use selective deposition processes or blanket deposition processes on some layers that are not electrodeposition processes. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference, they may perform activation functions and monitoring functions, and the like.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A probe for making electrical connections, comprising:
   (a) a first tip having a distal end and a proximal end, wherein the proximal end is for making an electrical connection to a first circuit element, wherein the electrical connection is selected from the group consisting of: (1) a spring-loaded temporary contact connection, (2) an adhered connection, (3) a bonded connection, and (4) an attached connection;
   (b) a first spring having a proximal end and a distal end with the proximal end connected to the distal end of the first tip;
   (c) a first movable stop connected at the distal end of the first spring;
   (d) a second spring having a proximal end and a distal end with the proximal end connected to the first movable stop; and
   (e) a second tip having a proximal end and a distal end, wherein the distal end is for making an electrical connection to a second circuit element, wherein the electrical connection is selected from the group consisting of: (1) a spring-loaded temporary contact connection, (2) an adhered connection, (3) a bonded connection, and (4) an attached connection, and wherein the proximal end of the second tip is connected to the distal end of the second spring,
   wherein the first movable stop is capable of movement or inhibition of movement based on an interaction selected from the group consisting of: (A1) loading applied directly by the first spring to the first movable stop, (A2) loading applied indirectly by the first spring to the first movable stop, (A3) loading applied directly by the second spring to the first movable stop, (A4) loading applied indirectly by the second spring to the first movable stop, (A5) engagement of the first movable stop with a first fixed stop that is part of the probe, (A6) engagement of the first movable stop with a first fixed stop where the first fixed stop is not part of the probe but is part of an assembly into which the probe is mounted, (A7) at least two of interactions (A1)-(A6), (A8) at least three of interactions (A1)-(A6), (A8) at least four of interactions (A1)-(A6), and (A9) at least five of interactions (A1)-(A6),
   wherein the probe has at least one compression spring segment comprising a flat spring comprising a plurality of undulations extending serially along at least a portion of its longitudinal axis and undulating back and forth along a single lateral axis where the undulations take a form selected from the group consisting of: (1) a rectangular wave, (2) a rectangular wave with curved corners, (3) a triangular wave, (4) a sine wave, (5) a plurality of S-shaped curves, (6) a plurality of C-shaped curves, (7) an angled repetitive form, (8) a curved repetitive form, (9) a form that has at least one decrease or increase in lateral amplitude, and (10) one of the above forms with the form offset from a central line of the probe,
   wherein the probe further includes a stabilizing structure or structures selected from the group consisting of: (i) a plurality of tabs on the spring segment extending in a lateral direction perpendicular to the direction of undulation that engage at least an edge of a guide, (ii) a guide inhibiting excessive movement of the spring segment in a direction parallel to a normal of a plane of undulation, (iii) a guide inhibiting excessive movement of the spring segment in a direction perpendicular to both a normal of a plane of undulation and perpendicular to a longitudinal axis of the probe, and (iv) at least one slot, in which the spring segment compresses, that bounds sides and at least upper and lower edges of the undulations; and
   wherein ratios of spring force to change in length are $F_x/\Delta x \neq F_y/\Delta y$, wherein $F_x$ is a force of the first spring, $F_y$ is a force of the second spring, $\Delta x$ is a displacement of the first spring, and $\Delta y$ is a displacement of the second spring.

2. The probe of claim 1 wherein the first fixed stop inhibits motion of the first movable stop in a direction selected the group consisting of: (1) from the first tip to the second tip and (2) from the second tip to the first tip.

3. The probe of claim 1 wherein the probe is configured to operate under a condition selected from the group consisting of: (1) the first spring and the second spring operate under compression, (2) the first spring operates under compression and the second spring operates under tension, (3) the first spring operates under tension and the second spring operates under compression, and (4) the first spring and the second spring operate under tension.

4. The probe of claim 1 wherein the first spring comprises a plurality of springs, with the plurality of springs connected in a manner selected from the group consisting of: (1) in series, (2) in parallel, and (3) in a combination of series and parallel connections.

5. The probe of claim 1 wherein the second spring comprises a plurality of springs with the plurality of springs connected in a manner selected from the group consisting of: (1) in series, (2) in parallel, and (3) in a combination of series and parallel connections.

6. The probe of claim 1 wherein a force exerted by a selected spring segment is selected from the group consisting of: (1) a linear change in length in response to force loading, (2) a substantially linear change in length in response to changes in force loading (i.e. within 10% of linear over a working range), (3) a largely linear change in length in response to changes in force loading (i.e. within 25% of linear over a working range), and (4) a non-linear change in length in response to changes in force loading (i.e. more than 25% variation from linear over at least part of a working range).

7. The probe of claim 1 wherein a ratio of spring force to change in length between two springs is selected from the group consisting of: (1) constant1=$Fx/\Delta x \neq Fy/\Delta y$=constant2; and (2) constant #$Fx/\Delta x$ and $Fy/\Delta y$ #constant, wherein constant is a value of a constant, constant1 is a constant of the first spring, and constant2 is a constant of the second spring.

8. The probe of claim 1 wherein at least one spring has a shape selected from the group consisting of: (1) flat with a plurality of straight arms connected by non-90° angular contacts, (2) flat with a plurality of straight arms connected by substantially 90° angular contacts prior to deflection, (3) flat with a plurality of connected S shaped arms, (4) flat with a plurality of C-shaped arms joined to one another by linear arms that extend perpendicular to a longitudinal axis of the probe prior to deflection, (5) a plurality of curved arms connected to one to another; (6) flat with a substantially uniform thickness (within 10%) and width (within 10%); (7) a plurality of arms connected serially to one another; (8) a flat spring segment with a plurality of arms connected serially together connected at one end to an additional flat spring segment with a plurality of arms connected serially together; (9) a circular cylindrical configuration, (10) a circular cylindrical configuration with an inward spiral, (11) a rectangular cylindrical configuration with an inward spiral on at least one end; (12) a rectangular cylindrical configuration with an inward spiral on at least one end; (13) a flat spring with a plurality of sinusoidal oscillations; (14) a plurality of straight beams connected in a saw tooth pattern; (15) a plurality of straight beams connected in a pattern by acute angles; and (16) a plurality of straight beams connected in a pattern by obtuse angles.

9. The probe of claim 1 additionally including at least one additional spring in series with the first and second springs and at least one additional movable stop functionally connected, wherein the first movable stop is intermediate to two of the first, second and the at least one additional spring and a second movable stop is intermediate to a different two of the first, second, and the at least one additional spring.

10. The probe of claim 9 wherein the first spring, the second spring, the at least one additional spring, the first movable stop, and the at least one additional movable stop are configured to preload a middle spring such that bidirectional compression of the first tip and the second tip can lead to decreases in spring constant upon sufficient compression of the first tip and the second tip.

11. The probe of claim 9 wherein the first spring, the second spring, the at least one additional spring, the first movable stop, and the at least one additional movable stop are configured for preloading such that movement in one direction of one of the first tip and the second tip involves a first decrease in effective spring constant upon a condition selected from the group consisting of: (1) a first compression force being reached and (2) a compression distance being reached, and wherein movement of the one of the first tip and the second tip involve a second decrease in effective spring constant upon a condition selected from the group consisting of: (1) a second, larger, compression force being reached, and (2) a second larger compression distance being reached.

12. The probe of claim 1 wherein at least one of the first or second electrical connections is a spring-loaded temporary contact connection.

13. The probe of claim 1 wherein at least one of the first or second electrical connections is an adhered connection.

14. The probe of claim 1 further comprising a sheath having an opening in which the first movable stop and first and second springs move and wherein the sheath also includes a stop feature that engages the first movable stop and inhibits movement of the first movable stop beyond the stop feature.

15. The probe of claim 14 wherein the first movable stop moves in a widened region of the opening and the stop feature defines a beginning of a narrower portion of the opening.

16. The probe of claim 1 wherein both of the first and second electrical connections are spring-loaded temporary contact connections.

17. A method for using a probe comprising:
(a) providing the probe of claim 1;
(b) preloading the second spring between a first fixed stop and a second stop with a first biasing force;
(c) pressing the first tip against a contact location on the first circuit element and relatively moving the first probe tip to a location in closer proximity to the second fixed stop so as to bias the second spring under a biasing force that exceeds the first force such that prior to the biasing force exceeding the first force, a rate of change of biasing force with distance in moving the first tip has a first value and after exceeding the first force, the rate of change of biasing force with distance in moving the first tip has a second value that is less than the first value; and
(d) providing at least one electrical quantity between the first circuit element and a second circuit element via the probe wherein the at least one quantity is selected from the group consisting of: (1) electrical power, (2) an incoming digital electrical signal, (3) an outgoing digital electrical signal, (4) an incoming analog electrical signal, (5) an outgoing analog electrical signal, (6) an electrical current, and (7) an electrical potential.

* * * * *